(12) United States Patent
Wang et al.

(10) Patent No.: US 12,232,322 B2
(45) Date of Patent: Feb. 18, 2025

(54) 3D RAM SL/BL CONTACT MODULATION

(71) Applicant: Taiwan Semiconductor Manufacturing Company, Ltd., Hsin-Chu (TW)

(72) Inventors: Sheng-Chen Wang, Hsinchu (TW); Feng-Cheng Yang, Zhudong Township (TW); Meng-Han Lin, Hsinchu (TW); Han-Jong Chia, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/497,035

(22) Filed: Oct. 30, 2023

(65) Prior Publication Data
US 2024/0064984 A1    Feb. 22, 2024

Related U.S. Application Data

(63) Continuation of application No. 18/067,870, filed on Dec. 19, 2022, now Pat. No. 11,805,652, which is a
(Continued)

(51) Int. Cl.
*H10B 43/27* (2023.01)
*H01L 23/522* (2006.01)
(Continued)

(52) U.S. Cl.
CPC ......... *H10B 43/27* (2023.02); *H01L 23/5226* (2013.01); *H10B 41/10* (2023.02); *H10B 41/27* (2023.02); *H10B 43/10* (2023.02)

(58) Field of Classification Search
None
See application file for complete search history.

(56) References Cited

U.S. PATENT DOCUMENTS

| 11,839,080 | B2 * | 12/2023 | Lu | ......... | H01L 23/5221 |
| 2016/0071861 | A1 * | 3/2016 | Serov | ......... | G11C 16/0408 |
| | | | | | 438/257 |

(Continued)

OTHER PUBLICATIONS

Notice of Allowance dated Oct. 4, 2022 for U.S. Appl. No. 17/122,228.
(Continued)

*Primary Examiner* — Hsien Ming Lee
(74) *Attorney, Agent, or Firm* — Eschweiler & Potashnik, LLC

(57) ABSTRACT

A 3D memory array includes a row of stacks, each stack having alternating gate strips and dielectric strips. Dielectric plugs are disposed between the stacks and define cell areas. A data storage film and a channel film are disposed adjacent the stacks on the sides of the cell areas. The middles of the cell areas are filled with an intracell dielectric. Source lines and drain lines form vias through the intracell dielectric. The source lines and the drain lines are each provided with a bulge toward the interior of the cell area. The bulges increase the areas of the source line and the drain line without reducing the channel lengths. In some of these teachings, the areas of the source lines and the drain lines are increased by restricting the data storage film or the channel layer to the sides of the cell areas adjacent the stacks.

20 Claims, 34 Drawing Sheets

Related U.S. Application Data continuation of application No. 17/122,228, filed on Dec. 15, 2020, now Pat. No. 11,569,264.

(60) Provisional application No. 63/031,013, filed on May 28, 2020.

(51) Int. Cl.
  _H10B 41/10_ (2023.01)
  _H10B 41/27_ (2023.01)
  _H10B 43/10_ (2023.01)

(56) References Cited

U.S. PATENT DOCUMENTS

| | | |
|---|---|---|
| 2017/0025431 A1 | 1/2017 | Kanakamedala et al. |
| 2020/0152502 A1 | 5/2020 | Hsu |
| 2020/0286909 A1 | 9/2020 | Yuda et al. |

OTHER PUBLICATIONS

Ex-Parte Quayle Office Action dated Apr. 25, 2023 for U.S. Appl. No. 18/067,870.
Notice of Allowance dated Jun. 28, 2023 for U.S. Appl. No. 18/067,870.

\* cited by examiner

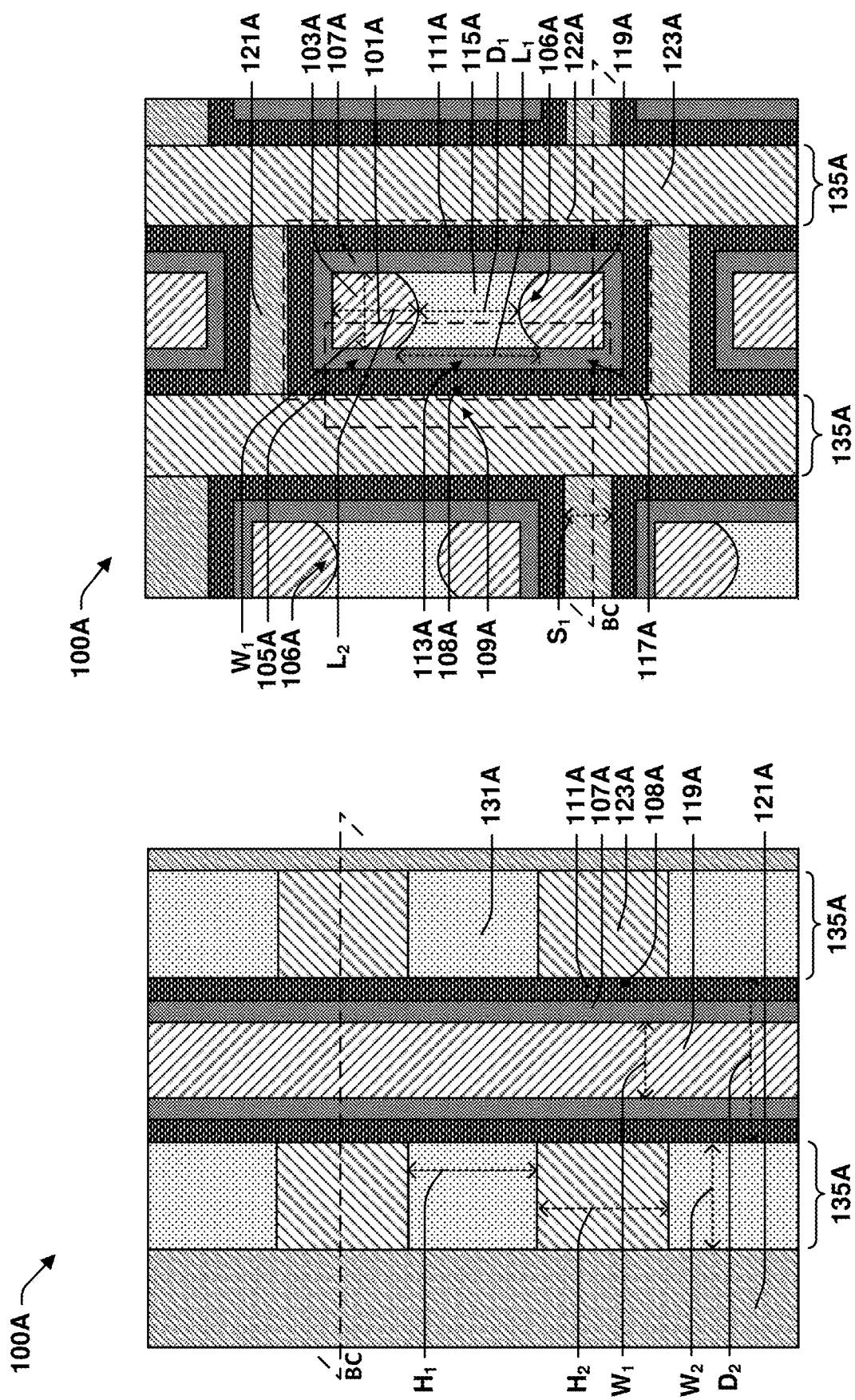

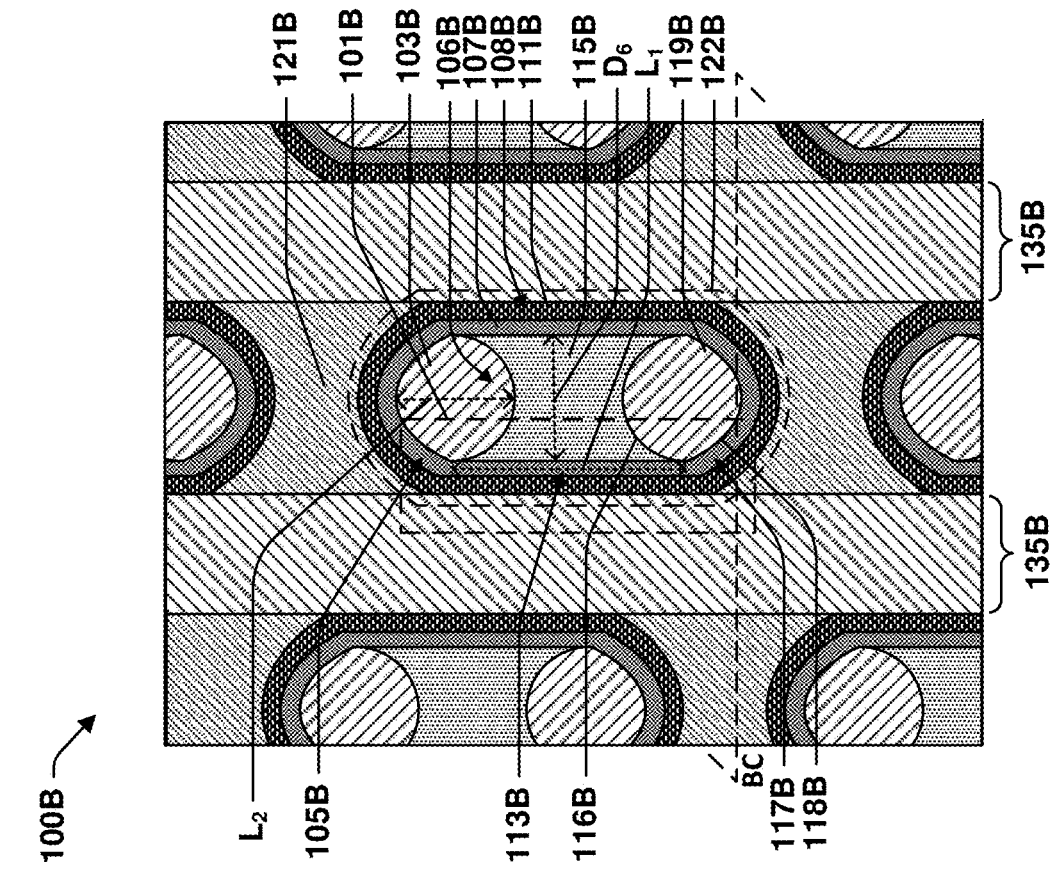
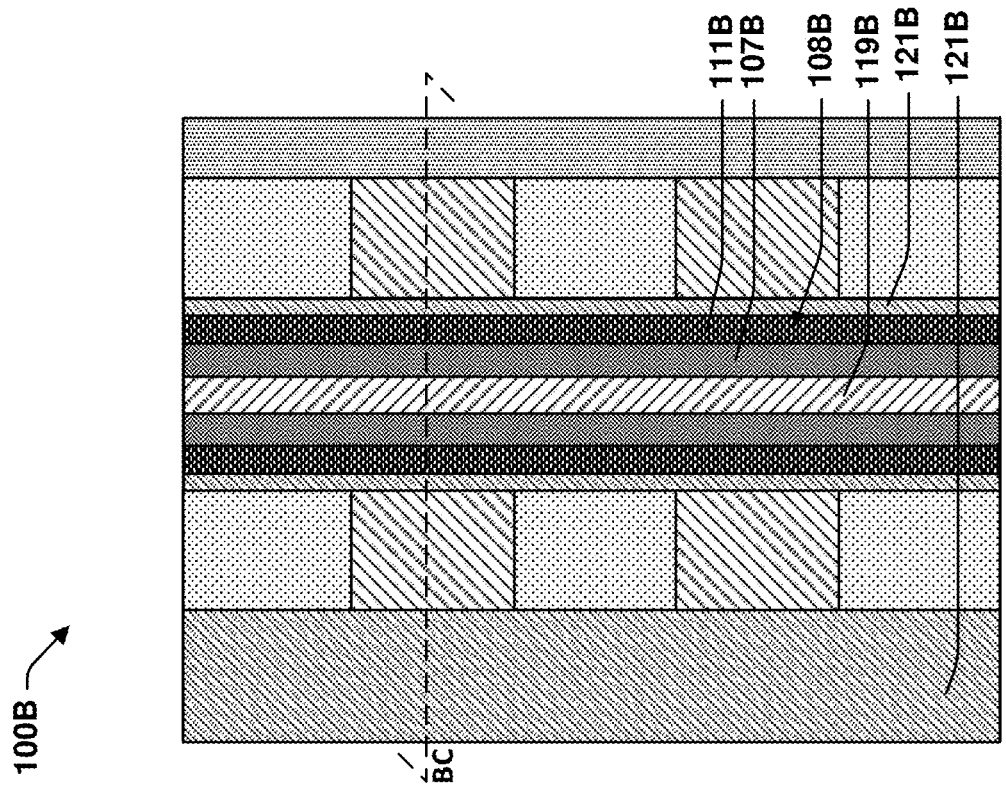
Fig. 5B
Fig. 5A

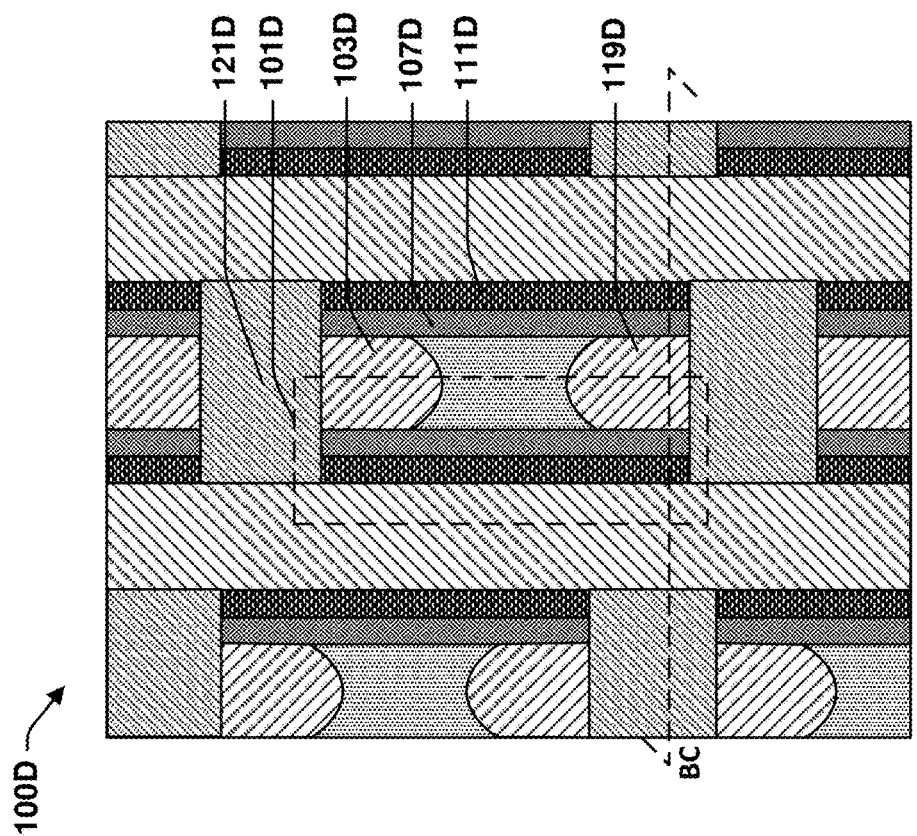
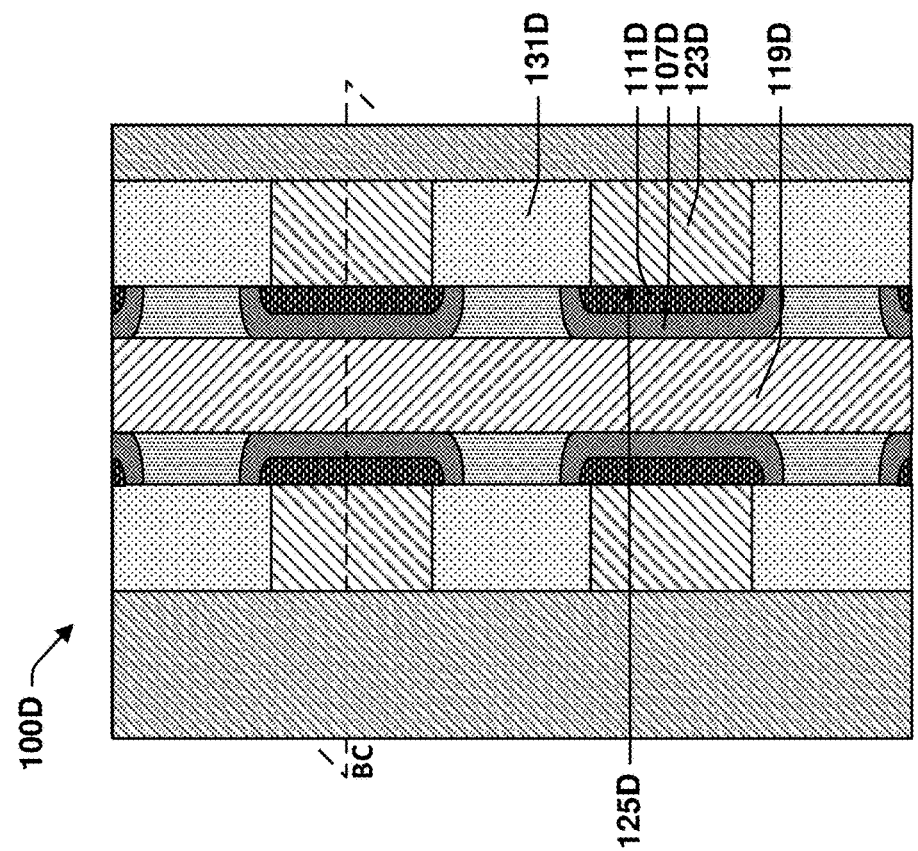

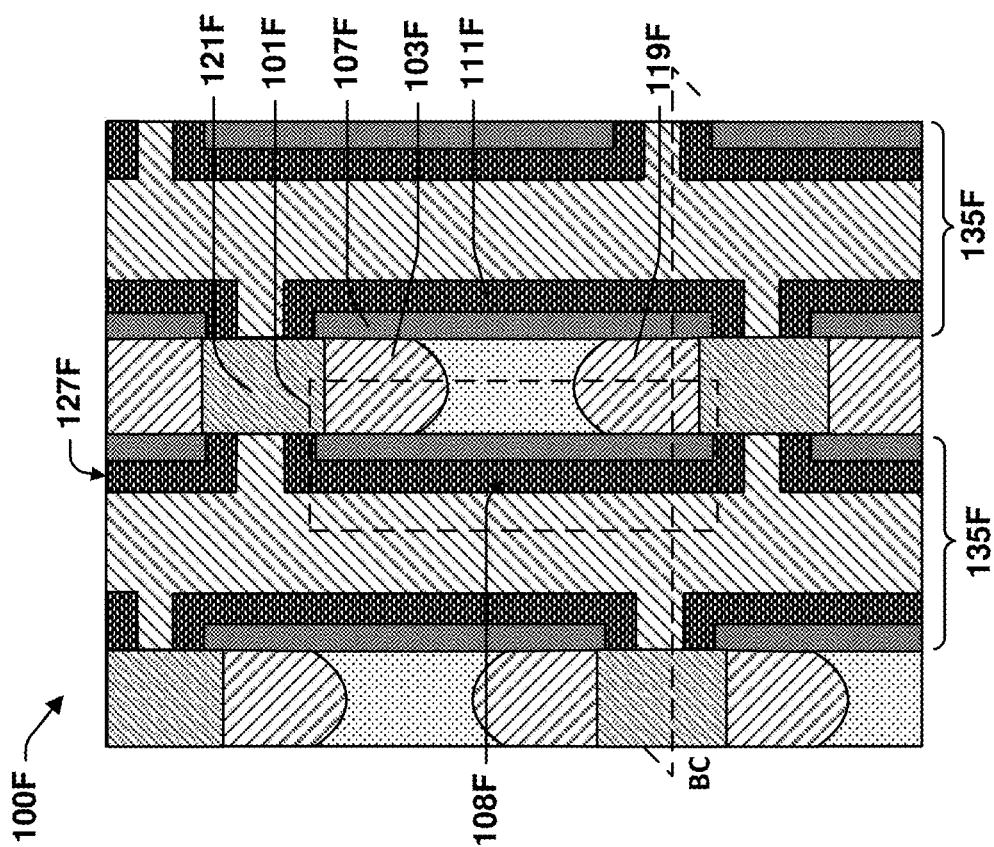
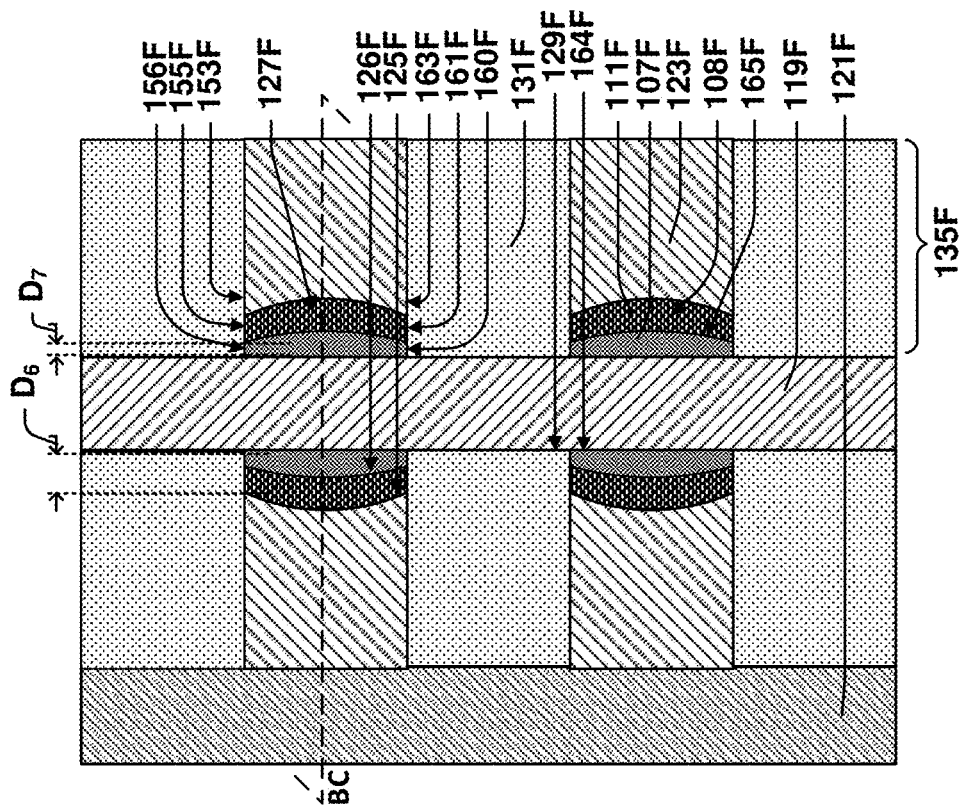
Fig. 9B
Fig. 9A

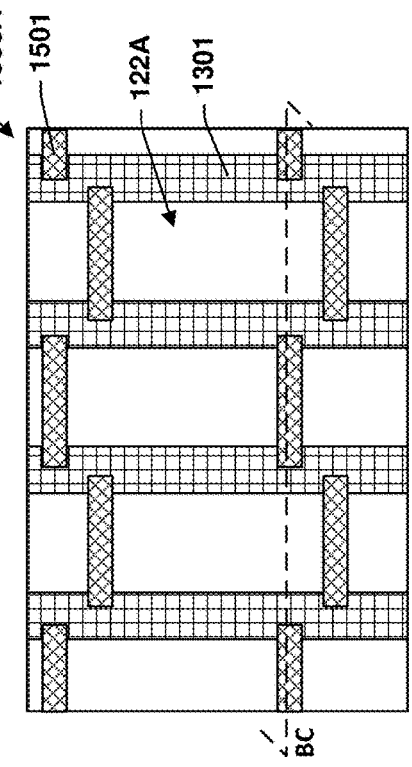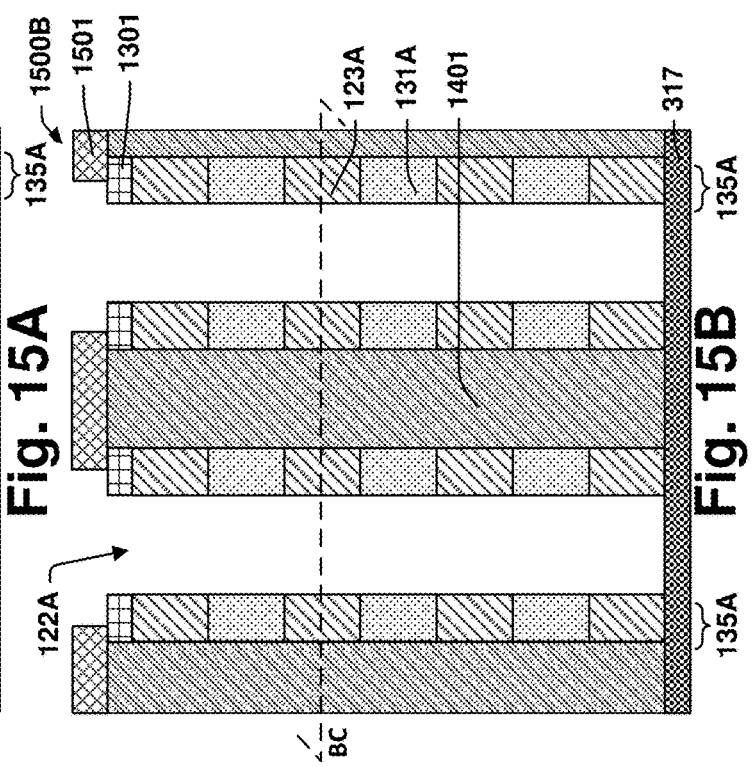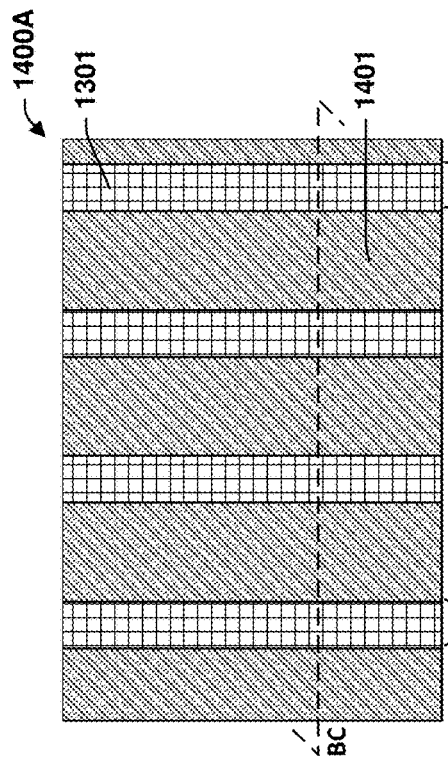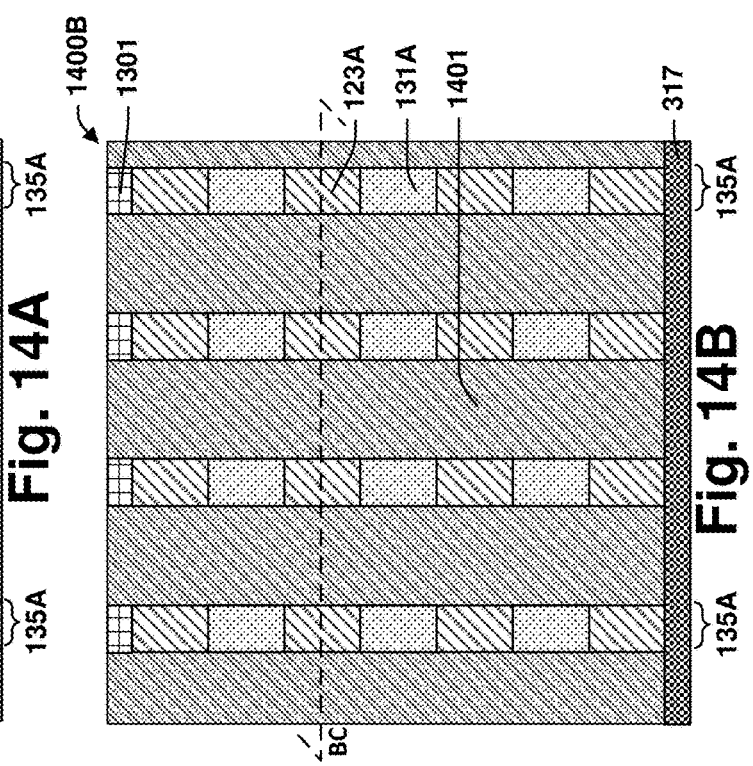

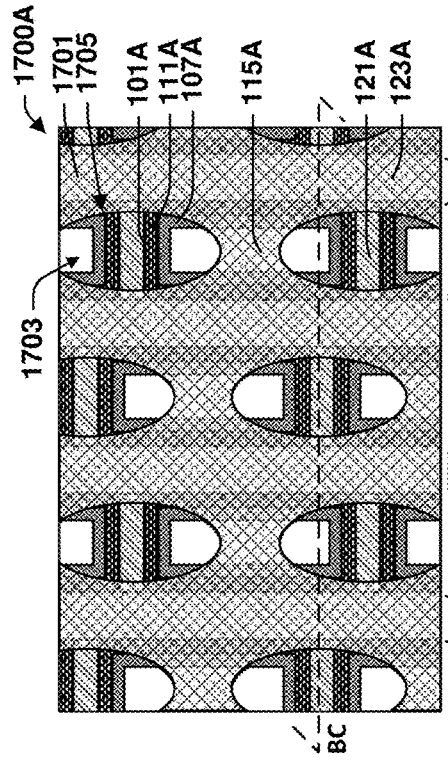
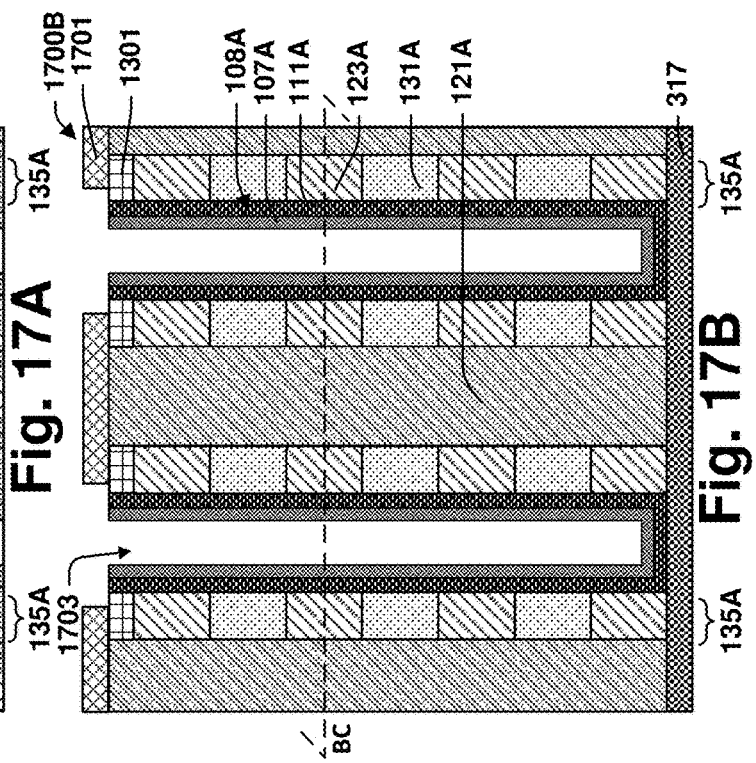
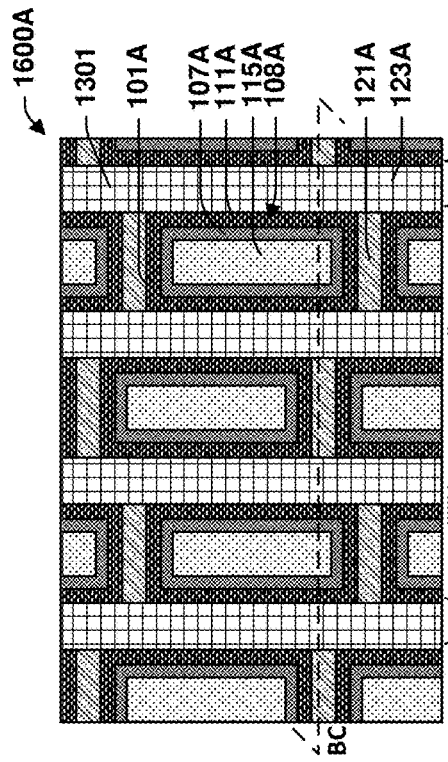
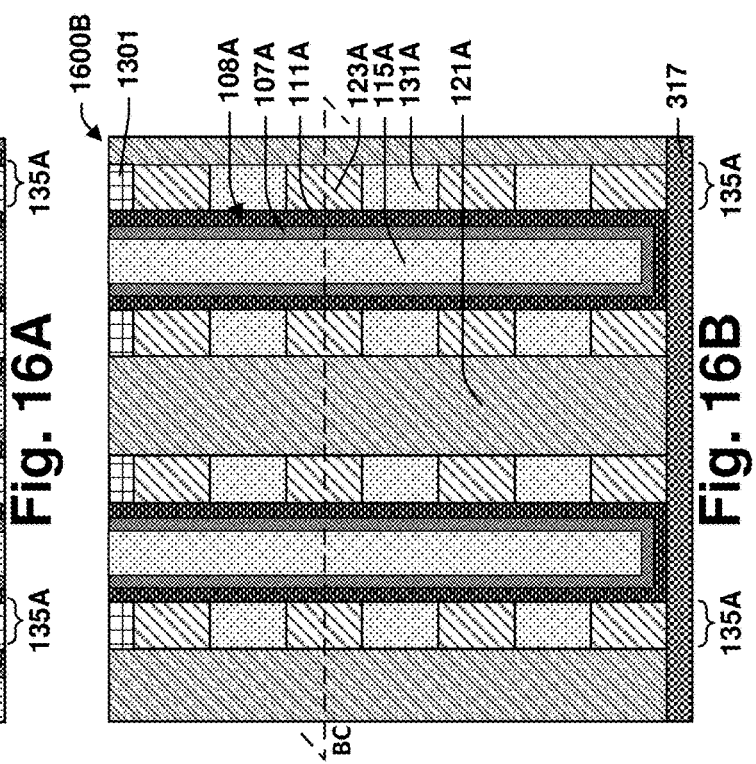

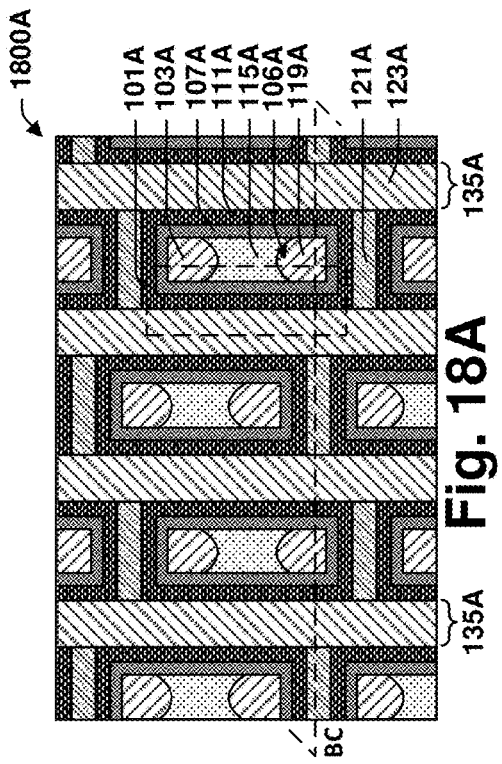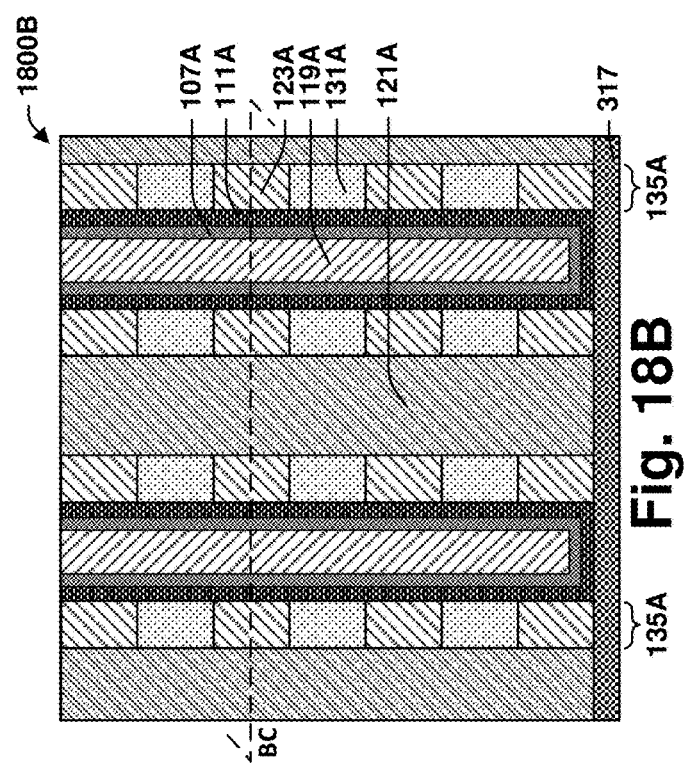

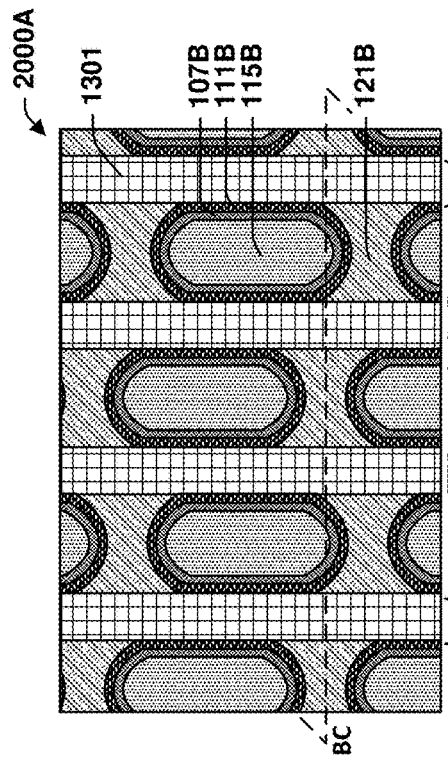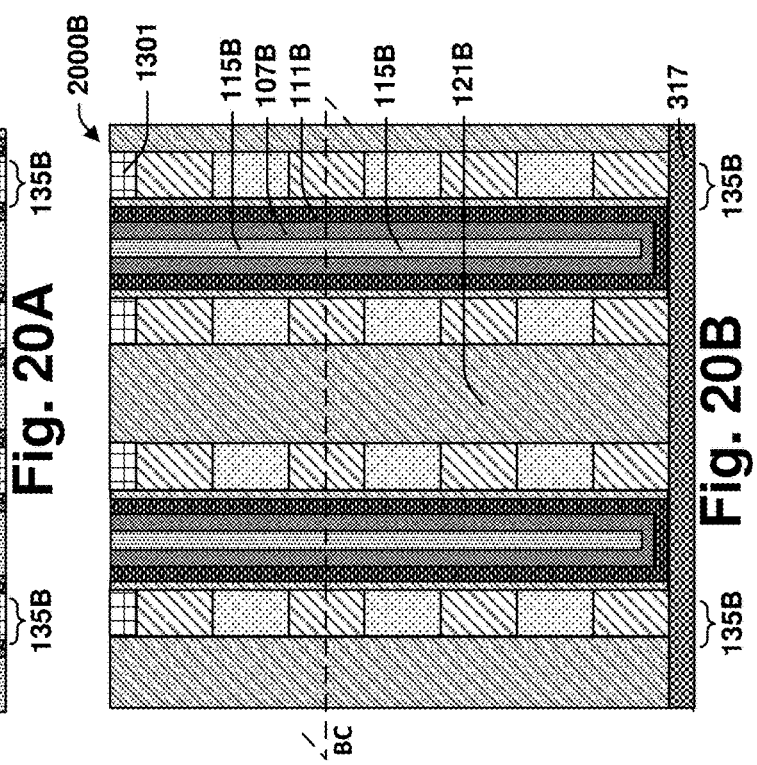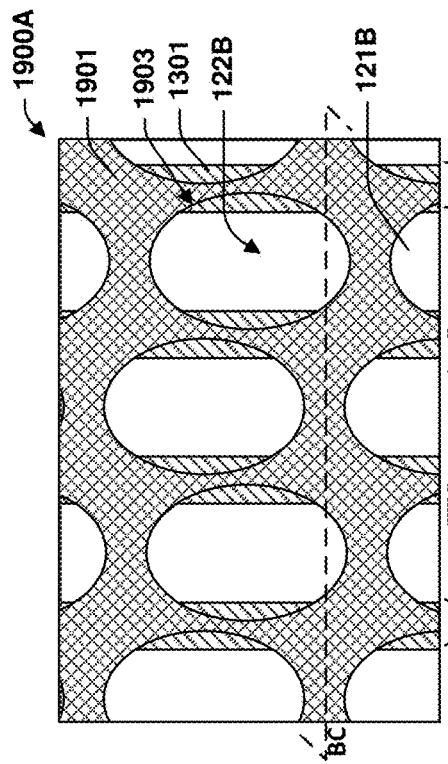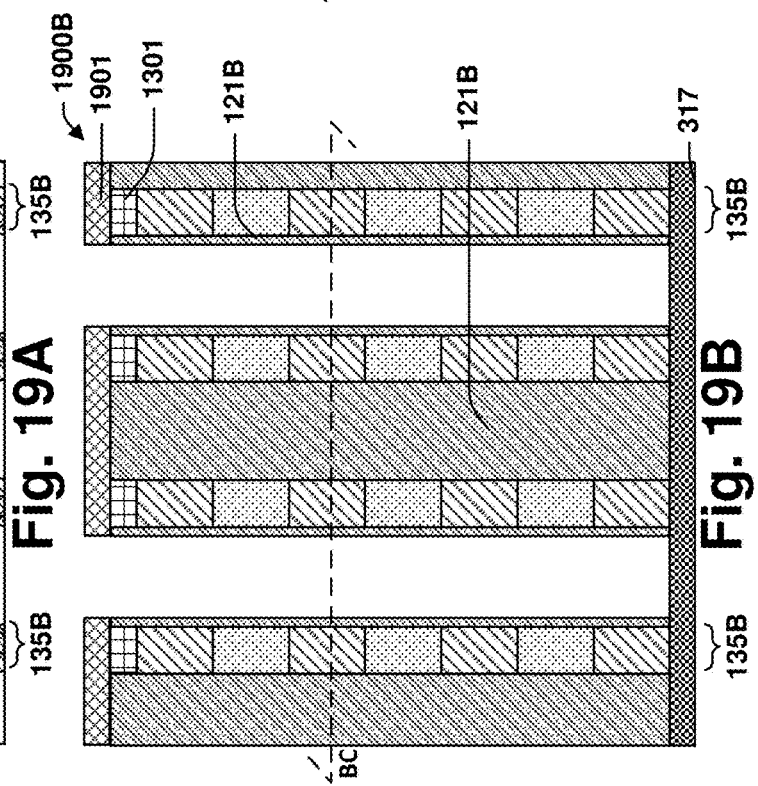

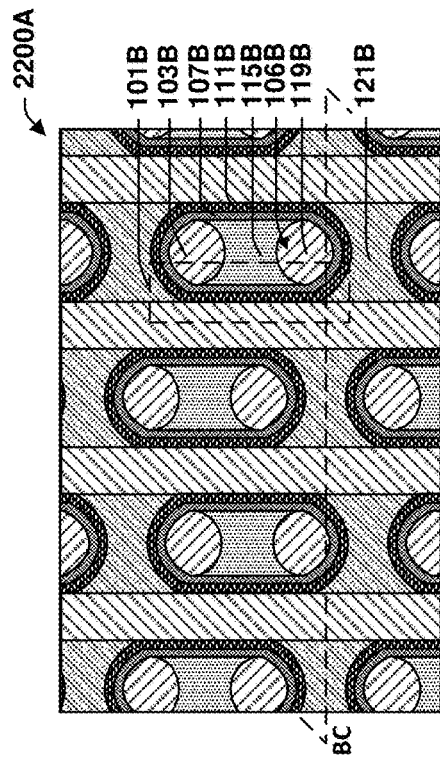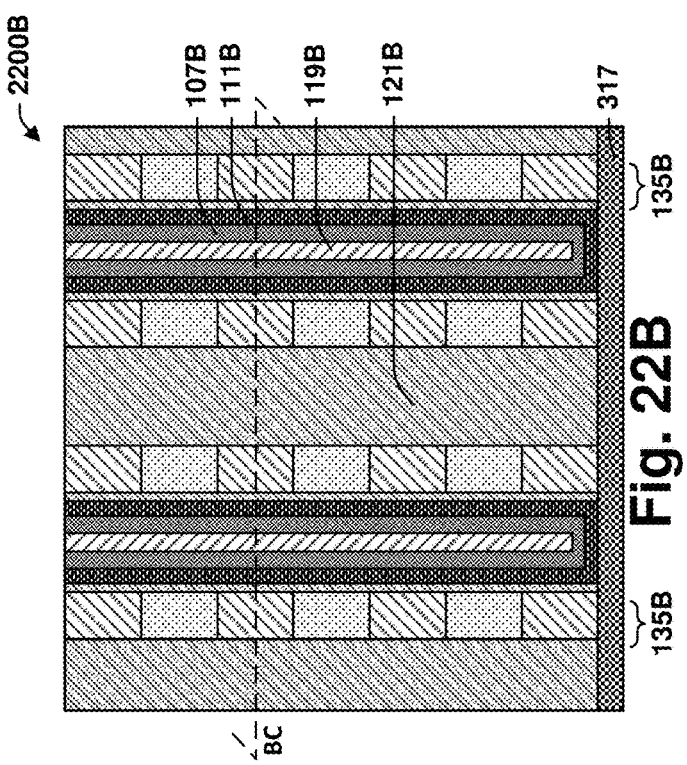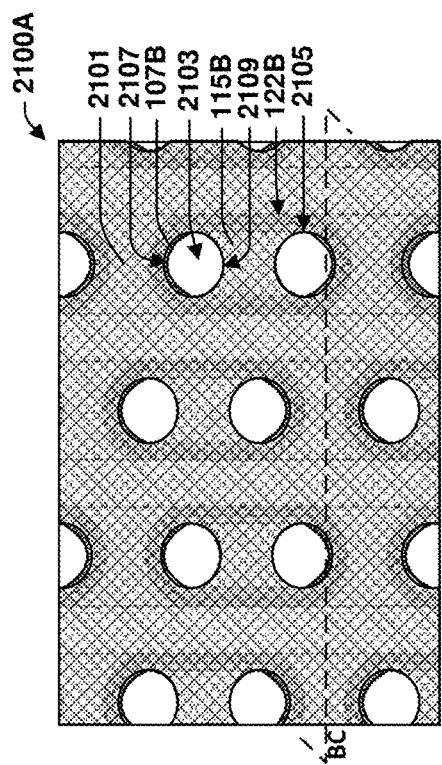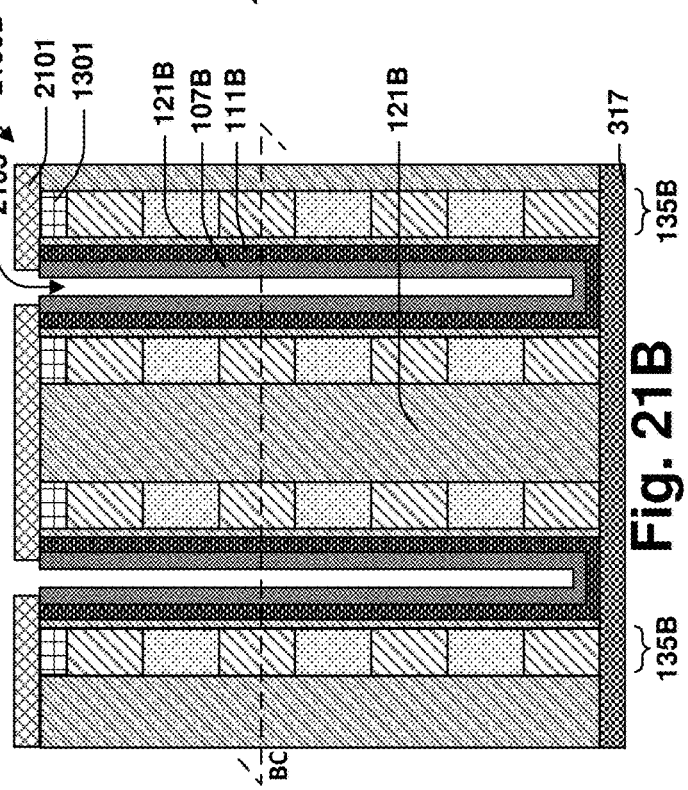

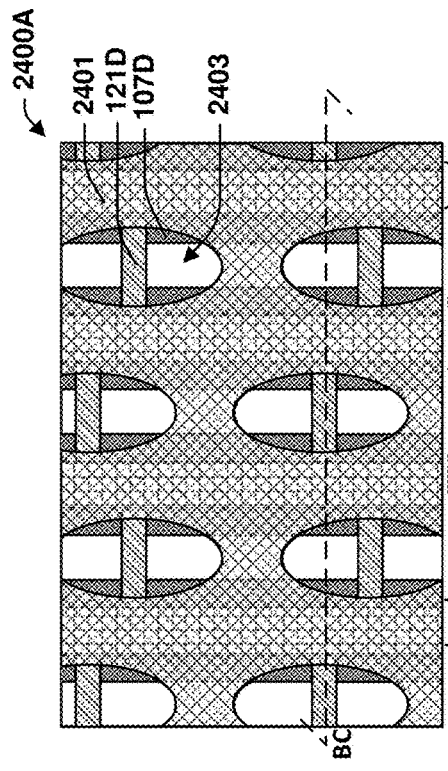
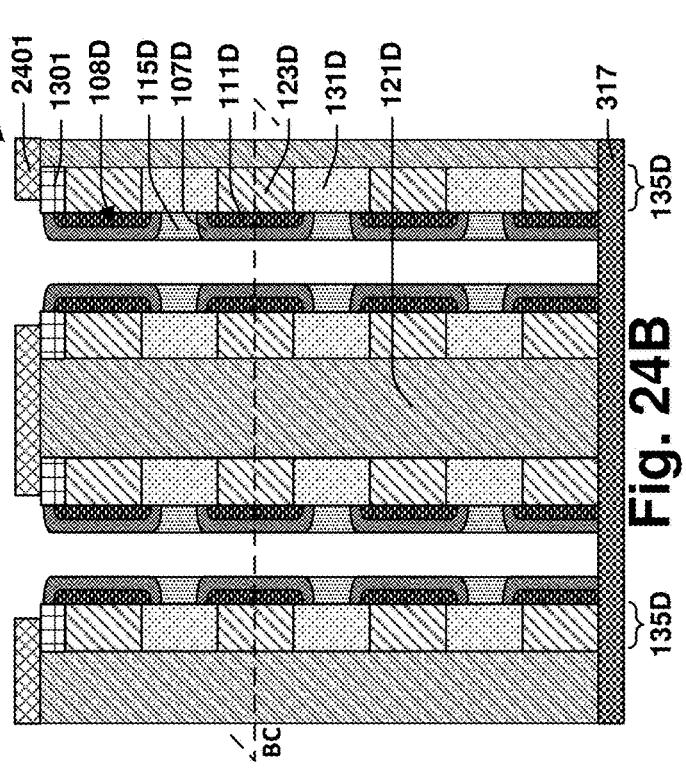
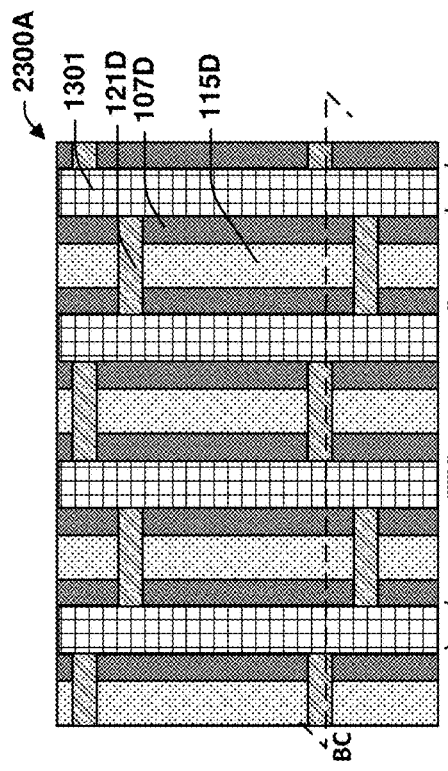
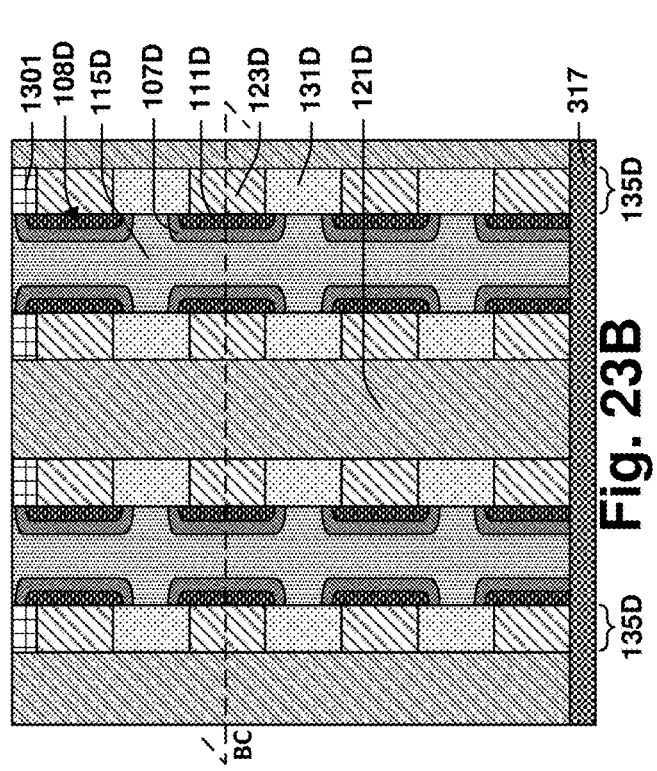

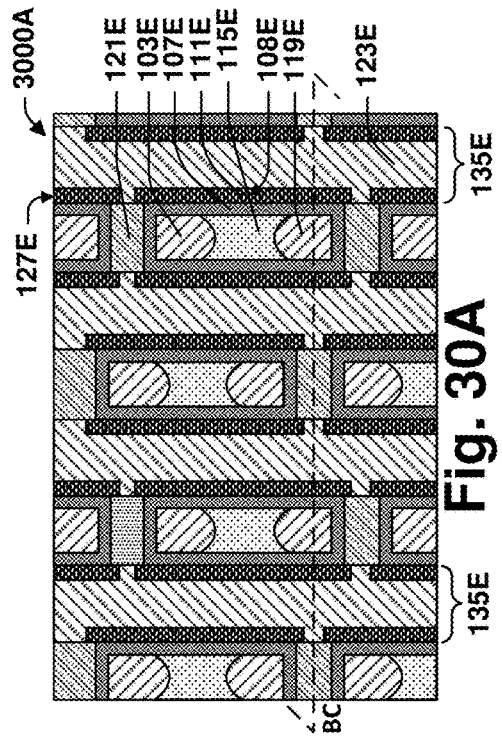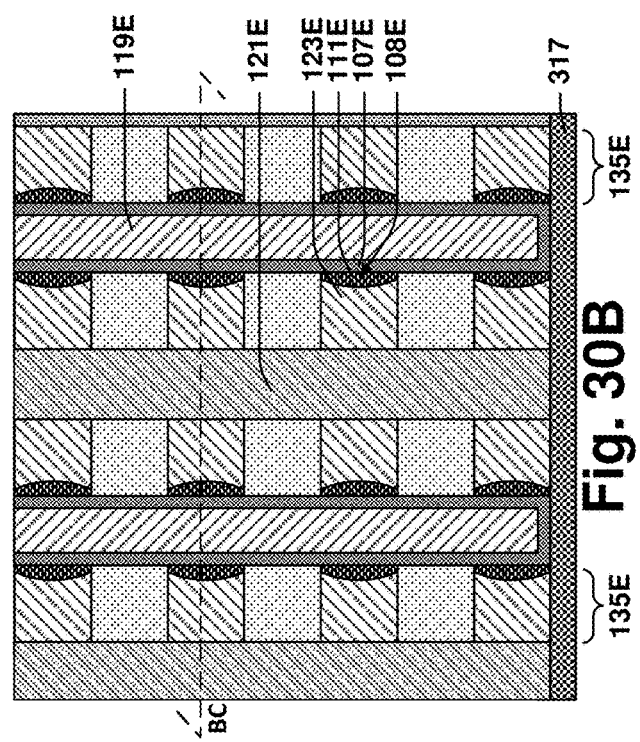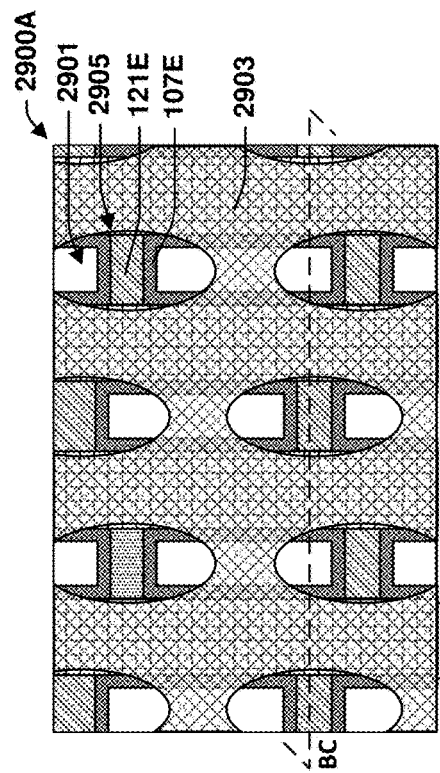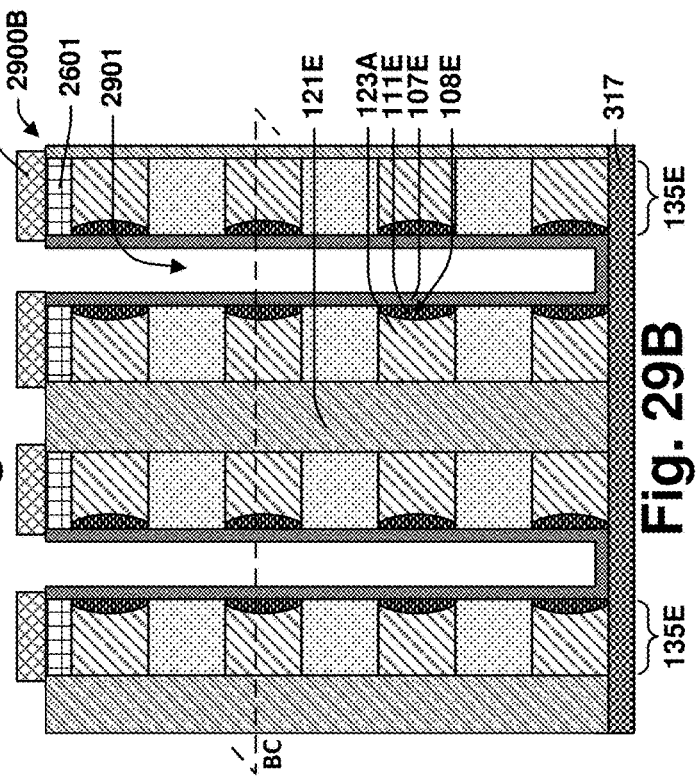

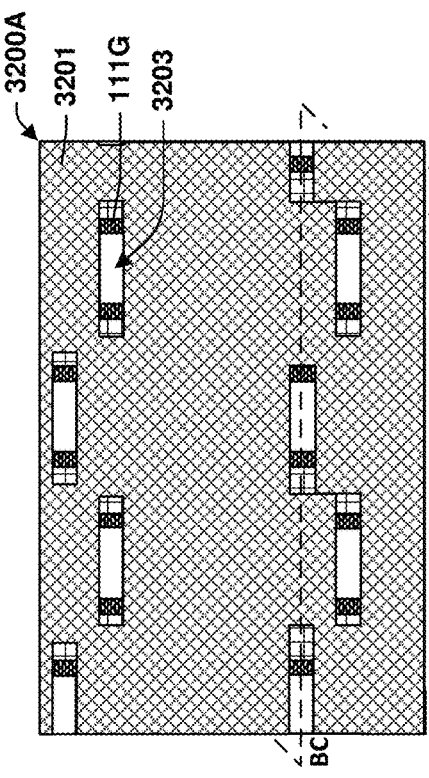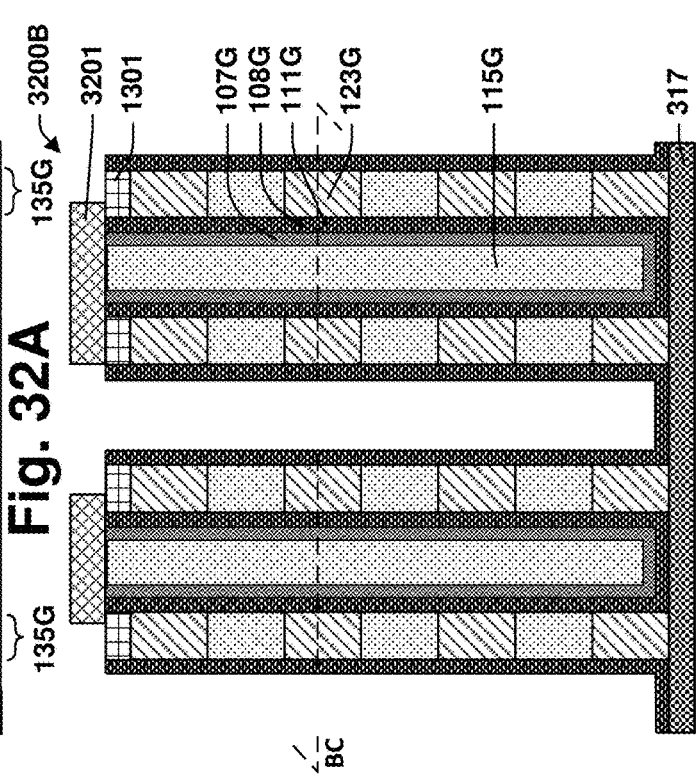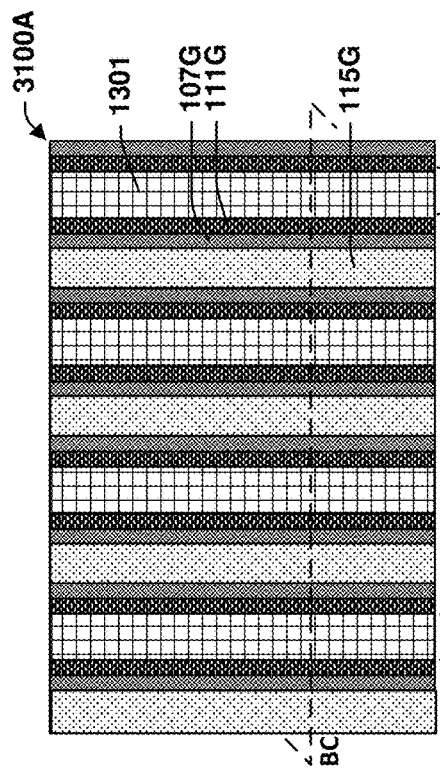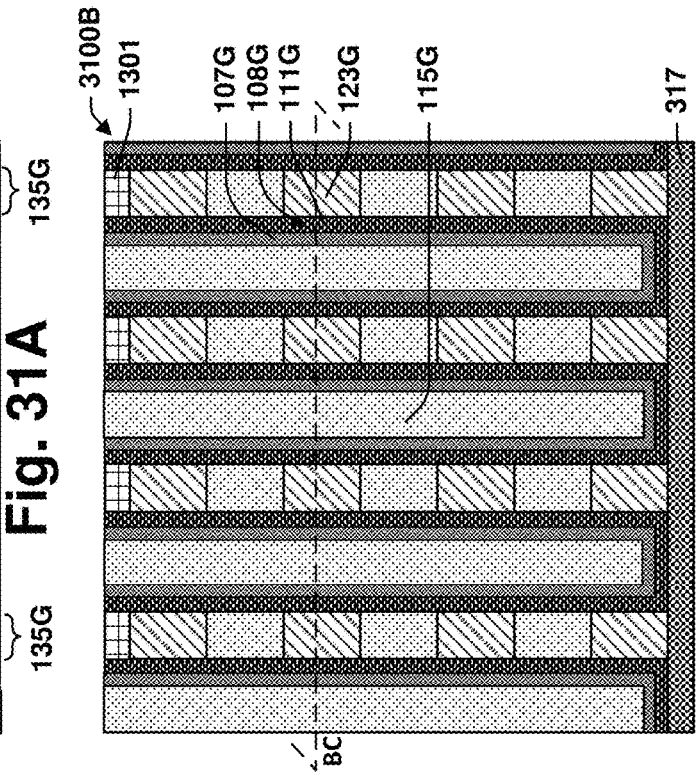

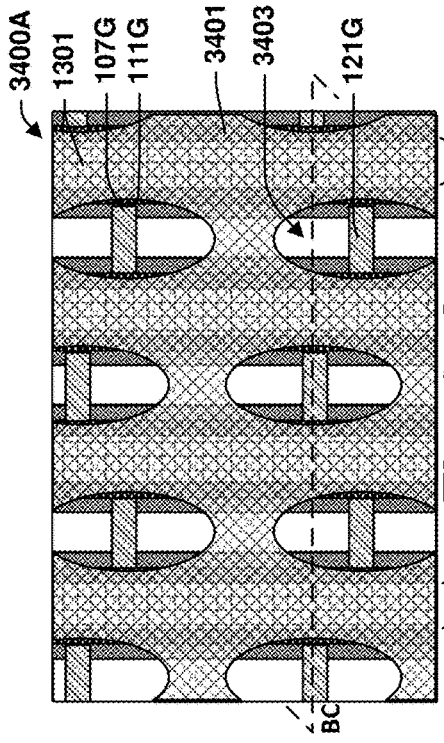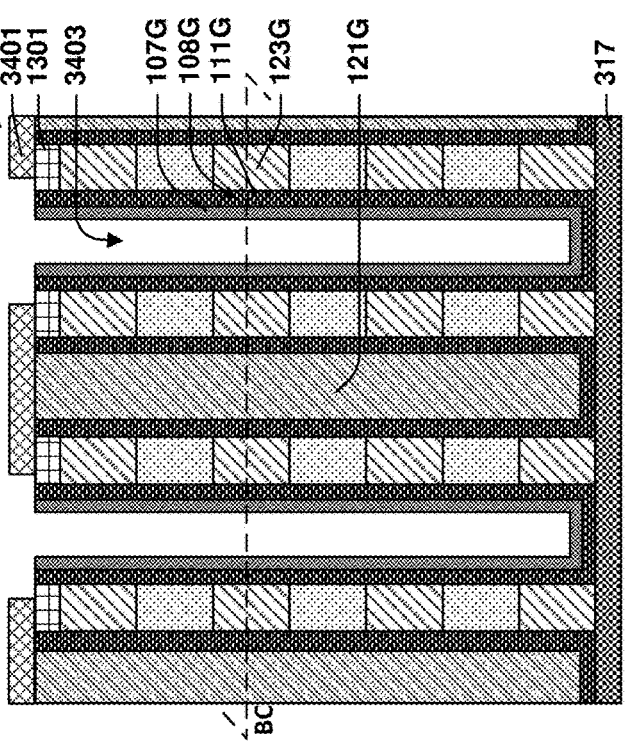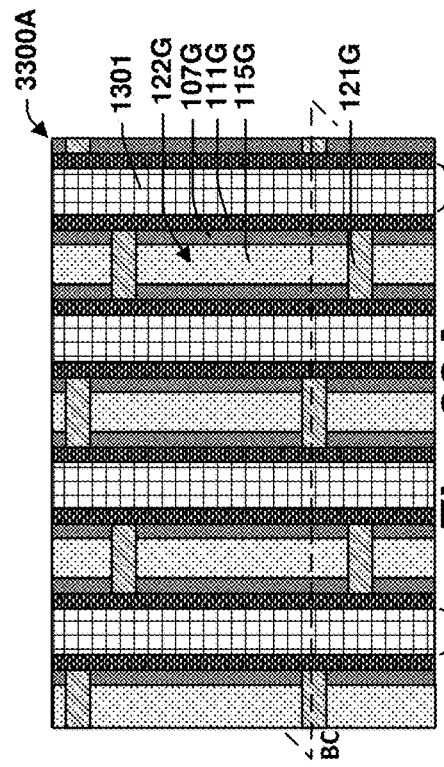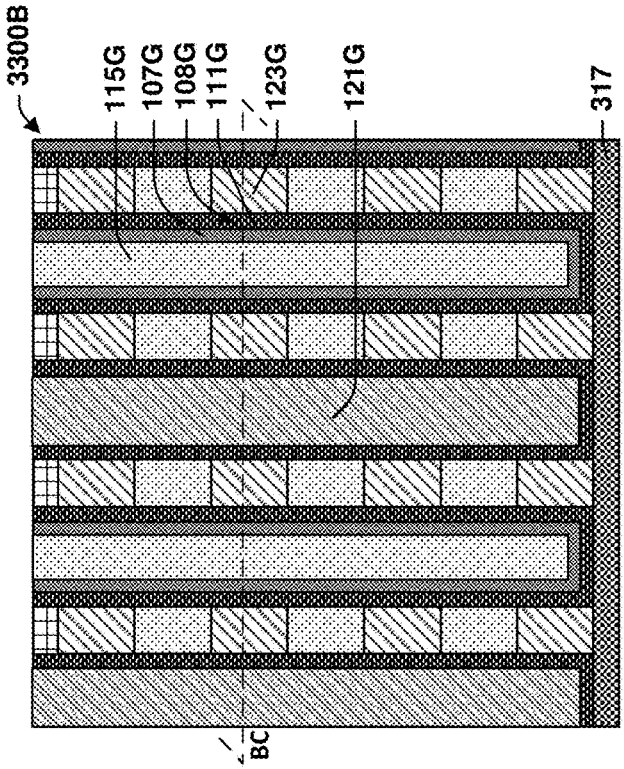

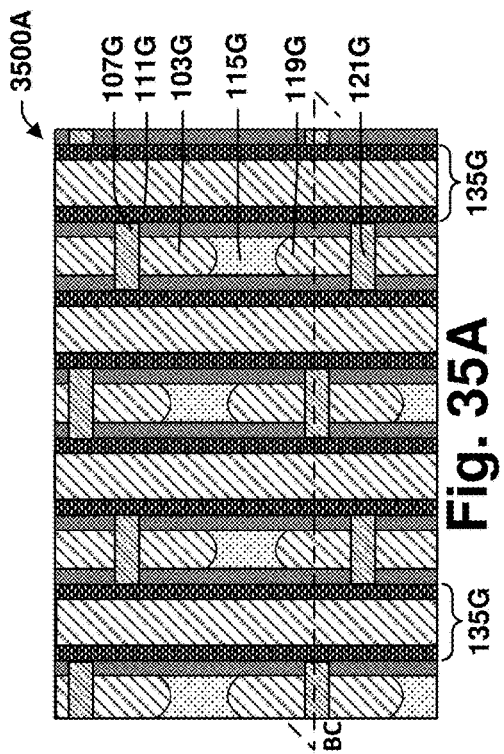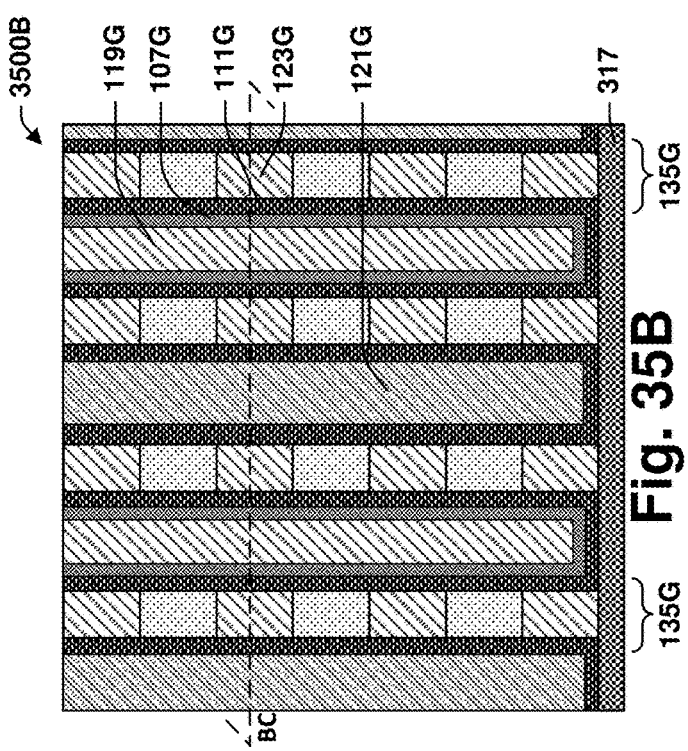

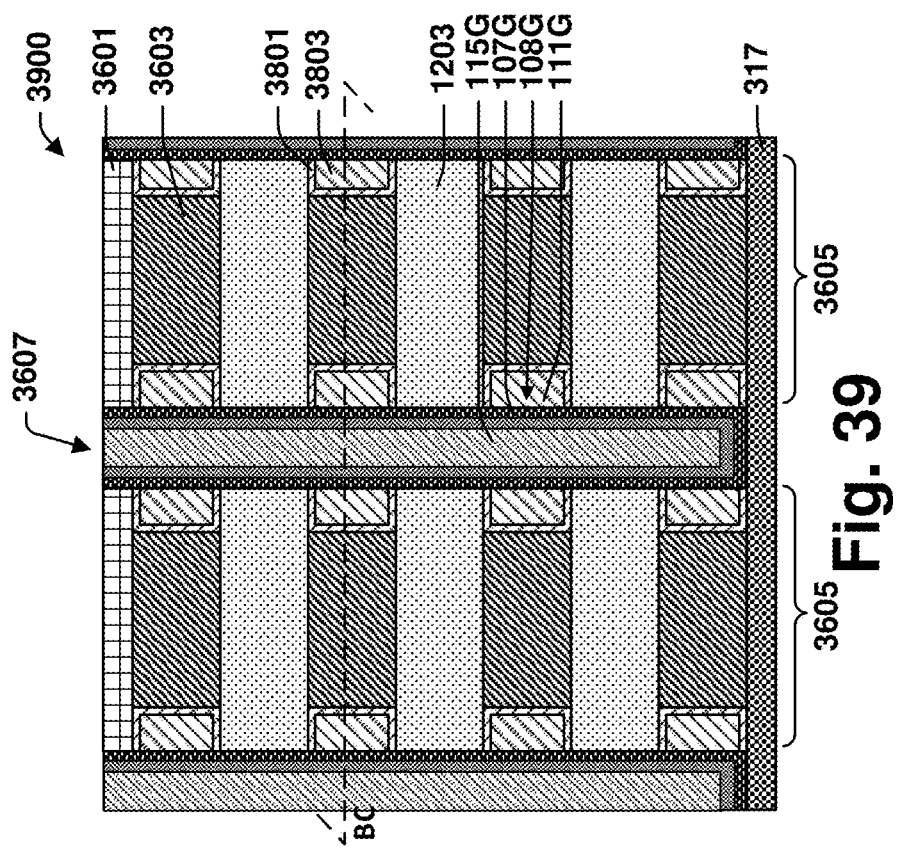
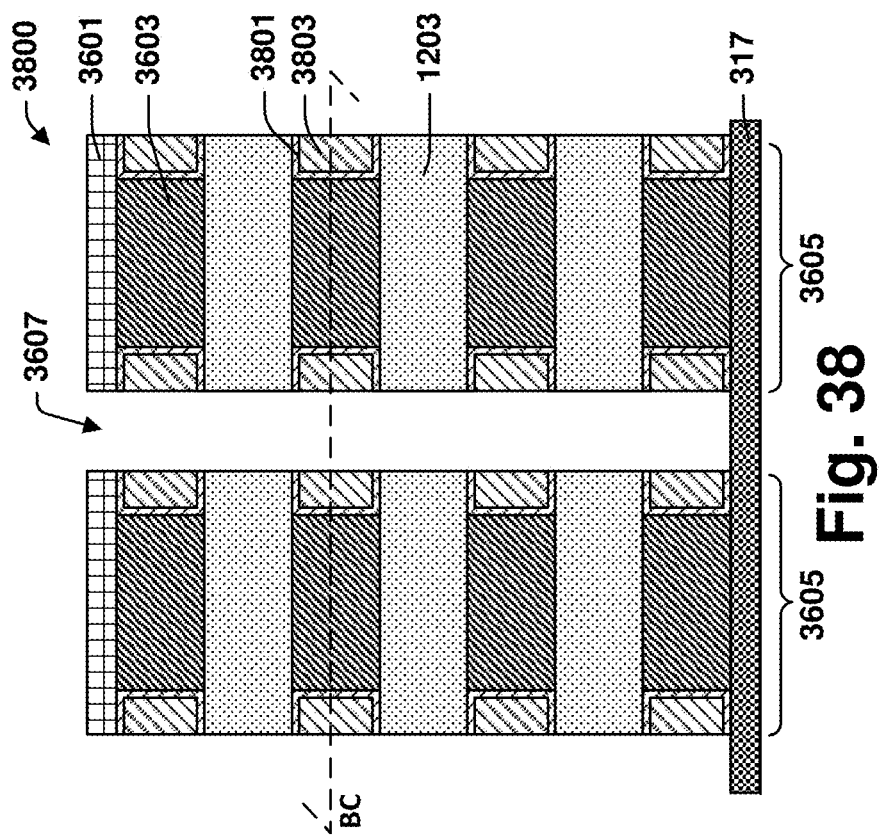

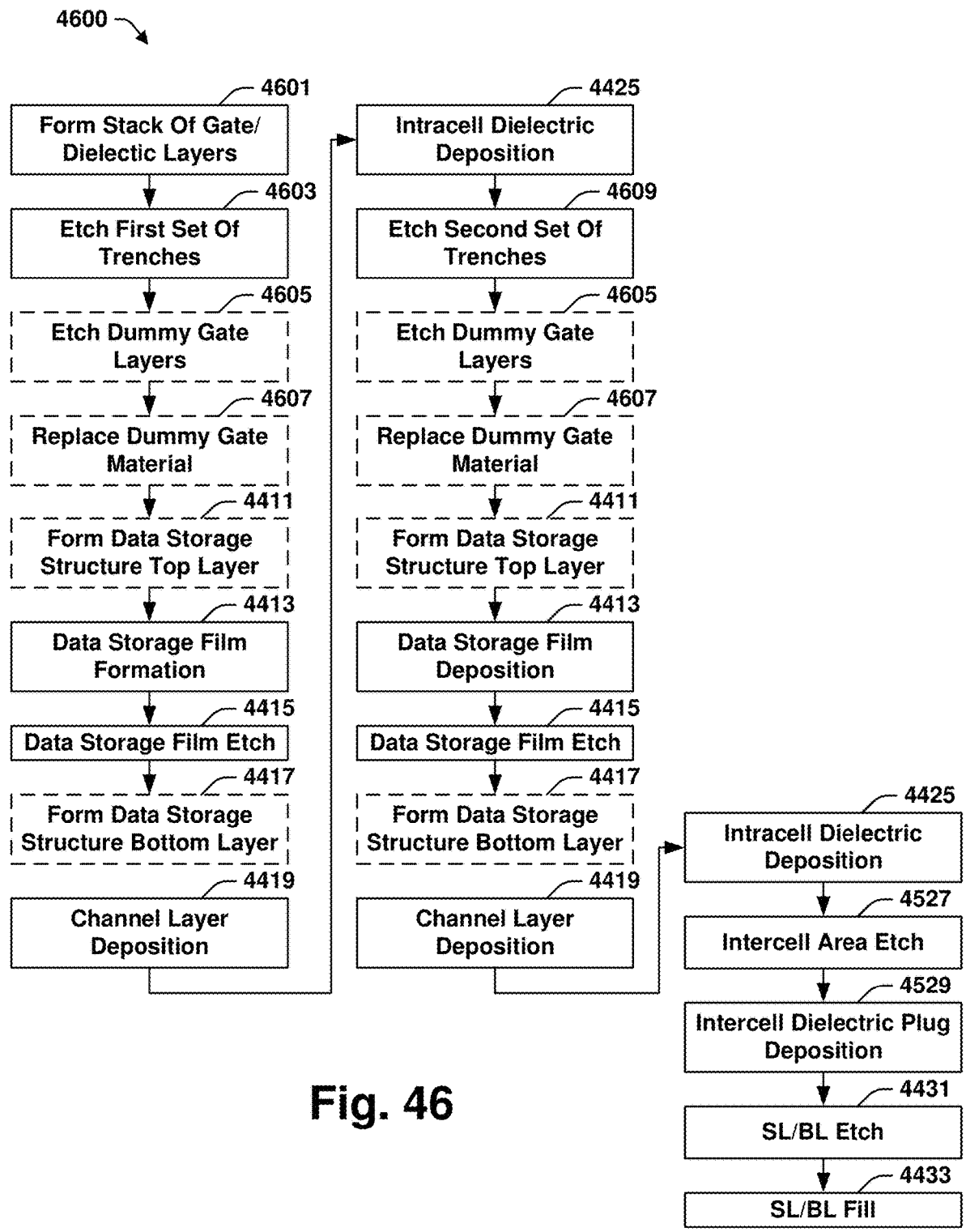

3D RAM SL/BL CONTACT MODULATION

REFERENCE TO RELATED APPLICATIONS

This application is a Continuation of U.S. application Ser. No. 18/067,870, filed on Dec. 19, 2022, which is a Continuation of U.S. application Ser. No. 17/122,228, filed on Dec. 15, 2020 (now U.S. Pat. No. 11,569,264, issued on Jan. 31, 2023), which claims the benefit of U.S. Provisional Application No. 63/031,013, filed on May 28, 2020. The contents of the above-referenced patent applications are hereby incorporated by reference in their entirety.

BACKGROUND

Two-dimensional (2D) memory arrays are prevalent in electronic devices and may include, for example, NOR flash memory arrays, NAND flash memory arrays, dynamic random-access memory (DRAM) arrays, and so on. However, 2D memory arrays are reaching scaling limits and are hence reaching limits on memory density. Three-dimensional (3D) memory arrays are a promising candidate for increasing memory density and may include, for example, 3D NAND flash memory arrays, 3D NOR flash memory arrays, and so on.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1B illustrates a vertical cross-section of the 3D memory of FIG. 1A in the plane B.

FIG. 1C illustrates a horizontal cross-section of the 3D memory of FIG. 1A in the plane C.

FIGS. 5A-5B illustrate vertical and horizontal cross-sections of a second 3D memory array, which is a 3D memory array according to some other aspects of the present teachings.

FIGS. 7A-7B illustrate vertical and horizontal cross-sections of a fourth 3D memory array, which is a 3D memory array according to some other aspects of the present teachings.

FIGS. 9A-9B illustrate vertical and horizontal cross-sections of a sixth 3D memory array, which is a 3D memory array according to some other aspects of the present teachings.

FIGS. 12A and 12B through FIGS. 18A and 18B are a series of paired top view illustrations and cross-sectional view illustrations exemplifying a method according to the present teachings of forming a device comprising a 3D memory array with features of the first 3D memory array.

FIGS. 19A and 19B through FIGS. 22A and 22B provide paired top view illustrations and cross-sectional view illustrations exemplifying a variation on the method of FIGS. 12A-18B, which variation may be used to form a memory array with features of the second 3D memory array.

FIGS. 23A and 23B through FIGS. 25A and 25B provide paired top view illustrations and cross-sectional view illustrations exemplifying a variation on the method of FIGS. 12A-18B, which variation may be used to form a memory array with features of the fourth 3D memory array.

FIGS. 26A and 26B through FIGS. 30A and 30B provide paired top view illustrations and cross-sectional view illustrations exemplifying a variation on the method of FIGS. 12A-18B, which variation may be used to form a memory array with features of the fifth 3D memory array.

FIGS. 31A and 31B through FIGS. 35A and 35B provide paired top view illustrations and cross-sectional view illustrations exemplifying a variation on the method of FIGS. 12A-18B, which variation may be used to form a memory array with features of the seventh 3D memory array.

FIGS. 36 through 43 provide cross-sectional views illustrating an alternate method of forming dielectric strip/gate strip stacks in the methods according to the present teachings.

FIGS. 44-46 provide flow charts illustrating various method according to the present teachings that may be used to form 3D memory arrays.

DETAILED DESCRIPTION

Figure 1A:
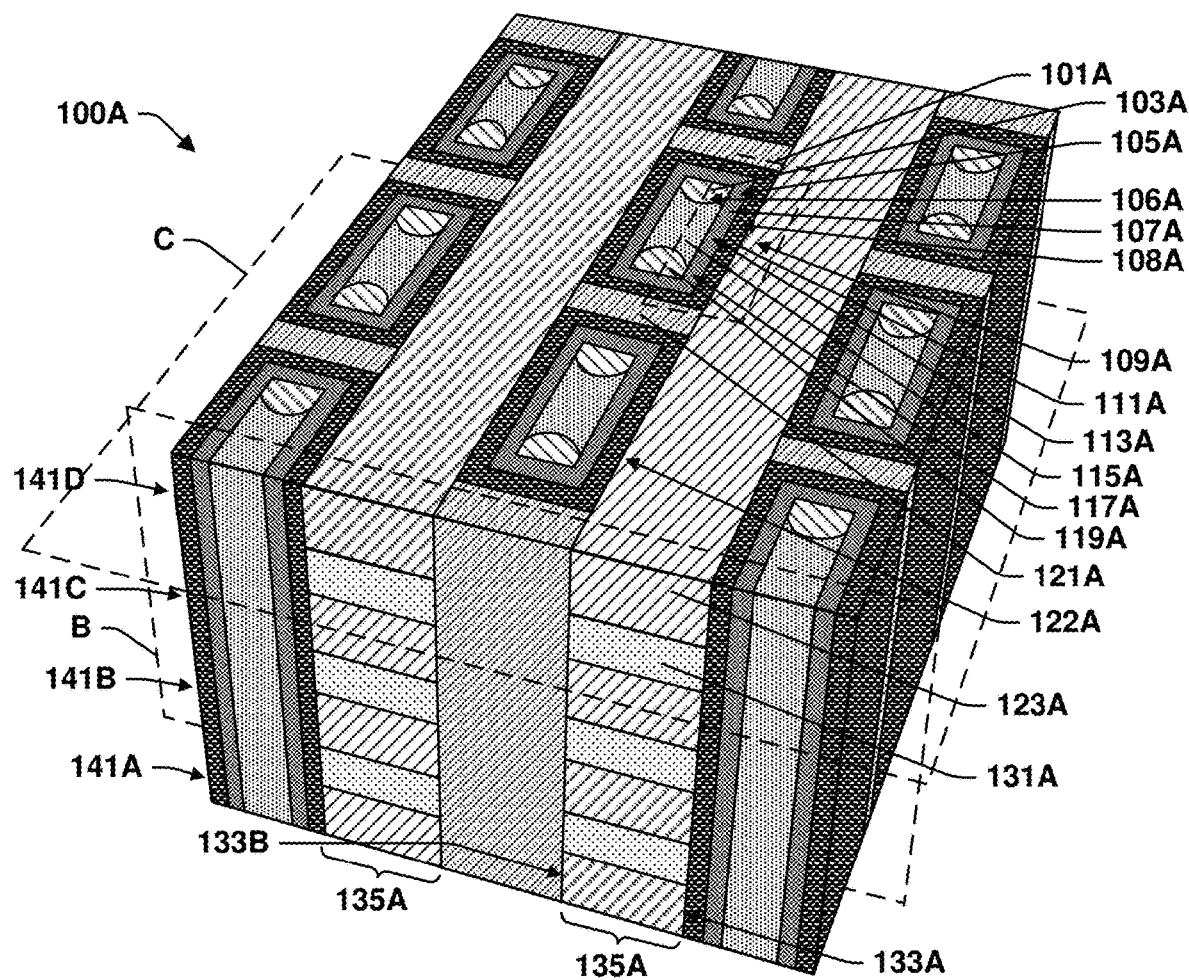
FIG. 1A illustrates a perspective view of a first 3D memory array, which is a 3D memory array according to some aspects of the present teachings.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In one process of forming a 3D memory array, control gate layers and dielectric layers are alternately deposited to form a broad stack. Trenches are formed to divide the broad stack into a row of narrow stacks, each stack including multiple tiers of gate strips vertically separated by dielectric strips. Dielectric plugs are formed periodically along the trenches dividing the trenches into cell areas. A data storage film and a channel film are deposited on the sidewalls of the cell areas. The middles of the cell areas are filled with an intracell dielectric. Openings are etched in the intracell dielectric and filled with conductive material to provide vertical source lines and drain lines.

With each of the data storage film and channel film depositions, the remaining cell area becomes smaller. The data storage film and channel film are vertical films that deposit all about a perimeter (four sides) of the cell area. This leaves only a small space for the source lines and the drain lines. The source lines and the drain lines may be border on three sides by the channel layer. Making the source lines and the drain lines larger causes the source lines and the drain lines to be closer together. A distance along the channel layer from a source line to a drain line is the operative channel length of the memory cell and cannot be arbitrarily reduced without affecting the functioning of the memory cells. Accordingly, it is difficult to widen the source lines and the drain lines without significantly reducing the overall density of the memory array.

In accordance with some aspects of the present teachings, the source lines and the drain lines are each provided with a bulge toward the interior of the cell area. The bulges increase the source line and the drain line cross-sectional areas without reducing the channel lengths. In the resulting structure, a distance between the source lines and the drain lines is less than the channel length. In some embodiments, the bulges have elliptical edges.

Some aspects of the present teachings relate to methods of forming a 3D memory array. In these methods, openings for the source lines and drain lines are etched through elliptical mask openings. In some of these teachings, there is one mask opening for each source line and one other opening for each drain line. In some of these teachings, the mask openings are circular. In others of these teachings, single elliptical mask openings are used to etch pairs of source line and drain line openings. The elliptical mask openings may be centered over dielectric plugs having a different composition from the intracell dielectric. A selective etch process leaves the dielectric plugs separating source line/drain line pairs.

In some embodiments, the dielectric plugs have concave sidewalls. The channel layer may be deposited over the concave sidewalls and the resulting shape may facilitate good contact between the channel layer and the source lines and the drain lines. This advantage may be enhanced when the source and drain lines are formed by etching through circular or nearly circular openings. In some embodiments, the dielectric plugs are formed by filling the trenches with an intercell dielectric and etching the intercell dielectric through a mask having elliptical openings corresponding to the desired locations for cell areas. The etching through the elliptical openings may produces the concave sidewalls.

In some aspects of the present teachings, the areas available for the source lines and the drain lines are increased by preventing the data storage film from forming on the dielectric plugs. In some embodiments, this is accomplished by forming the data storage film selectively on the control gate strip sidewalls. In some embodiments, this is accomplished by depositing the data storage film in recesses in the narrow stacks, the recesses being formed adjacent the control gate strips. Any portion of the data storage film that deposits outside the recesses may be removed by etching. In some embodiments, the data storage film is formed before the dielectric plugs.

In some aspects of the present teachings, the areas available for the source lines and the drain lines are increased by eliminating all or part of the channel layer that would be disposed on the dielectric plugs. In some embodiments, this is accomplished by forming the channel layer selectively on the data storage film. In some embodiments, this is accomplished by depositing all or part of the channel layer in recesses in the narrow stacks. In some of these embodiments, a second portion of the channel layer be disposed outside the recesses to provide the channel with a sufficient thickness. In some embodiments, the channel layer is formed before the dielectric plugs.

FIG. 1A illustrates a perspective view of a first 3D memory array 100A of memory cells 101A according to some aspects of the present teachings. FIG. 1B illustrates a cross-section of the first 3D memory array 100A along a plane B of FIG. 1A. FIG. 1C illustrates a cross-section along a plane C of FIG. 1A. The line BC in FIGS. 1B and 1C is at the intersection of the plane B and the plane C. The plane B is vertical. The plane C is horizontal.

A row of stacks 135A is disposed within the first 3D memory array 100A. Each of the stacks 135A has gate strips 123A in a plurality of tiers 141A-141D separated by dielectric strips 131A. This example shows four tiers 141A-141D, but the stacks 135A may have a greater or lesser number of tiers. Cell areas 122A are areas between the stacks 135A separated by intercell dielectric plugs 121A. Data storage structures 108A include data storage films 111A and are formed around perimeters of the cell areas 122A. Channel layers 107A are formed about inner walls of the data storage structures 108A. Vertically oriented source lines 103A and drain lines 119A are disposed within the cell areas 122A and are separated within each of the cell areas 122A by intracell dielectric 115A. The source lines 103A and drain lines 119A have bulges 106A.

The memory cells 101A may be formed on a first side 133A and a second side 133B, which are opposite sides of a stack 135A. The memory cells 101A are arrayed horizontally and vertically on the first side 133A and on the second side 133B. Each of the memory cells 101A includes a control gate 109A, a data storage structure 108A, a channel 113A, a source side 105A, and a drain side 117A. The control gates 109A are provided by the gate strips 123A. A single gate strip 123A may provide control gates 109A for a plurality of memory cells 101A including memory cells 101A that are horizontally adjacent along a length of a gate strip 123A and memory cells 101A that are on opposite sides 133A-133B of the stack 135A that includes the gate strip 123A. The channel 113A, the source side 105A, and the drain side 117A are all provided by a channel layer 107A. The source side 105A is a portion of the channel layer 107A adjacent a source line 103A. The drain side 117A is a portion of the channel layer 107A adjacent a drain line 119A. The channel 113A is a portion of the channel layer 107A between the source side 105A and the drain side 117A.

The channel layer 107A extends horizontally to provide channels 113A, source sides 105A, and drain sides 117A for multiple memory cells 101A. The channel layer 107A may also extend vertically through the tiers 141A-141D. In some embodiments, the channel layer 107A is continuous across a length and a height of a stack 135A. Portions of the channel layer 107A may provide the channels 113A, the source sides 105A, and the drain sides 117A for all the horizontally and vertically distributed memory cells 101A on either the first side 133A or the second side 133B of a stack 135A.

With reference to FIG. 1C, one source line 103A and one drain line 119A are disposed within each of the cell areas 122A. Due to the bulges 106A, a distance $D_1$ between the source line 103A and the drain line 119A is less than a channel length $L_1$. The channel length $L_1$ may be a distance from a point at which the channel layer 107A abuts the source line 103A to a point at which the channel layer 107A abuts the drain line 119A. In some embodiments, the distance $D_1$ is 90% or less the length $L_1$. In some embodiments, the distance $D_1$ is 80% or less the length $L_1$. In some embodiments, the distance $D_1$ is 70% or less the length $L_1$. In some embodiments, areas of the source line 103A and the drain line 119A are 5% or more greater than they would be absent the bulges 106A. In some embodiments, areas of the source line 103A and the drain line 119A are 10% or more greater than they would be absent the bulges 106A. In some embodiments, areas of the source line 103A and the drain line 119A are 20% or more greater than they would be absent the bulges 106A.

Figure 2:
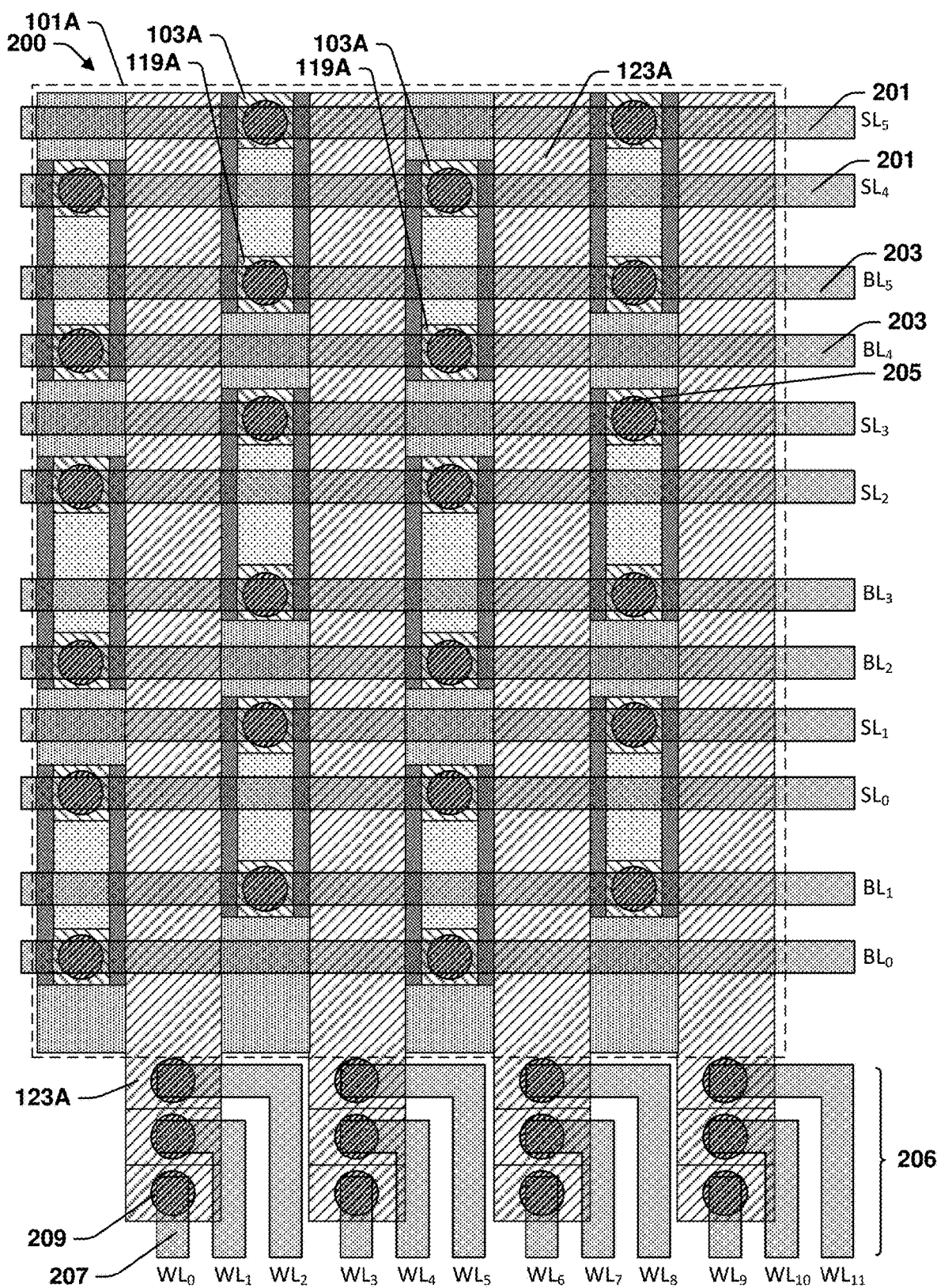
FIG. 2 is a top view illustrating how the 3D memory array of FIG. 1A may be coupled in an integrated circuit.
Figure 3:
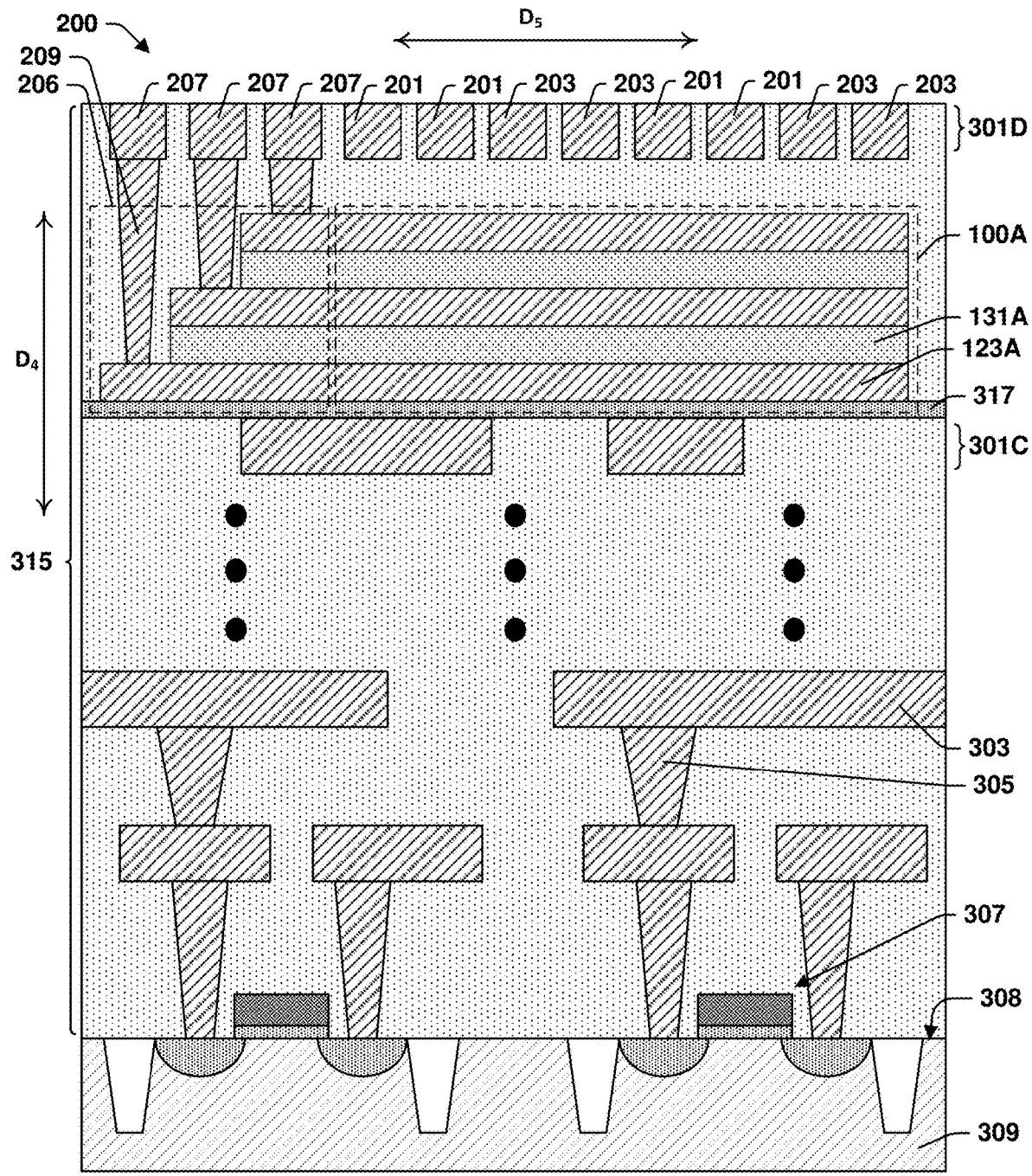
FIG. 3 illustrates a cross-section of an integrated circuit that include the 3D memory array of FIG. 1A.

FIG. 2 illustrates a top view of the first 3D memory array 100A in an integrated circuit 200. FIG. 3 illustrates a partial cross-sectional view of the integrated circuit 200. As shown in these figures, the gate strips 123A may extend beyond one end of the first 3D memory array 100A to progressively varying lengths forming a staircase pattern 206 that allows each of the gate strips 123A to be coupled to a distinct word line wire 207 in an overlying metal interconnect layer 301D through vias 209. Source line wires 201 and bit line wires 203 may also be formed in the metal interconnect layer 301D. The source line wires 201 and the bit line wires 203 may extend crosswise with respect to the gate strips 123A and the stacks 135A. Each of the source line wires 201 may be coupled to a plurality of source lines 103A through vias 205. Each of the bit line wires 203 may be coupled to a plurality of drain lines 119A.

Figure 4:
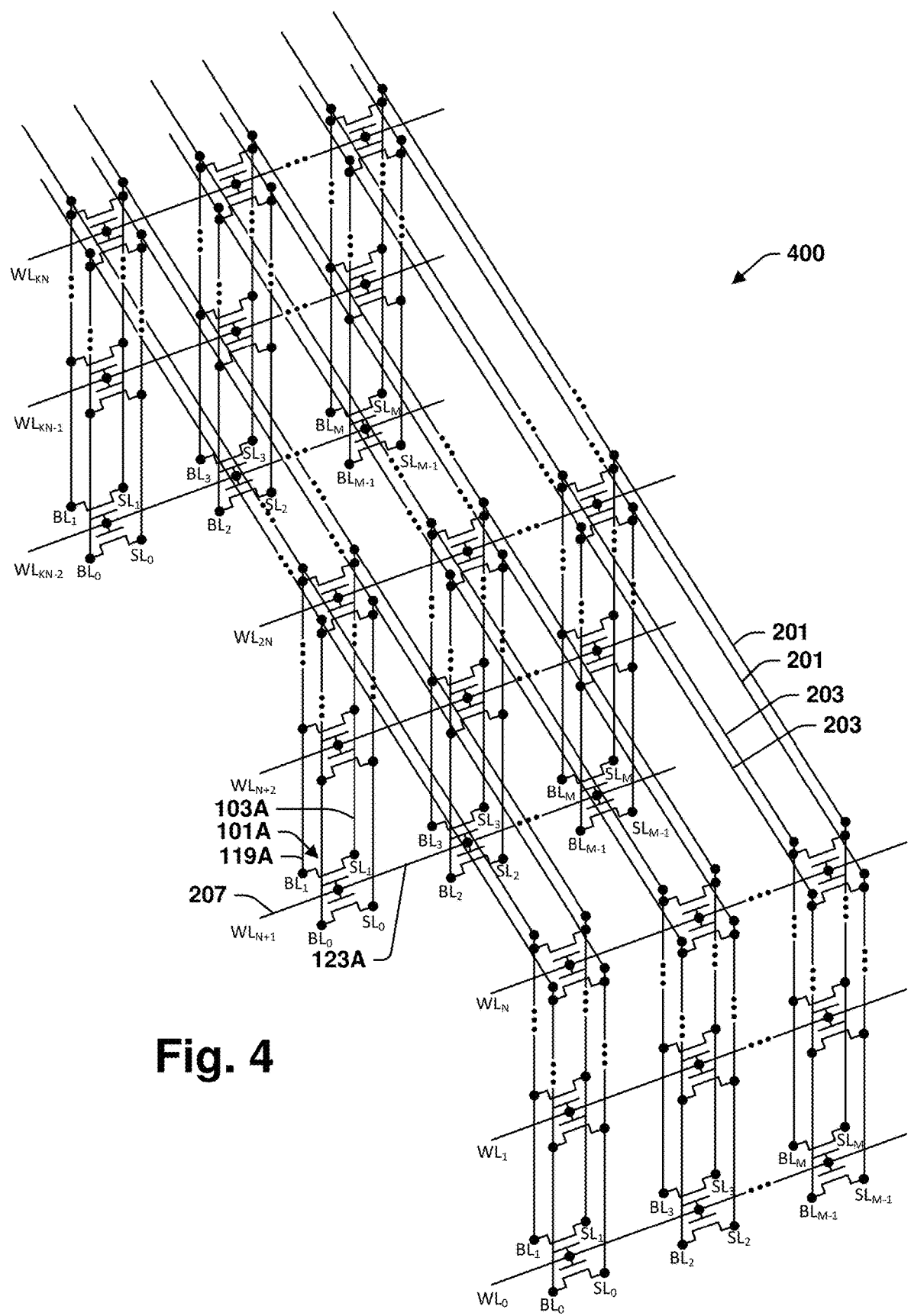
FIG. 4 provides an equivalent circuit diagram for the 3D memory array of FIG. 1A.

FIG. 4 provides an equivalent circuit diagram 400 for the first 3D memory array 100A. As illustrated by the equivalent circuit diagram 400, each of the memory cells 101A operates as a transistor. There are M memory cells arranged along each of the gate strips 123A. There are K stacks 135A each having N tiers 141A-141D giving a total of K*N gate strips 123A. Each of the memory cells 101A may be individually addressed by selecting a corresponding word line wire 207, bit line wire 203, and source line wire 201. The numbers of gate strips 123A connected to each word line wire 207, the number of source lines 103A connected to each source line wire 201, and the number of drain lines 119A connected to each bit line wire 203 may be varied while preserving this feature.

Transistors have a threshold gate voltage at which a source to drain connection switches from open to closed. In a memory cell, that threshold may be varied through write and erase operations to provide two or more distinct threshold voltages. For example, the data storage structure 108A may include a data storage film 111A that retains a polarization of electrical dipoles. An orientation of these dipoles may be varied to modulate a threshold voltage on the control gate 109A at which an electric field renders the channel 113A conductive. A first orientation of those electrical dipoles provides a first threshold voltage that may represent a logical "1" and a second orientation provides a second threshold voltage that may represent a logical "0".

In the first 3D memory array 100A, a write operation for one of the memory cells 101A may include setting a corresponding word line wire 207 to a programming voltage $V_{th}$ while a corresponding bit line wire 203 and a corresponding source line wire 201 are coupled to ground. The bit line wires 203 and the source line wires 201 of non-selected cells may be left floating or set to a voltage such as ½ $V_{dd}$. $V_{th}$ may be the highest possible threshold voltage for the memory cells 101A. For an erase operation, the corresponding word line wire 207 may be set to $-V_{th}$ while grounding the corresponding bit line wire 203 and the corresponding source line wire 201 and holding the other bit line wires 203 and source line wires 201 at $-½ V_{dd}$. A read operation may include setting the word line wire 207 to a voltage intermediate between the first threshold voltage and the second threshold voltage, for example ½ $V_{th}$, setting the source line wire 201 to $V_{dd}$, setting the bit line wire 203 to ground, and determining whether a resulting current is above or below a threshold.

FIGS. 2-4 show one way in which the memory cells 101A in the first 3D memory array 100A may be coupled within an integrated circuit 200 to enable read, write, and erase operations. Any other suitable coupling may be used including alternate couplings that cause variations in the numbers of source lines 103A, drain lines 119A, and gate strips 123A that are connected to each source line wire 201, bit line wire 203, and word line wire 207 respectively. FIGS. 2-3 show all the connections being made through vias 209 and vias 205 that connect to source line wires 201, bit line wires 203, and word line wires 207 disposed in the metal interconnect layer 301D above the first 3D memory array 100A, but some or all of these connections may be made to wires in a metal interconnect layer 301C below the first 3D memory array 100A. Using both the metal interconnect layer 301C and the metal interconnect layer 301D to make these connections may enable reductions in parasitic resistances and capacitances.

As shown in FIG. 3, the first 3D memory array 100A may be disposed between the metal interconnect layer 301C and the metal interconnect layer 301D within a metal interconnect structure 315 over a substrate 309. The metal interconnect layer 301C and the metal interconnect layer 301D may be the $3^{rd}$ and $4^{th}$ metal interconnect layers, the $4^{th}$ and $5^{th}$ metal interconnect layers, or any other adjacent pair of metal interconnect layers in the metal interconnect structure 315. The substrate 309 may be a semiconductor substrate and may support field effect transistors (FETs) 307 and other devices used to operate the first 3D memory array 100A. These devices may be connected to the first 3D memory array 100A through wires 303 and vias 305 within the metal interconnect structure 315.

The substrate 309 may be a die cut from a wafer, such as a silicon wafer or the like. The substrate 309 may be a semiconductor substrate, such as a bulk semiconductor, a semiconductor-on-insulator (SOI) substrate, or the like. Other substrates, such as a multilayered or gradient substrate may also be used. In some embodiments, the semiconductor material of the substrate 309 is or includes silicon, germanium, silicon carbide, gallium arsenide, gallium phosphide, indium phosphide, indium arsenide, and/or indium antimonide, silicon germanium, gallium arsenide phosphide, aluminum indium arsenide, aluminum gallium arsenide, gallium indium arsenide, gallium indium phosphide, gallium indium arsenide phosphide, combinations thereof, or the like. The substrate 309 may be or include a dielectric material. For example, the substrate 309 may be a dielectric substrate or may include a dielectric layer on a semiconductor substrate. The dielectric material may be an oxide such as silicon oxide, a nitride such as silicon nitride, a carbide such as silicon carbide, combinations thereof such as silicon oxynitride, silicon oxycarbide, silicon carbonitride, the like, or any other suitable dielectric.

With reference to FIG. 3, the substrate 309 has a major surface 308. A direction $D_4$ is perpendicular to the major surface 308. The direction $D_4$ is the one referred to herein as the vertical direction and is also a stacking direction for the stacks 135A. A direction $D_5$ is perpendicular to the direction $D_4$, is parallel to the major surface 308, is a direction along which the gate strips 123A extend, and is referred to herein as a horizontal direction.

The memory cells 101A may be any type of memory cell that has the structure of a transistor. In some embodiments, the memory cells 101A are ferroelectric memory cells and the data storage film 111A is or comprises a ferroelectric material that contains electrical dipoles and retains polarization of those dipoles. Examples of ferroelectric materials that may be suitable include hafnium zirconium oxide (HfZrO), hafnium aluminum oxide (HfAlO), hafnium lanthanum oxide (HfLaO), hafnium cerium oxide (HfCeO), hafnium oxide (HfO), hafnium silicon oxide (HfSiO), hafnium gadolinium oxide (HFGdO), or the like. In some embodiments, the ferroelectric material is a doped hafnium oxide. In some embodiments, the doped hafnium oxide is in the orthorhombic phase. In some embodiments, the dopant is present in an atomic percentage of 50% or less.

In some embodiments, a thickness of the data storage film 111A is in a range from about 5 nanometers to about 20 nanometers. In some embodiments, the thickness is from about 5 to about 10 nanometers. In some embodiments, the thickness is from about 10 to about 20 nanometers. If the data storage film 111A is a ferroelectric material and the thickness is too small (e.g., less than about 5 nanometer), polarization may not be well retained and reliability may be low. If the thickness is too large (e.g., greater than about 20 nanometers), program and erase voltages may be large and adversely affect power efficiency.

If the memory cells 101A are ferroelectric memory cells, the data storage structure 108A of each of the memory cells 101A includes a portion of the data storage film 111A. The data storage structure 108A may further include a gate dielectric layer (not shown) between the data storage film 111A and the channel 113A. The gate dielectric layer may be deposited as a separate layer or may be allowed to form spontaneously by a reaction such as a reaction between the data storage film 111A and the channel layer 107A. The gate dielectric layer may be of any suitable material. For example, the gate dielectric layer may be or include silicon oxide (e.g., $SiO_2$), aluminum oxide (e.g., $Al_2O_3$), silicon oxynitride (e.g., SiON), silicon nitride (e.g., $Si_3N_4$), lanthanum oxide (e.g., $La_2O_3$), strontium titanium oxide (e.g., $SrTiO_3$), undoped hafnium oxide (e.g., $HfO_2$), a combination thereof, or the like. In some embodiments, the gate dielectric layer is or includes a high k dielectric, which is a material having a dielectric constant greater than about 3.9.

In various embodiments, the gate dielectric layer has a dielectric constant of about 3.9-15, about 3.9-10, or about 10-15.

In some embodiments, a thickness of the gate dielectric layer is less than about 2.5 nanometers. In some embodiments, the thickness is about 1.5-2.5 nanometers. In some embodiments, the thickness is about 1.5-1.8 nanometers. In some embodiments, the thickness is about 1.7-2.5 nanometers. If the thickness is too small (e.g., about 1 nanometer or less), data retention may be low. If the thickness is too great (e.g., greater than about 2.5 nanometers), the program and erase voltages may be too large or the memory window (i.e., a difference between the high and low threshold voltages) may be too small. High program and erase voltages reduce power efficiency and a small memory window reduces reliability.

The channel layer 107A may be or include a semiconductor. In some embodiments, the channel layer 107A is or includes an oxide semiconductor. An oxide semiconductor may react with a ferroelectric material to spontaneously form the gate dielectric layer. Oxide semiconductors that may be suitable for the channel layer 107A include, without limitation, zinc oxide (ZnO), indium tungsten oxide (InWO), indium gallium zinc oxide (InGaZnO), indium zinc oxide (InZnO), indium gallium zinc tin oxide (InGaZnSnO or IGZTO), indium tin oxide (InSnO or ITO), combinations thereof, or the like. In some embodiments, the channel layer 107A is or includes polysilicon, amorphous silicon, or the like. In some embodiments, the channel layer has a thickness from about 2 nm to about 30 nm. In some embodiments, the channel layer has a thickness from about 2 nm to about 10 nm. In some embodiments, the channel layer has a thickness from about 5 nm to about 20 nm.

In some embodiments, the memory cells 101A are floating gate memory cells and the data storage structure 108A is a charge storage structure. In these embodiments, programming involves storing or removing a charge from a data storage film 111A between two dielectric layers. Each of the two dielectric layers may be an oxide such as silicon oxide, a nitride such as silicon nitride, a carbide such as silicon carbide, combinations thereof such as silicon oxynitride, silicon oxycarbide, silicon carbonitride, or the like. The data storage film 111A may also be a dielectric of one of these types or some other type. For example, the data storage structure 108A may be an ONO structure in which a the data storage structure 108A is a nitride layer and is sandwiched between two oxide layers.

The gate strips 123A are conductive structures formed by one or more layers of conductive materials. Suitable conductive materials for the gate strips 123A may include doped polysilicon, conductive carbon-based materials such as graphene and microcrystalline graphite, and metals. In some embodiments, the conductive material includes a metal. Forming the gate strips 123A of metal may provide a compact design with low parasitic resistance. Some examples of metals that may be used are tungsten (W), copper (Cu), ruthenium (Ru), molybdenum (Mo), cobalt (Co), aluminum (Al), nickel (Ni), silver (Ag), gold (Au) the like, and alloys thereof. In some embodiments, the gate strips 123A further include a diffusion barrier layer, a glue layer, or other such layer bordering abutting dielectric strips 131A. Some examples of materials that may be used for a diffusion barrier layer or a glue layer are titanium nitride (TiN), tantalum nitride (TaN), molybdenum nitride (MoN), zirconium nitride (ZrN), hafnium nitride (HfN), and the like. In some embodiments, a portion of the diffusion barrier or glue layer extends vertically through a central area of the gate strip 123A. This vertical portion may indicate the gate strip was formed using a replacement gate process that is described more fully below. The vertical portion may have approximately twice a thickness of a portion of the diffusion barrier or glue layer that abuts the dielectric strip 131A. In some embodiments, the conductive material is carbon-based. Forming the gate strips 123A of a carbon-based material may facilitate patterning the stacks 135A.

The source lines 103A and the drain lines 119A may also be formed of any suitable conductive material. The examples given for the gate strips 123A are also applicable to the source lines 103A and the drain lines 119A. As with the gate strips 123A, the source lines 103A and the drain lines 119A may also include a glue layer or a diffusion barrier layer.

An intracell dielectric 115A provides fill and insulation between pairs of source lines 103A and drain lines 119A corresponding to individual memory cells 101A. The intercell dielectric plugs 121A provide fill and insulation between pairs of source lines 103A and drain lines 119A corresponding to horizontally adjacent memory cells 101A. The intracell dielectric 115A, the intercell dielectric plugs 121A, and the dielectric strips 131A may each be any suitable dielectric. Suitable dielectrics for these structures may be, for example, oxides such as silicon oxide, nitrides such as silicon nitride, carbides such as silicon carbide, combinations thereof such as silicon oxynitride, silicon oxycarbide, silicon carbonitride, or the like. Distinct dielectrics may be selected for the intracell dielectric 115A and the intercell dielectric plugs 121A in order to provide etch selectivity and facilitate manufacturing.

In some embodiments, a height $H_1$ of the dielectric strips 131A and a height $H_2$ of the gate strips 123A are each in a range from about 15 nm to about 90 nm. In some embodiments, the height $H_1$ is in a range from about 15 nm to about 45 nm. In some embodiments, the height $H_1$ is in a range from about 45 nm to about 90 nm. In some embodiments, the height $H_2$ is in the range from about 15 nm to about 30 nm. In some embodiments, the height $H_2$ is in the range from about 30 nm to about 60 nm. In some embodiments, the height $H_1$ is greater than the height $H_2$. In some embodiments, the height $H_2$ is greater than the height $H_1$. In some embodiments, the height $H_1$ is within a factor of three of the height $H_2$. In some embodiments, the height $H_1$ is within a factor of two of the height $H_2$. The width $W_2$ of the dielectric strips 131A is also a width of the stacks 135A. In some embodiments, the width $W_2$ is in a range from about 10 nm to about 200 nm. In some embodiments, the width $W_2$ is in a range from about 20 nm to about 120 nm.

The source lines 103A and the drain lines 119A may be of similar sizes to one another. In some embodiments, a width $W_1$ and a length $L_2$ of the source lines 103A and the drain lines 119A is in a range from about 20 nm to about 100 nm. In some embodiments, the width $W_1$ and the length $L_2$ are each in a range from about 30 nm to about 80 nm. In some embodiments, areas of the source lines 103A and the drain lines 119A in a horizontal plane are in a range from 500 nm$^2$ to about 10,000 nm$^2$. In some embodiments, the areas are in a range from 900 nm$^2$ to about 6,000 nm$^2$.

In some embodiments, a width $D_2$ between adjacent stacks 135A is approximately the width $W_1$ of the source lines 103A and the drain lines 119A plus twice a thickness of the channel layer 107A and twice a thickness of the data storage structures 108A. In some embodiments the width $D_2$ is from about 40 nm to about 250 nm. In some embodiments the width $D_2$ is from about 60 nm to about 140 nm.

In some embodiments, a length $L_1$ of the channels 113A is in a range from about 30 nm to about 200 nm. In some embodiments, the length $L_1$ is in a range from about 60 nm to about 150 nm. In some embodiments, a spacing $S_1$ between adjacent memory cells 101A within a tier 141A-D is in a range from about 30 nm to about 200 nm. In some embodiments, the spacing $S_1$ is in a range from about 30 nm to about 100 nm. In some embodiments, the spacing $S_1$ is in a range from about 60 nm to about 200 nm.

FIGS. 5A and 5B illustrate cross-sections of a second 3D memory array 100B. The second 3D memory array 100B has memory cells 101B and is generally similar to the first 3D memory array 100A and has corresponding features except that the 3D memory array 100B has oval cell areas 122B. Each cell area 122B is bounded on two opposite sides by stacks 135B and on two opposite ends by intercell dielectric plugs 121B. The ends of the cell areas 122B that abut the intercell dielectric plugs 121B have elliptical shapes. The intercell dielectric plugs 121B have correspondingly shaped concave ends. A data storage structure 108B and a channel layer 107B are formed conformally on the perimeter of the cell area 122B. The data storage structure 108B includes at least a data storage film 111B.

A source line 103B and a drain line 119B are disposed at opposite ends of the cell area 122B just inside the channel layer 107B. Each of the source line 103B and the drain line 119B has a first side 118B that abuts the channel layer 107B and a second side 116B that abuts the intracell dielectric 115B. The first side 118B traces an arc on a first ellipse and the second side 116B traces an arc of a second ellipse. The shape of the first side 118B is determined by a shape of the channel layer 107B which in turn is determined by a shape of a concave end of an intercell dielectric plug 121B. In some embodiments, the channel 113B is provided by a portion of the channel layer 107B that is flat. In some embodiments, all or part of the source area 105B and the drain area 117B is provided by a portion of the channel layer 107B that is curved.

The oval shape of the cell area 122B allows the source lines 103B and the drain lines 119B to be formed with nearly circular openings while assuring good contact with the channel layer 107B. Making the openings nearly circular facilitates making the bulges 106B large while also keeping the channel length $L_1$ large. The second side 116B in a horizontal cross-section like the one shown in FIG. 1C traces an arc on an ellipse and opening size is related to the length of a minor axis of that ellipse. In some embodiments, the minor axis is between 75% and 200% a distance $D_6$ between the channels 113B on opposite sides of the intracell dielectric 115B. In some embodiments, the minor axis is between 110% and 150% the distance $D_6$. Other examples of 3D memory cells provided herein may use the oval cell areas and/or the near circular source/drain line shapes described in this example.

Figure 6B:
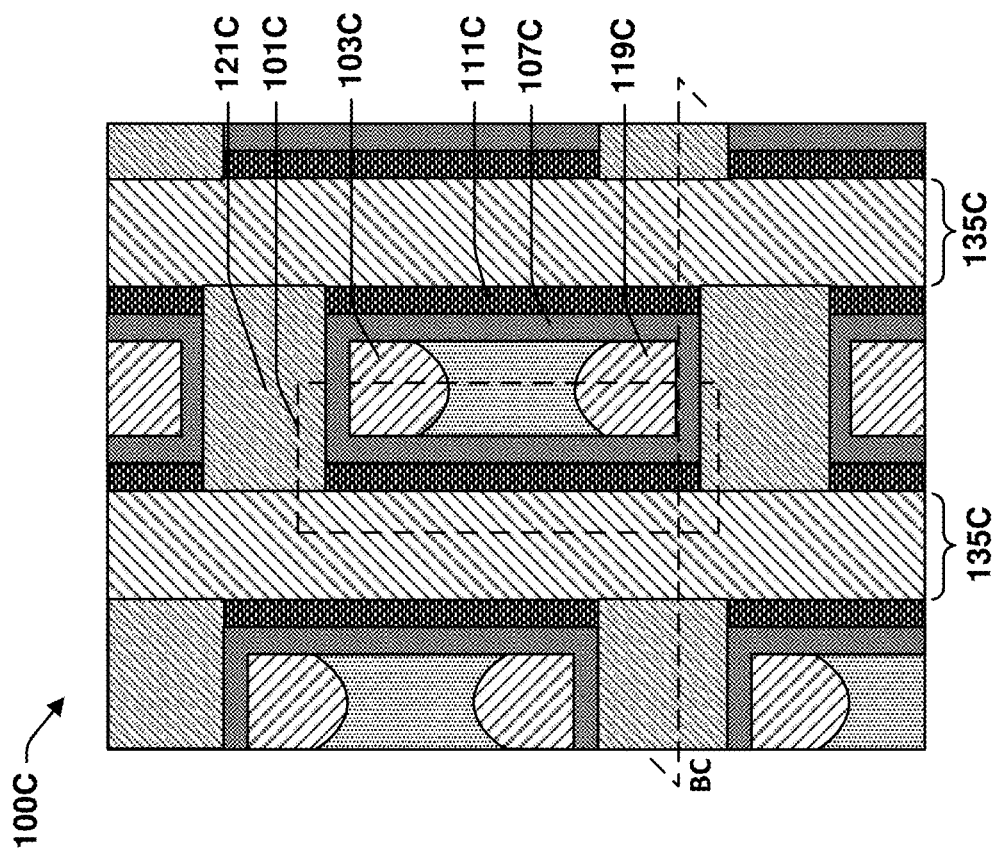
FIGS. 6A-6B illustrate vertical and horizontal cross-sections of a third 3D memory array, which is a 3D memory array according to some other aspects of the present teachings.
Figure 6A:
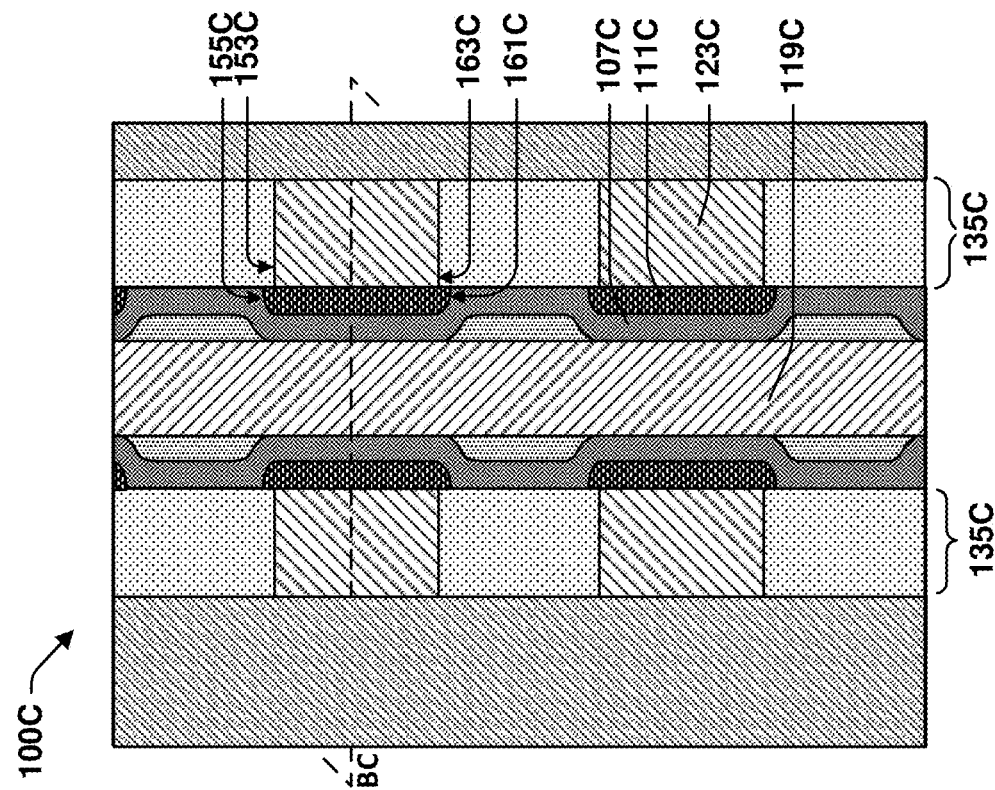

FIGS. 6A and 6B illustrate cross-sections of a third 3D memory array 100C. The third 3D memory array 100C has memory cells 101C and is generally similar to the first 3D memory array 100A except that the data storage films 111C are only formed on sides of the gate strips 123C. The data storage films 111C may have a mushroom shape that results from the data storage films 111C having been formed by a selective growth process. Whereas in the first 3D memory array 100A the data storage films 111A extend between the source lines 103A/the drain lines 119A and the intercell dielectric plugs 121A, the data storage films 111C do not.

This allows the source lines 103C and the drain lines 119C to be larger than the source lines 103A and the drain lines 119A.

Because the data storage film 111C has been grown from the gate strip 123C, an upper edge 155C of the data storage film 111C is above an upper edge 153C of the gate strip 123C by an amount less than or approximately equal to a thickness of the data storage film 111C. Likewise, a lower edge 161C of the data storage film 111C is below a lower edge 163C of the gate strip 123C by an amount less than or approximately equal to a thickness of the data storage film 111C.

FIGS. 7A and 7B illustrate cross-sections of a fourth 3D memory array 100D. The fourth 3D memory array 100D has memory cells 101D and is generally similar to the third 3D memory array 100C except that the channel layers 107D are formed only on the data storage films 111D. Whereas in the third 3D memory array 100C the channel layers 107C are disposed between the source lines 103C/the drain lines 119C and the intercell dielectric plugs 121C, the channel layers 107D are not. This allows the source lines 103D and the drain lines 119D to be larger than the source lines 103C and the drain lines 119C. The source lines 103D and the drain lines 119D may abut the intercell dielectric plugs 121D.

Figure 8B:
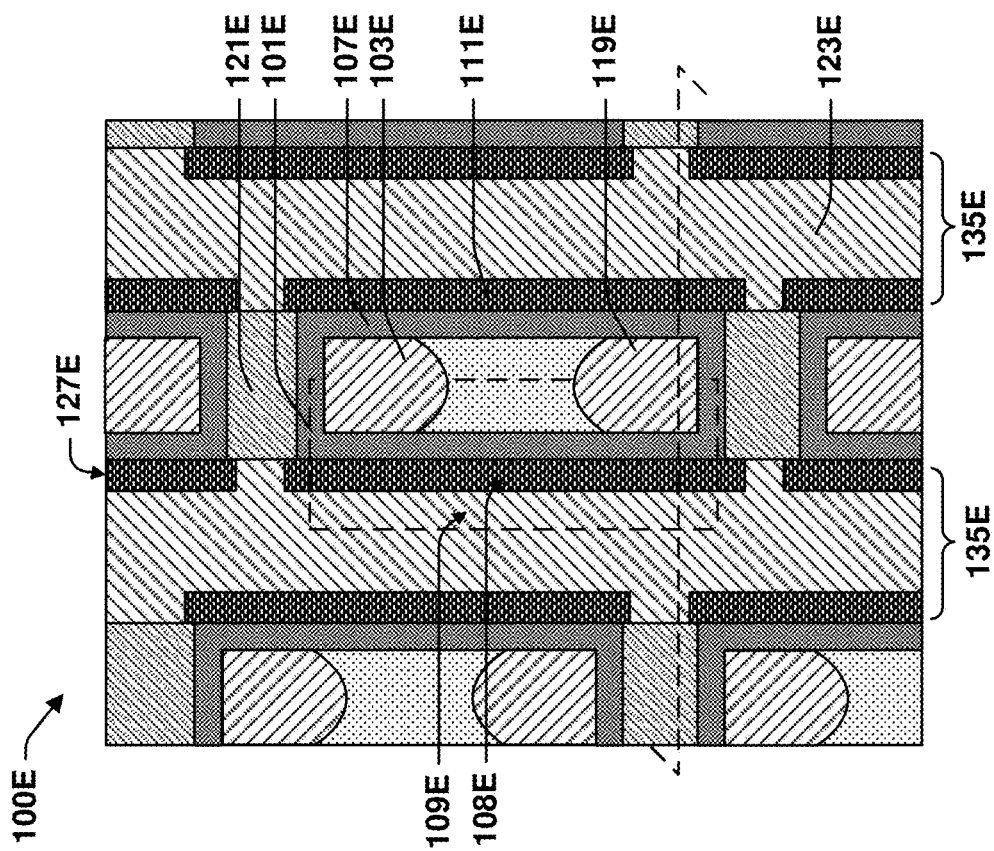
FIGS. 8A-8B illustrate vertical and horizontal cross-sections of a fifth 3D memory array, which is a 3D memory array according to some other aspects of the present teachings.
Figure 8A:
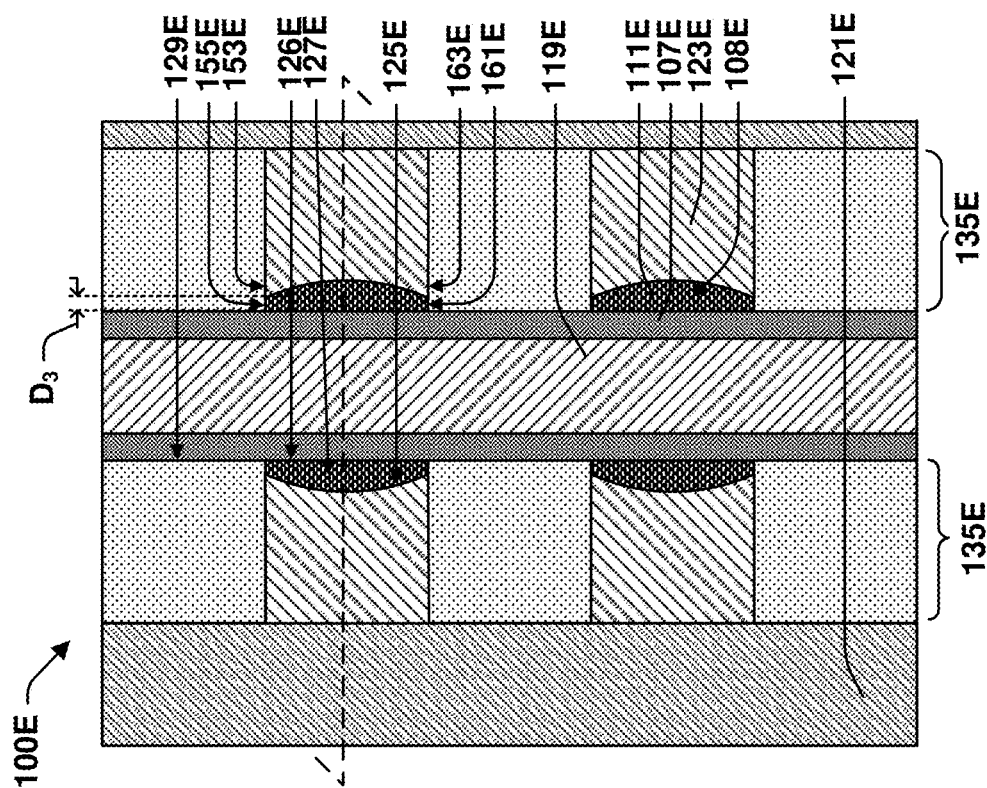
Figure 8C:
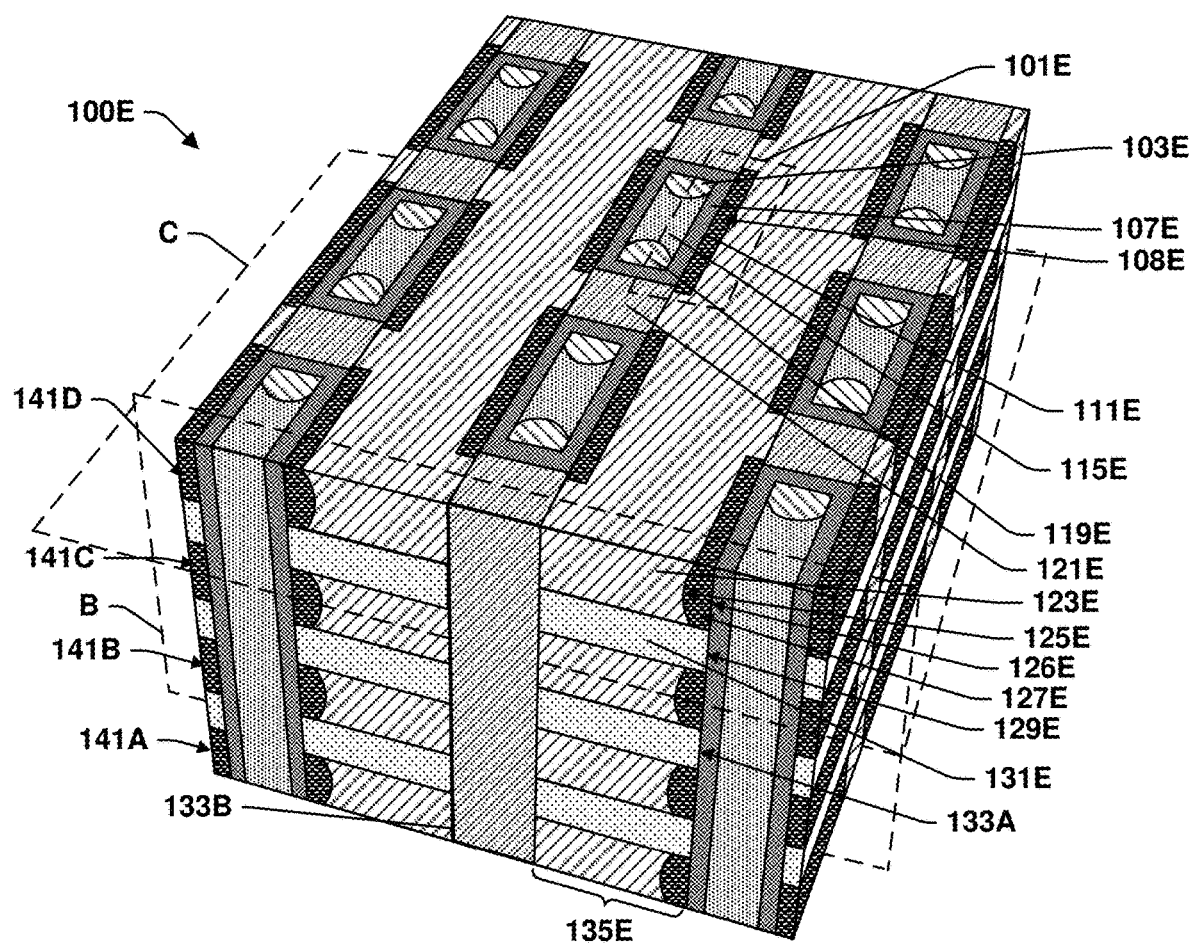
FIG. 8C illustrates a perspective view of the fifth 3D memory array.

FIGS. 8A and 8B illustrate cross-sections of a fifth 3D memory array 100E. FIG. 8C provides a perspective view of the fifth 3D memory array 100E. The fifth 3D memory array 100E has memory cells 101E and is like the third 3D memory array 100C in that only the channel layer 107E separates the source lines 103E/the drain lines 119E from the intercell dielectric plugs 121E. The main difference is that the data storage film 111E are disposed in recesses 127E formed in sides of the stacks 135E adjacent the gate strips 123E. The stacks 135E may be wider than the stacks 135C by a thickness of the data storage film 111E while other dimensions remain the same.

The gate strips 123E have gate sidewalls 125E that are indented relative to the dielectric sidewalls 129E to create the recesses 127E in the stacks 135E. The recesses 127E are regions inward from the dielectric sidewalls 129E in a cross section extending along a vertical direction, which is a stacking direction of the stacks 135E. The gate sidewalls 125E are concave and indented relative to the dielectric sidewalls 129E by a distance $D_3$.

In some embodiments, the data storage films 111E fill the recesses 127E. The data storage films 111E have an upper edge 155E and a lower edge 161E horizontally aligned respectively with an upper edge 153E and a lower edge 163E of a gate strip 123E. Within the tiers 141A-141C, the upper edge 153E and the upper edge 155E abut an overlying dielectric strip 131E. Within the tiers 141B-141D, the lower edge 161E and the lower edge 163E abut an underlying dielectric strip 131E. Sidewalls 126E of the data storage films 111E are vertically aligned with vertically adjacent dielectric sidewalls 129E.

FIGS. 9A and 9B illustrate cross-sections of a sixth 3D memory array 100F. The sixth 3D memory array 100F has memory cells 101F and is similar to the fifth 3D memory array 100E but has a channel layer 107F that is disposed within recesses 127F of stacks 135F. In the sixth 3D memory array 100F, the channel layers 107F are not disposed between the intercell dielectric plugs 121F and either the source lines 103F or the drain lines 119F. In addition to creating more areas for the source lines 103F and the drain lines 119F, restricting the channel layer 107F to the recesses 127F may be useful in preventing the channel layer 107F from being etched while forming openings for the source lines 103F and the drain lines 119F.

To make room for the channel layer 107F to be disposed in the recesses 127F, the dielectric strips 131F are made wider than the dielectric strips 131E and the recesses 127F are made deeper than the recesses 127E. The distance between adjacent stacks 135F may be made smaller to keep the sixth 3D memory array 100F the same size as an equivalent first 3D memory array 100A. The sidewalls 126F of the data storage films 111F are set back from the dielectric sidewalls 129F by the distance $D_7$, which is a thickness of the channel layer 107F. The gate sidewalls 125F are set back from the dielectric sidewalls 129F by a distance $D_6$. $D_6$ is greater than the distance $D_7$ by a thickness of the data storage structure 108F.

The data storage structures 108F include the data storage films 111F and may include additional layers as well, such as dielectric layers. The data storage structures 108F together with the channel layers 107F fill the recesses 127F. In some embodiments, the channel layers 107F are entirely contained within the recesses 127F. In some other embodiments, an additional channel layer is disposed outside the recesses 127F in the configuration of the channel layer 107E of FIG. 8B. The channel layer 107F has an upper edge 156F horizontally aligned with an upper edge 155F of the data storage film 111F and with an upper edge 153F of the gate strip 123F. The channel layer 107F has a lower edge 160F horizontally aligned with a lower edge 161F of the data storage film 111F and with a lower edge 163F of the gate strip 123F. Within the tiers 141A-141C, the upper edge 153F, the upper edge 155F, and the upper edge 156F each abut an overlying dielectric strip 131F. Within the tiers 141A-141D, the lower edge 160F, the lower edge 161F, and the lower edge 163E each abut an underlying dielectric strip 131F. The channel layer 107F has a sidewall 164F that is vertically aligned with dielectric sidewalls 129F of adjacent dielectric strips 131F and sidewalls 165F. The channel layer 107F has an additional sidewall that is convex and faces an adjacent gate strip 123F.

Figure 10B:
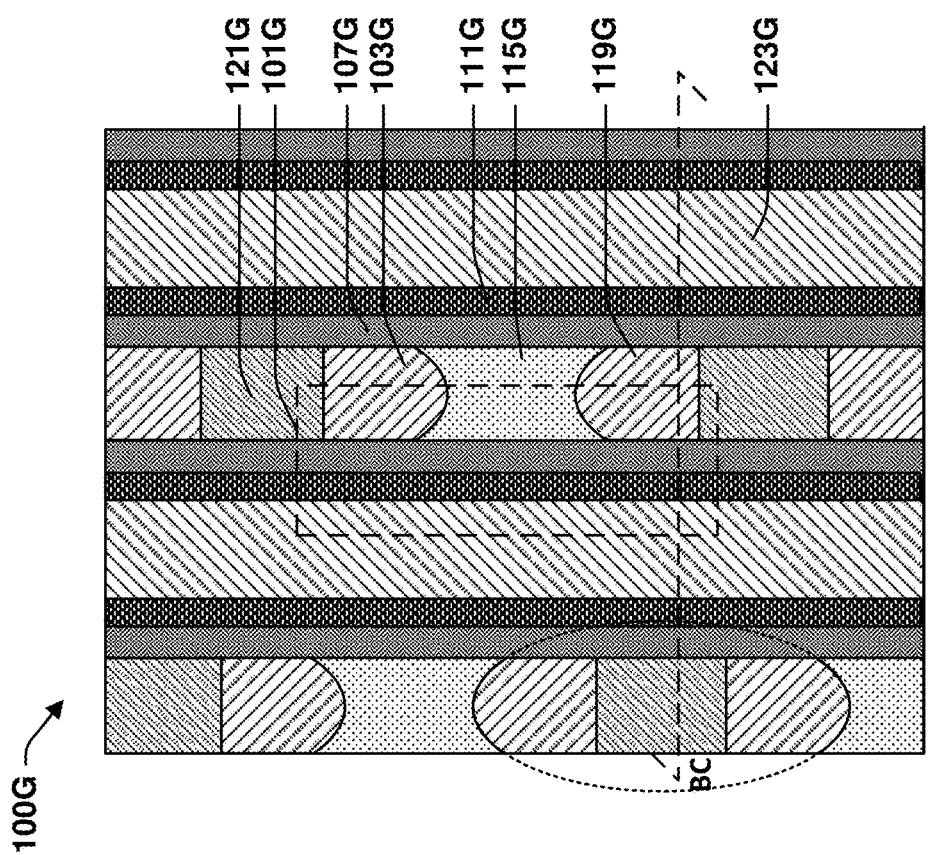
FIGS. 10A-10B illustrate vertical and horizontal cross-sections of a seventh 3D memory array, which is a 3D memory array according to some other aspects of the present teachings.
Figure 10A:
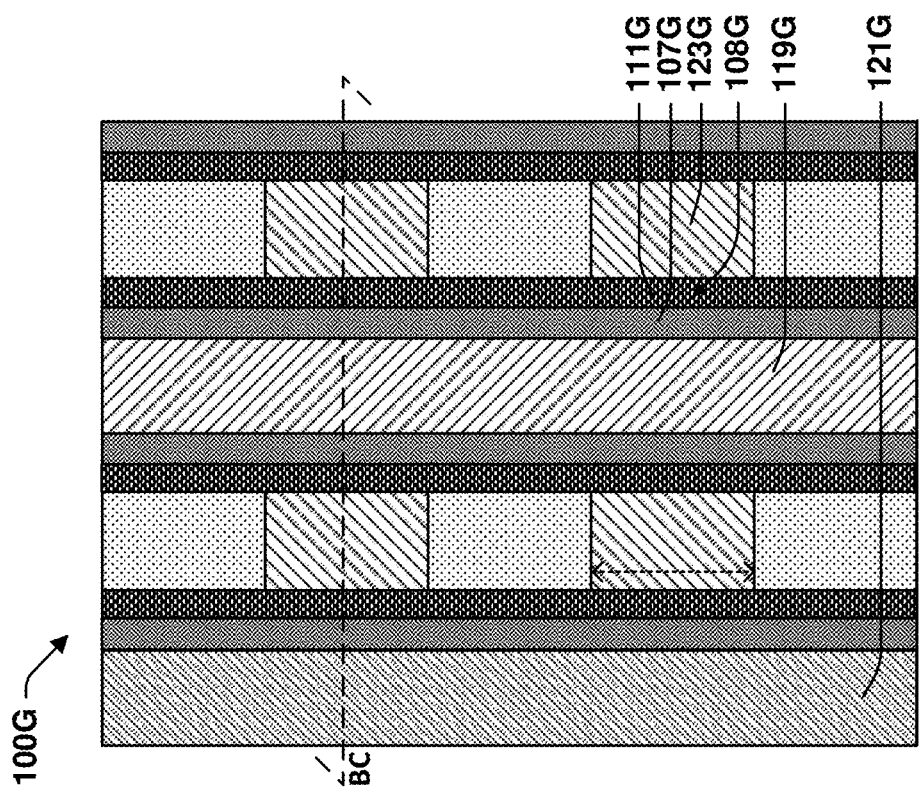
Figure 10C:
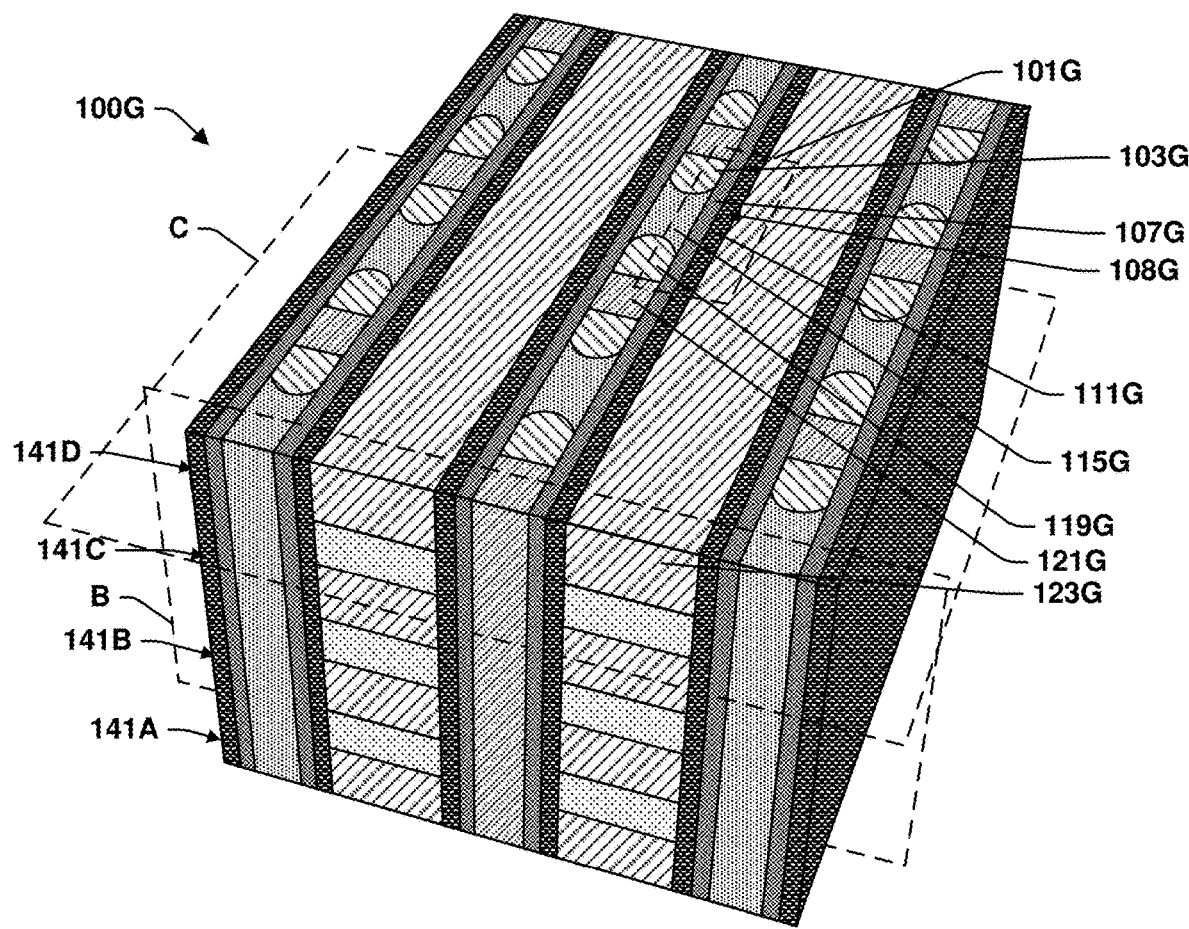
FIG. 10C illustrates a perspective view of seventh 3D memory array.

FIGS. 10A and 10B illustrate cross-sections of a seventh 3D memory array 100G. FIG. 10C provides a perspective view of the seventh 3D memory array 100G. The seventh 3D memory array 100G has memory cells 101G and is generally similar to the first 3D memory array 100A and has corresponding features except that the 3D memory array 100G has data storage structures 108G, which include data storage films 111G, and channel layers 107G that are formed prior to intercell dielectric plugs 121G. As a result of this order of formation, the data storage structure 108G and the channel layer 107G are disposed between the intercell dielectric plugs 121G and adjacent gate strips 123G but not between the intercell dielectric plugs 121G and either the source lines 103G or the drain lines 119G. As a consequence, the source lines 103G and the drain lines 119G may be larger than the source lines 103A and the drain lines 119A.

Figure 11B:
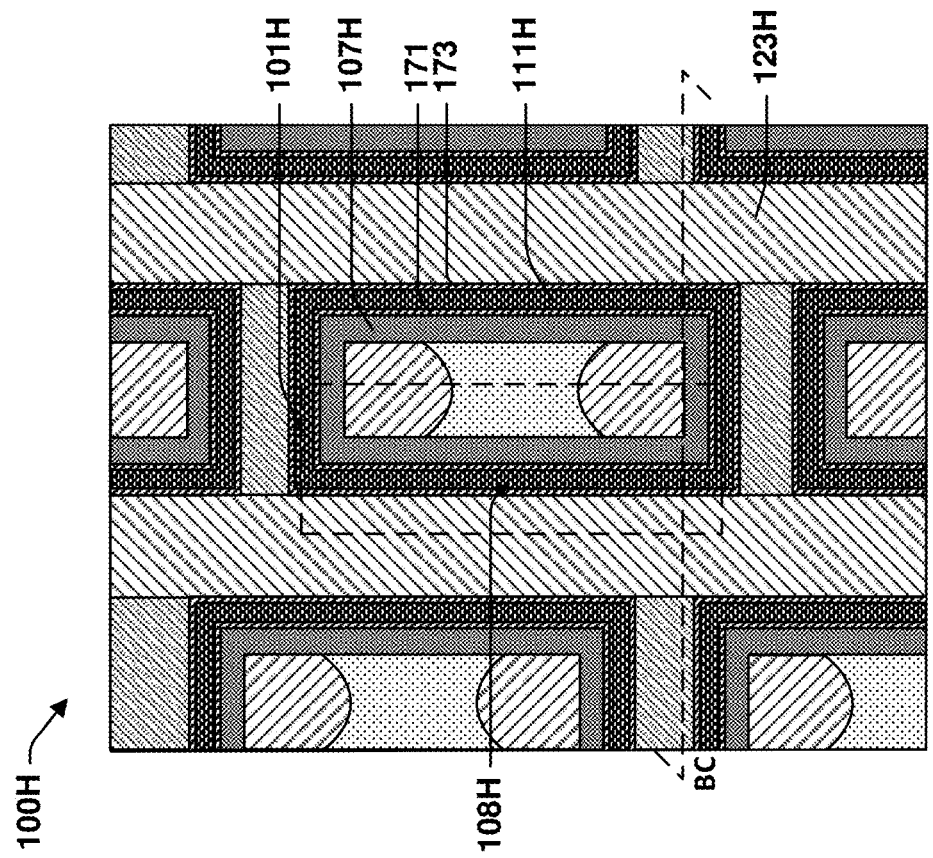
FIGS. 11A-11B illustrate vertical and horizontal cross-sections of an eighth 3D memory array, which is a 3D memory array according to some other aspects of the present teachings.
Figure 11A:
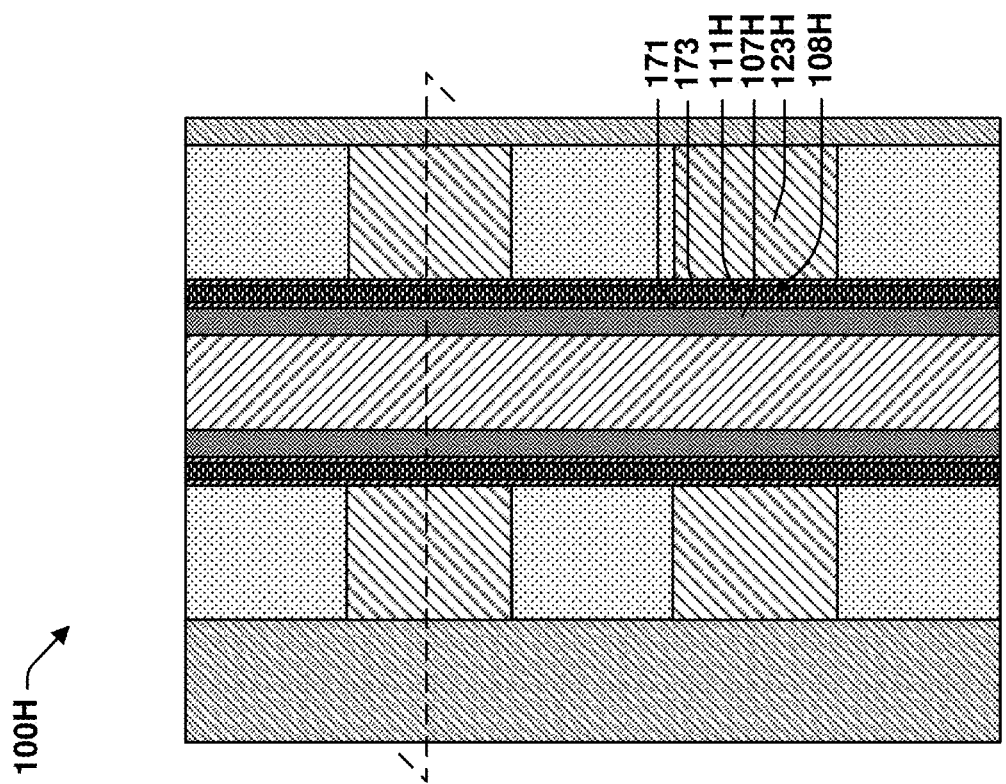

FIGS. 11A and 11B illustrate cross-sections of an eighth 3D memory array 100H according to some other aspects of the present teachings. The eighth 3D memory array 100H has memory cells 101H and has features corresponding to the first 3D memory array 100A. The eighth 3D memory array 100H has a dielectric layer 173 disposed between the data storage film 111H and the gate strip 123H and another dielectric layer 171 disposed between the data storage film 111H and the channel layer 107H. The data storage structure 108H includes the dielectric layer 173, the data storage film 111H, and the dielectric layer 171, and may be, for example, an ONO data storage structure.

FIGS. 12A and 12B through FIGS. 18A and 18B are a series of paired top view illustrations and cross-sectional view illustrations exemplifying a method according to the present teachings of forming a device comprising a 3D memory array with features of the first 3D memory array 100A. While FIGS. 12A and 12B through FIGS. 18A and 18B are described with reference to various embodiments of a method, it will be appreciated that the structures shown in FIGS. 12A and 12B through FIGS. 18A and 18B are not limited to the method but rather may stand alone separate from the method. While FIGS. 12A and 12B through FIGS. 18A and 18B are described as a series of acts, it will be appreciated that the order of the acts may be altered in other embodiments. While FIGS. 12A and 12B through FIGS. 18A and 18B illustrate and describe a specific set of acts, some acts that are illustrated and/or described may be omitted in other embodiments. Further, acts that are not illustrated and/or described may be included in other embodiments. While the method of FIGS. 12A and 12B through FIGS. 18A and 18B is described in terms of forming the first 3D memory array 100A, the method may be used to form other memory arrays.

Figure 12A:
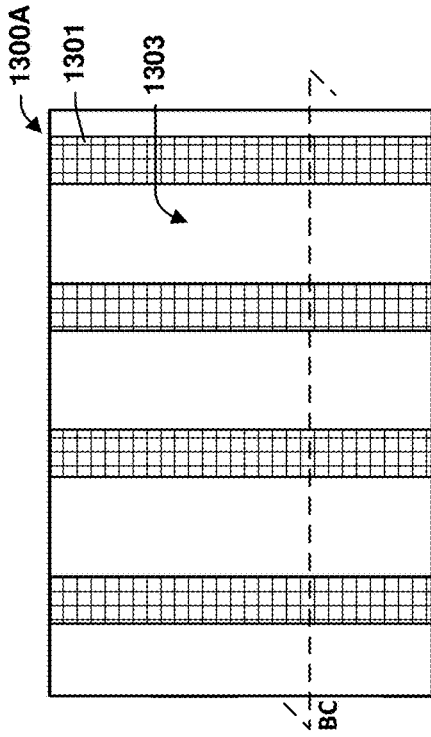
Figure 12B:
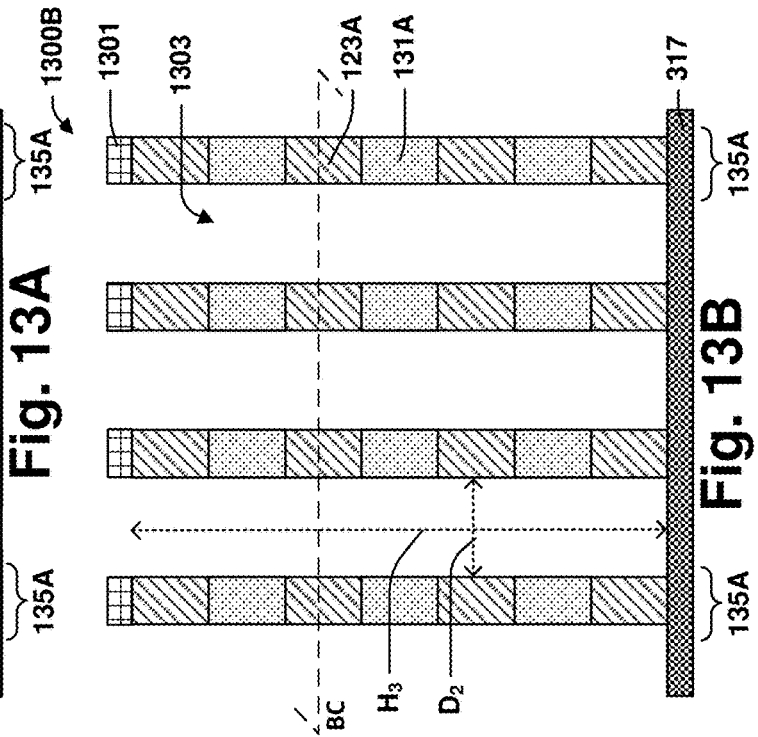

As shown by the top view 1200A of FIG. 12A and the cross-sectional view 1200B of FIG. 12B, the method begins with forming a broad stack 1205 of alternating gate layers 1201 and dielectric layers 1203 over a dielectric layer 317. The dielectric layer 317 may be one or more layers formed over the metal interconnect layer 301C as shown in FIG. 3, but more generally could be the top layer of any suitable substrate. In the broad stack 1205, the top and bottom layers are gate layers 1201, but either could be a dielectric layer 1203.

The dielectric layers 1203 and the gate layers 1201 may be formed by any suitable process such as chemical vapor deposition (CVD), atomic layer deposition (ALD), or the like. In some embodiments, the gate layers 1201 are dummy layers that are later replaced by conductive material to provide gate strips. In some embodiments, the gate layers 1201 have the composition of gate strips. In some embodiments, the gate layers 1201 are metallic. In addition to the processes noted above, a metallic layer may be formed by electroplating, electroless plating, or the like.

Figure 13A:
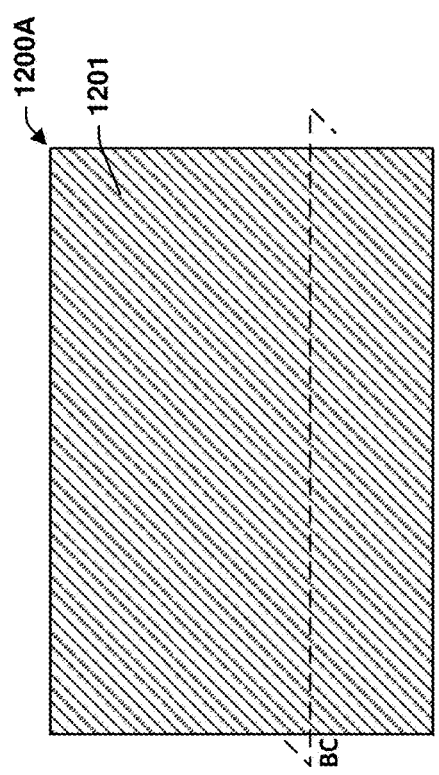
Figure 13B:
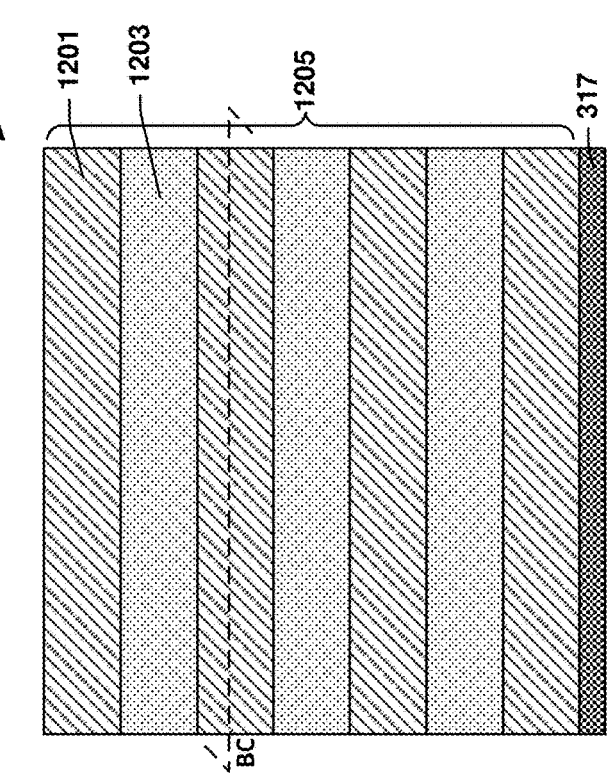
Figure 25A:
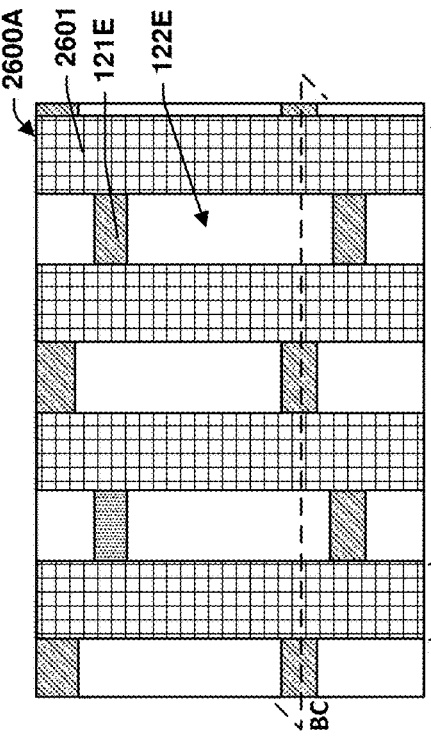
Figure 25B:
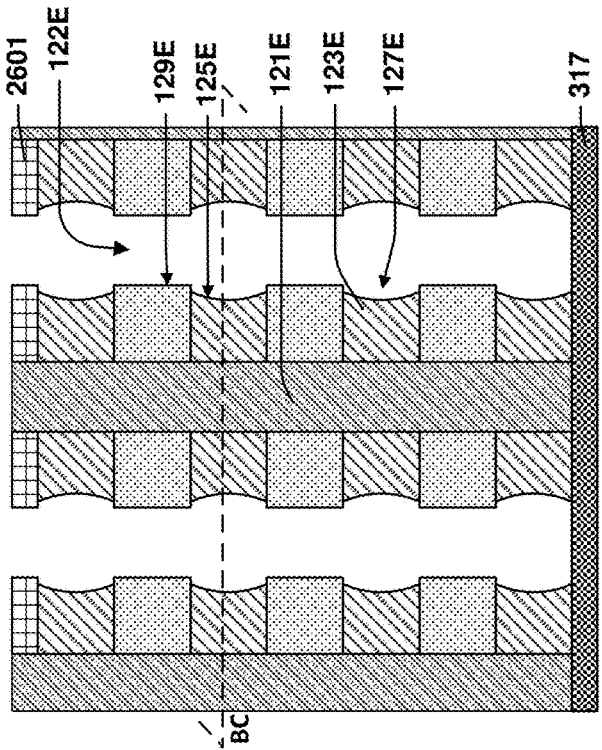

As shown by the top view 1300A of FIG. 13A and the cross-sectional view 1300B of FIG. 13B, a mask 1301 may be formed and used to pattern trenches 1303 that divide the broad stack 1205 into a series of stacks 135A. The mask 1301 may be a hard mask of any suitable material. The mask 1301 may be formed by a CVD process, a spin-on process, the like, or any other suitable process. The mask 1301 may be patterned by etching through a photoresist mask (not shown). The photoresist mask may be pattern by photolithography.

The stacks 135A may include gate strips 123A formed from the gate layers 1201 and dielectric strips 131A formed from the dielectric layers 1203. A ratio of a height $H_3$ to a width $D_2$ is an aspect ratio of the trenches 1303. In some embodiments, the aspect ratio is in a range from about 5 to about 15. Forming trenches 1303 with an aspect ratio of less than about 5 may compromise the cell density of the 3D memory array 100A. Forming trenches 1303 with an aspect ratio greater than about 15 may cause twisting or collapsing of the stacks 135A during processing.

As shown by the top view 1400A of FIG. 14A and the cross-sectional view 1400B of FIG. 14B, the trenches 1303 may be filled by depositing intercell dielectric 1401. The intercell dielectric may be deposited by CVD, the like, or any other suitable process. Excess material may be removed by CMP.

As shown by the top view 1500A of FIG. 15A and the cross-sectional view 1500B of FIG. 15B, a mask 1501 may be formed and used in conjunction with the mask 1301 to etch and define cell areas 122A in the intercell dielectric 1401. The remaining intercell dielectric 1401 forms the intercell dielectric plugs 121A. The cell areas 122A correspond to desired locations for memory cells 101A, one to be formed on each of two facing sides of each of the cell areas 122A.

As shown by the top view 1600A of FIG. 16A and the cross-sectional view 1600B of FIG. 16B, layers of the data storage structure 108A, which include at least the data storage film 111A, and the channel layer 107A may be deposited within the cell areas 122A. These are vertical films that form around the perimeters of the cell areas 122A. As further shown by the top view 1600A of FIG. 16A and the cross-sectional view 1600B of FIG. 16B, remaining portions of the cell areas 122A may be filled with intracell dielectric 115A. These layers may be formed by CVD, ALD, the like, or any other suitable process. Excess material may be removed by planarization process such as CMP.

As shown by the top view 1700A of FIG. 17A and the cross-sectional view 1700B of FIG. 17B, a mask 1701 with openings 1705 may be formed and used to etch openings 1703 in the intracell dielectric 115A. In accordance with some aspects of the present teachings, the openings 1705 may be elliptical. The openings 1705 are approximately centered over intercell dielectric plugs 121A. Each of the openings may have a first end that extends over the intracell dielectric 115A on one side of an intercell dielectric plug 121A and a second end that extends over an opposite side of the intercell dielectric plug 121A. The etch process may be anisotropic and selective to remove the exposed intracell dielectric 115A without substantially etching either the intercell dielectric plugs 121A, the data storage film 111A, or the channel layer 107A. The etch process may be a plasma etch, the like, or any other suitable process.

As shown by the top view 1800A of FIG. 18A and the cross-sectional view 1800B of FIG. 18B, the openings 1703 may be filled with conductive material to form the source lines 103A and the drain lines 119A. Due to the shapes of the openings 1703, the source lines 103A and the drain lines 119A form with bulges 106A. A CMP process may remove excess conductive material, the mask 1301, and the mask 1701. The resulting structure may be substantially the same as the one shown in FIG. 1A-1C.

FIGS. 19A and 19B through FIGS. 22A and 22B are a series of paired top view illustrations and cross-sectional view illustrations showing a variation on the method FIGS. 12A and 12B through FIGS. 18A and 18B. This variation may be used to form a memory array with features of the second 3D memory array 100B of FIGS. 5A-5B. The variation begins with a structure like the one shown by the top view 1400A of FIG. 14A and the cross-sectional view 1400B of FIG. 14B. As shown by the top view 1900A of FIG. 19A and the cross-sectional view 1900B of FIG. 19B, a mask 1901 having elliptical openings 1903 may be formed and used in conjunction with the mask 1301 to etch and define cell areas 122B in the intercell dielectric 1401. The remaining intercell dielectric 1401 forms the intercell dielectric plugs 121B. The cell areas 122B include planar sides formed where the elliptical openings 1903 extended over the stacks 135B and elliptical ends between the stacks 135B.

The intercell dielectric plugs 121B have concave ends with profiles corresponding to the elliptical openings 1903.

As shown by the top view 2000A of FIG. 20A and the cross-sectional view 2000B of FIG. 20B, the layers of the data storage structure 108B, which include at least the data storage film 111B, and the channel layer 107B may then be deposited and the remainder of the cell areas 122A may be filled with intracell dielectric 115B. The data storage film 111B and the channel layer 107B may have shapes determined by the shapes of the perimeters of the cell areas 122B, including convex curved ends that trace elliptical arcs.

As shown by the top view 2100A of FIG. 21A and the cross-sectional view 2100B of FIG. 21B, a mask 2101 may be formed with openings 2105 and used to etch openings 2103 in the intracell dielectric 115B. In contrast to the case shown by the top view 1700A of FIG. 17A, one opening 2105 is provided for each of the openings 2103 that is to be formed in the intracell dielectric 115B. The openings 2105 are smaller than the openings 1705 and may have a smaller radius of curvature. In some embodiments, the openings 2105 are circular or are ellipses that are nearly circular. As shown by the top view 2200A of FIG. 22A and the cross-sectional view 2200B of FIG. 22B, the openings 2103 may be filled with conductive material to form the source lines 103B and the drain lines 119B.

The openings 2103 in the intracell dielectric 115B may have a first side 2107 that faces toward an adjacent intercell dielectric plug 121B and a second side 2109 the faces an interior of the cell area 122B. The first side 2107 is rimed by the channel layer 107B and the second side 2109 is rimmed by the intracell dielectric 115B. If the cell area 122B did not have curved ends but was rectangular like the cell area 122A, the first side 2107 might not be fully rimmed by the channel layer 107B and the source lines 103B and the drain lines 119B might not make sufficient contact with the channel layer 107B. That issue may be avoided with larger openings 2105, but that approach may reduce the areas of the bulges 106B.

FIGS. 23A and 23B through FIGS. 25A and 25B are a series of paired top view illustrations and cross-sectional view illustrations showing a variation on the method FIGS. 12A and 12B through FIGS. 18A and 18B that may be used to form a memory array with features of the fourth 3D memory array 100D of FIGS. 7A-7B. The variation begins with a structure like the one shown by the top view 1500A of FIG. 15A and the cross-sectional view 1500B of FIG. 15B. As shown by the top view 2300A of FIG. 23A and the cross-sectional view 2300B of FIG. 23B, a data storage structure 108D and a channel layer 107D may be formed selectively on the exposed portions of the gate strips 123D. The data storage structure 108D includes the data storage film 111D. To form the third 3D memory array 100C of FIGS. 6A-6B, the channel layer 107C is deposited non-selectively rather than by a selective growth process.

In some embodiments, a selective growth process includes forming a self-assembled monolayer (SAM) on the sidewalls of the dielectric strips 131D and the intercell dielectric plugs 121D. An ALD process or the like may then be used to grow the data storage film 111D on the gate strips 123D while the SAM blocks growth on the dielectric strips 131D. The SAM may include molecules that have a head group that adsorbs preferentially on the dielectrics and a tail group that resist the ALD process. The selective growth process may give the data storage films 111D a characteristic mushroom shape. A similar process may be used to grow the channel layer 107D on the data storage film 111D.

In some embodiments, the selective growth process includes forming a seed layer for the growth of the data storage film 111D on the gate sidewalls 125D. In some embodiments, the seed layer is provided by etching the gate strips 123D to form recesses in the gate stacks 135D by depositing the seed layer, and anisotropic etching to remove the seed layer from outside the recesses whereby the remaining seed layer is restricted to the gate strips 123D.

As further shown by the top view 2300A of FIG. 23A and the cross-sectional view 2300B of FIG. 23B, the remaining cell area may then be filled with the intracell dielectric 115D. As shown by the top view 2400A of FIG. 24A and the cross-sectional view 2400B of FIG. 24B, a mask 2401 may then be formed and used to etch openings 2403 in the intracell dielectric 115D. The etch may be selective to remove the exposed intracell dielectric 115D without removing the intercell dielectric plugs 121D or the channel layer 107D. The channel layer 107D may protect the data storage film 111D from etching during this process. As shown by the top view 2500A of FIG. 25A and the cross-sectional view 2500B of FIG. 25B, the openings 2403 may be filled with conductive material to provide source lines 103D and drain lines 119D.

FIGS. 26A and 26B through FIGS. 30A and 30B are a series of paired top view illustrations and cross-sectional view illustrations showing a variation on the method FIGS. 12A and 12B through FIGS. 18A and 18B that may be used to form a memory array with features of the fifth 3D memory array 100E of FIGS. 8A-8B. The variation begins with a structure similar to the one shown by the top view 1500A of FIG. 15A and the cross-sectional view 1500B of FIG. 15B except that the mask 2601 may have narrower openings than the mask 1301, the stacks 135E may be wider than the stacks 135A and the cell areas 122E may be proportionally narrower than the cell areas 122A.

Figure 26A:
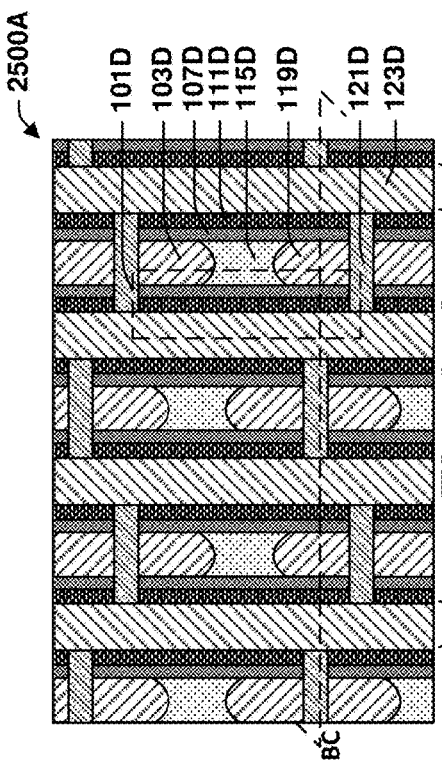
Figure 26B:
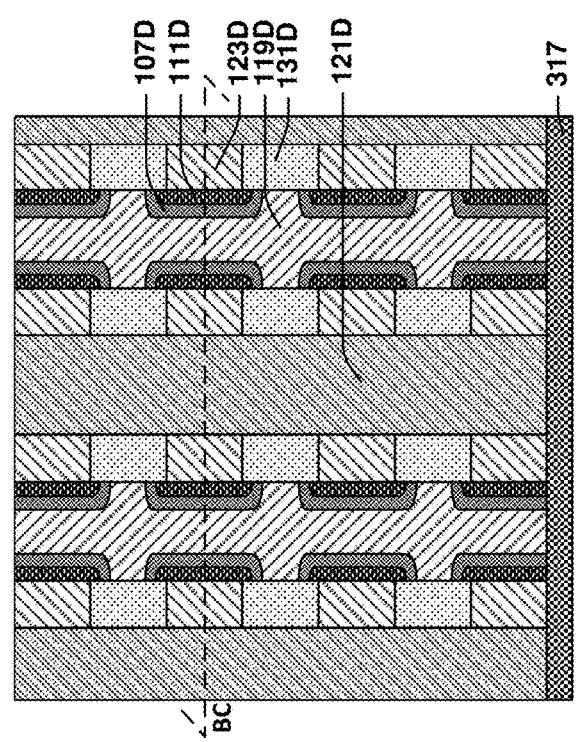

As shown by the top view 2600A of FIG. 26A and the cross-sectional view 2600B of FIG. 26B, etching may take place within the cell areas 122E to form recesses 127E in the gate strips 123E. The intercell dielectric plugs 121E may block the etching that forms the recesses 127E, whereby one recess 127E is formed for each desired location for a memory cells 101E. The etch process is selective for removing the material of gate strips 123E over the material of the dielectric strips 131E. The etch causes gate sidewalls 125E to be indented relative to dielectric sidewalls 129E. The etch may also cause gate sidewalls 125E to become concave as shown. In some embodiments, the etch is isotropic. In some embodiments, the etch is a wet etch.

Figure 27A:
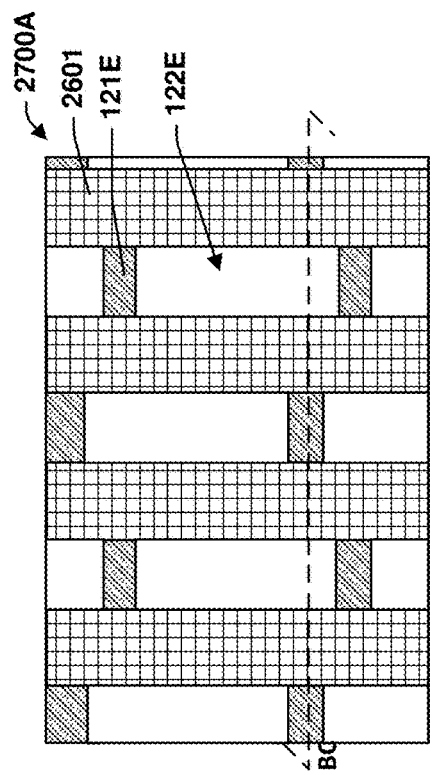
Figure 27B:
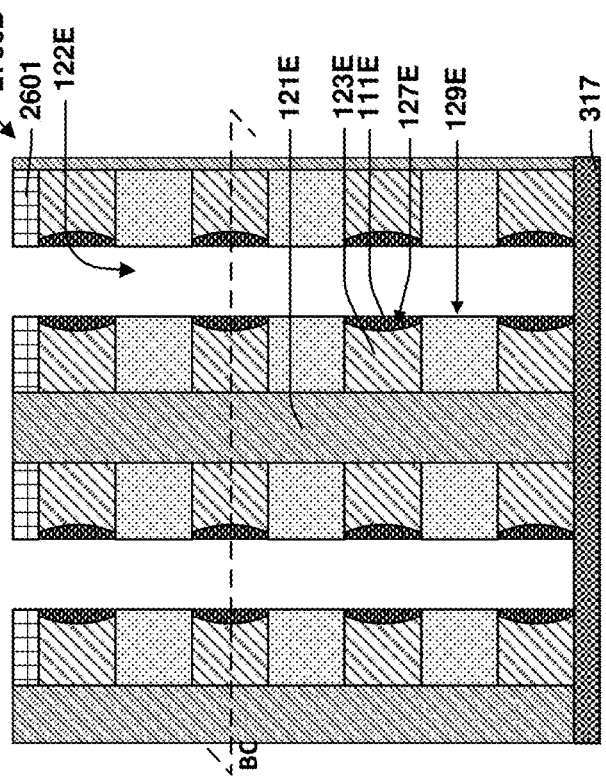

As shown by the top view 2700A of FIG. 27A and the cross-sectional view 2700B of FIG. 27B, a data storage film 111E is deposited on the sides of the stacks 135E including sides within the trenches 1303. The data storage film 111E may deposit conformally on the gate sidewalls 125E and the dielectric sidewalls 129E. The deposition process may be CVD, ALD, the like, or any other suitable process. The data storage film 111E may form continuous layers extending across the heights of the stacks 135E. Additional layers may be deposited before or after the data storage film 111E if desired to form the data storage structures 108E. The data storage film 111E may be etched to remove portions of the data storage film 111E that deposit between the tiers 141A-141D. The removed portions include those that are deposited on the dielectric sidewalls 129E. The remaining portions of the data storage film 111E are contained within the recesses 127E. The etch is anisotropic. The anisotropic etch may be a plasma etch or the like or any other suitable etch process. The mask 2601 may align the etch to the stacks 135E.

Figure 28A:
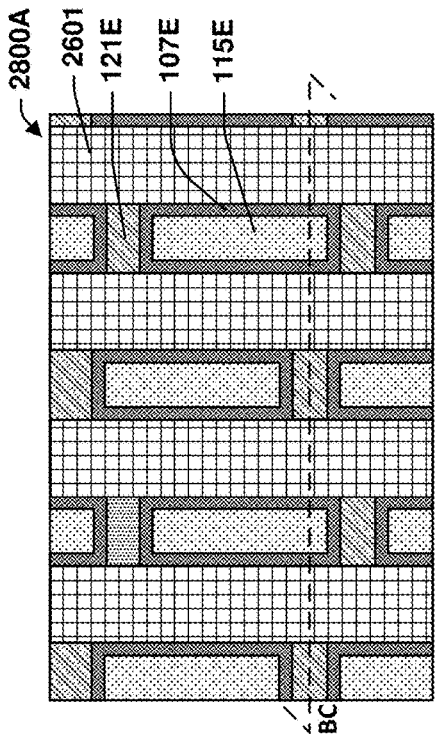
Figure 28B:
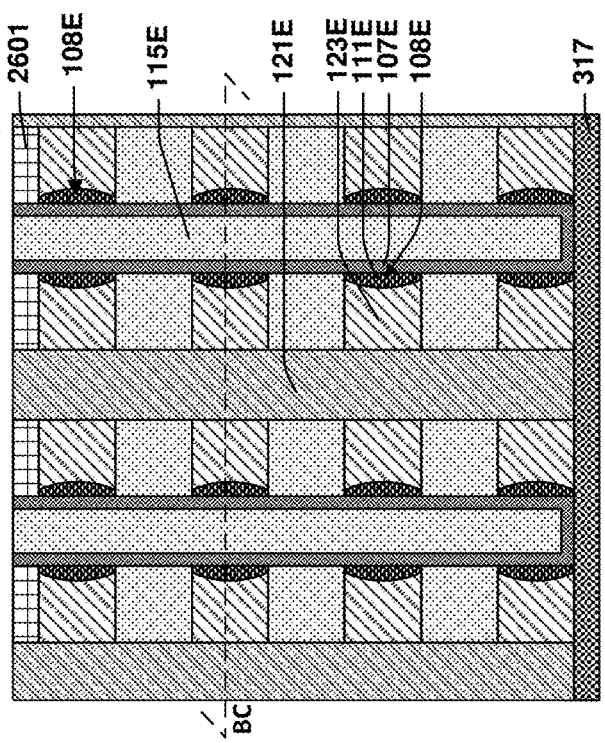

As shown by the top view 2800A of FIG. 28A and the cross-sectional view 2800B of FIG. 28B, the channel layers 107E may be deposited on the sides of the stacks 135E. The channel layer 107E may deposit conformally on the data storage film 111E and on the dielectric sidewalls 129E. The deposition process may be CVD, ALD, the like, or any other suitable process. The channel layers 107E may be continuous across the heights of the stacks 135E. One or more additional layers may be deposited before the channel layers 107E if desired to complete the formation of the data storage structures 108E. In some embodiments, the data storage structures 108E are completed by a dielectric layer that forms during deposition of the channel layers 107E.

As further shown by the top view 2800A of FIG. 28A and the cross-sectional view 2800B of FIG. 28B, an intracell dielectric 115E may be deposited to fill the cell areas 122E. The deposition process may be CVD, the like, or any other suitable process. In some embodiments, the deposition includes a flowable CVD process. Following deposition of the intracell dielectric 115E, a planarization process may be used to remove any intracell dielectric 115E or other material above the mask 2601.

As shown by the top view 2900A of FIG. 29A and the cross-sectional view 2900B of FIG. 29B, a mask 2903 with openings 2905 is used to etch openings 2901 in the intracell dielectric 115E. As shown by the top view 3000A of FIG. 30A and the cross-sectional view 3000B of FIG. 30B, the openings 2901 may be filled with conductive material to form source lines 103E and drain lines 109E. Excess conductive material, the mask 2903, and the mask 2601 may be removed by CMP, the like, or other suitable processes to produce the illustrated structure which corresponds to the fifth 3D memory array 100E of FIGS. 8A-8C.

The sixth 3D memory array 100F of FIGS. 9A-9B may be produced by following essentially the same process except that the channel layer 107F is formed along with the data storage film 111F in the recesses 127F and is limited to the recesses 127F by an anisotropic etch process. Optionally an additional channel layer may subsequently be deposited to form a structure in which the channel layer if partially with the recesses and shown in FIGS. 9A-9B and partially outside the recesses as shown in FIGS. 8A-8B.

FIGS. 31A and 31B through FIGS. 35A and 35B are a series of paired top view illustrations and cross-sectional view illustrations showing a variation on the method FIGS. 12A and 12B through FIGS. 18A and 18B that may be used to form a memory array with features of the seventh 3D memory array 100G of FIGS. 10A-10C. A principal difference is that the data storage structures 108G and the channel layers 107G are formed prior to the intercell dielectric plugs 121G.

The variation begins with a structure like the one shown by the top view 1400A of FIG. 14A and the cross-sectional view 1400B of FIG. 14B. As shown by the top view 3100A of FIG. 31A and the cross-sectional view 3100B of FIG. 31B, trenches between the stacks 135G are filled by successively depositing the layers of a data storage structure 108G, a channel layer 107G, and intracell dielectric 115G. The layers of the data storage structure 108G include at least a data storage film 111G.

As shown by the top view 3200A of FIG. 32A and the cross-sectional view 3200B of FIG. 32B, a mask 3201 may formed and used to etch openings 3203 in the intracell dielectric 115G. As shown by the top view 3300A of FIG. 33A and the cross-sectional view 3300B of FIG. 33B, the openings 3203 may be filled with intercell dielectric to form the intercell dielectric plugs 121G. Alternatively, the intercell dielectric may be formed first and the inverse of the mask 3201 may be used to etch the cell areas 122G. An etch defining opening for the intercell dielectric plugs 121G need not be as selective. In this example, the etch removes an exposed portion of the channel layer 107G.

As shown by the top view 3400A of FIG. 34A and the cross-sectional view 3400B of FIG. 34B, a mask 3401 may be formed and used to etch openings 3403 in the intracell dielectric 115G. As shown by the top view 3500A of FIG. 35A and the cross-sectional view 3500B of FIG. 35B, the openings 3403 may be filled with conductive material to form source lines 103G and drain lines 119G. The resulting structure corresponds to seventh 3D memory array 100G of FIGS. 10A-10C.

FIGS. 36 through 43 provide cross-sectional views illustrating a variation on the method of FIGS. 12A through 18B. The illustrated process also incorporates variations illustrated by FIGS. 31A and 31B through FIGS. 35A and 35B but may be applied in conjunction with any of the methods shown herein to produce any of the 3D memory arrays. This alternate method avoids a process stage at which the stacks 135A or the like are left freestanding as shown the cross-sectional view 1300B of FIG. 13B. When left freestanding, the stacks 135A may have the potential to twist, collapse, or otherwise shift or deform. The method also provides an opportunity to initially form the gate layer with a dummy layer and subsequently replace that layer with the material of the gate strips.

Figure 36:
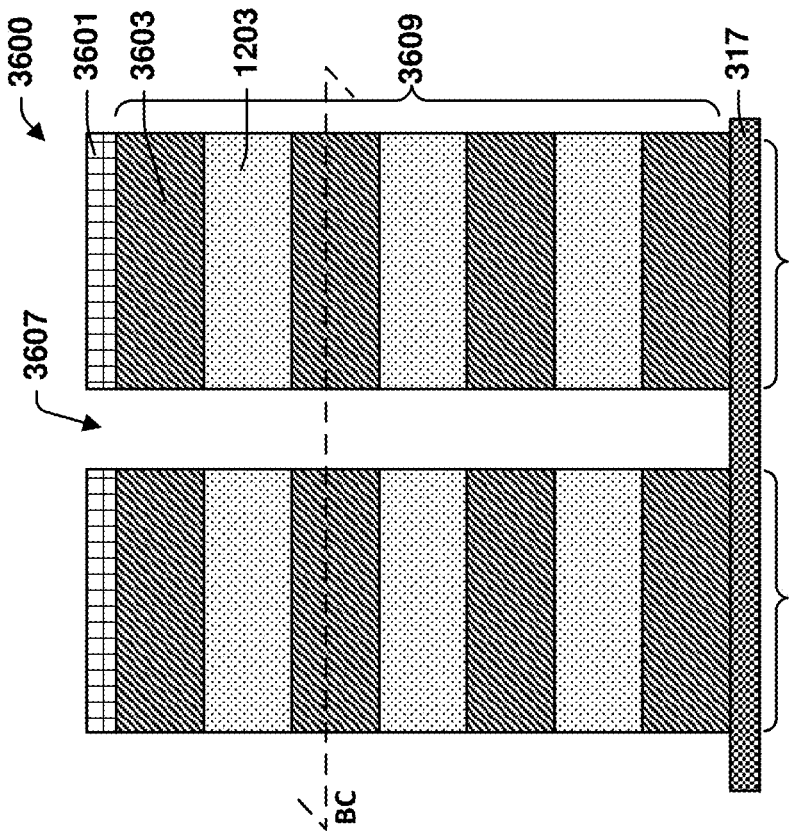
Figure 41:
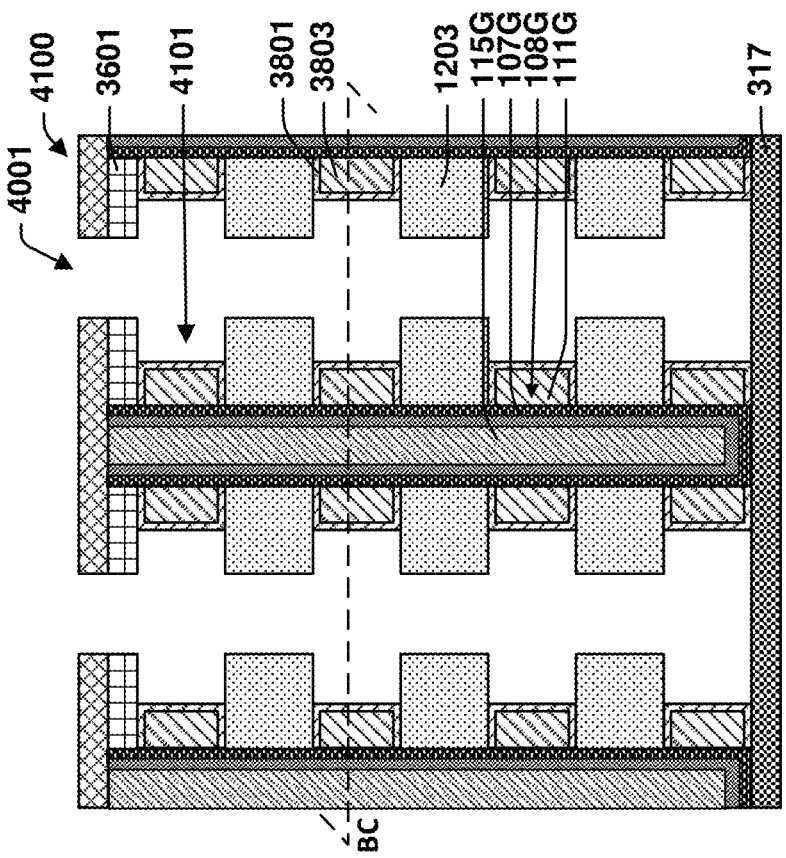

As shown be the cross-sectional view 3600 of FIGS. 36, a mask 3601 is formed and used to etch trenches 3607 that divide a broad stack 3609 into smaller stacks 3605. The broad stack 3609 may be the same as the broad stack 1205 of FIG. 12B, or may have dummy gate layers 3603 in place of gate layers 1201. The dummy gate layers 3603 may be a dielectric with a different etch selectivity from the dielectric layers 1203. The dummy gate layers 3603 may alternatively be polysilicon, the like, or any other suitable material. The trenches 3607 may have the same dimensions as the trenches 1303 of FIG. 13B, but are half or less in number density.

Figure 37:
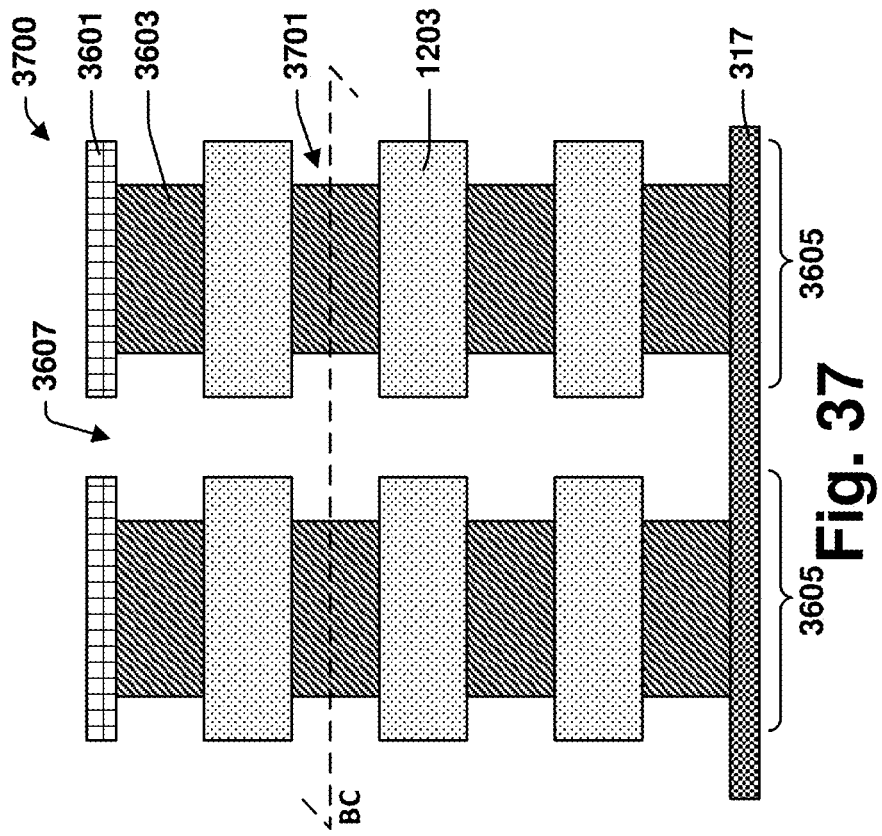

As shown by the cross-sectional view 3700 of FIG. 37, the dummy gate layers 3603 may be etched back from surfaces exposed adjacent the trenches 3607 to form recesses 3701. The etch process may remove approximately half the volume of the dummy gate layers 3603. The etch process may be an isotropic etch. For example, the dielectric layers 1203 may be silicon oxide, the dummy gate layers 3603 may be silicon nitride, and the recesses 3701 may be formed by wet etching with phosphoric acid ($H_3PO_4$).

As shown by the cross-sectional view 3800 of FIG. 38, the recesses 3701 may be filled by depositing a barrier layer 3801 and a metal layer 3803. These layers may be deposited by CVD, ALD, electroplating, electroless plating, the like, or any other suitable process or combination of processes. After depositing the metal layer 3803 in an amount sufficient to complete the fill of the recesses 3701, excess material may be removed by an anisotropic etch process.

As shown by the cross-sectional view 3900 of FIG. 39, the trenches 3607 are filled. In this example, the trenches 3607 are filled by the process steps illustrated by the top view 3300A of FIG. 33A and the cross-sectional view 3300B of FIG. 33B. These process steps form the data storage structures 108G, the channel layers 107G, and complete the fill of the trenches 3607 with intracell dielectric 115G. Alternatively, the trenches 3607 could be filled by the process steps shown in FIGS. 14A and 14B through FIGS. 16A and 16B.

Figure 40:
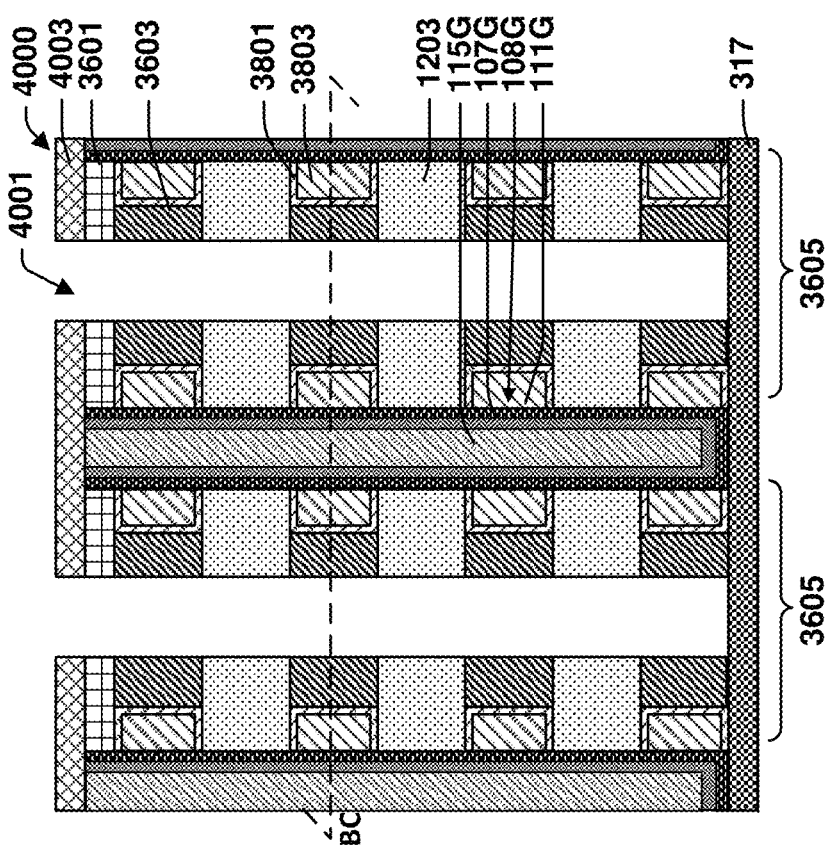

As shown by the cross-sectional view 4000 of FIG. 40, a mask 4003 may then be formed and used to etch trenches 4001 in the stacks 3605. As shown by the cross-sectional view 4100 of FIG. 41, remaining portions of the dummy gate layer 3603 may be removed by etching to form the recesses 4101. As shown by the cross-sectional view 4200 of FIG. 42, the recesses 4101 may be filled by depositing a second barrier layer 4201 and a second metal layer 4203 and the excess material may be removed by anisotropic etching. As shown by the cross-sectional view 4300 of FIG. 43, the trenches 4001 may be filled by repeating the process steps illustrated by the top view 3300A of FIG. 33A and the cross-sectional view 3300B of FIG. 33B. Processing may continue, e.g., as shown by the top view 3400A of FIG. 34A and the cross-sectional view 3400B of FIG. 34B. The method of FIG. 36 through FIG. 43, with or without the replacement gate process steps, may be used to form other structures in accordance with other embodiments and examples provided herein to provide the advantage of preventing twisting, collapsing or other deformation that may occur with narrow free standing stacks.

Figure 44:
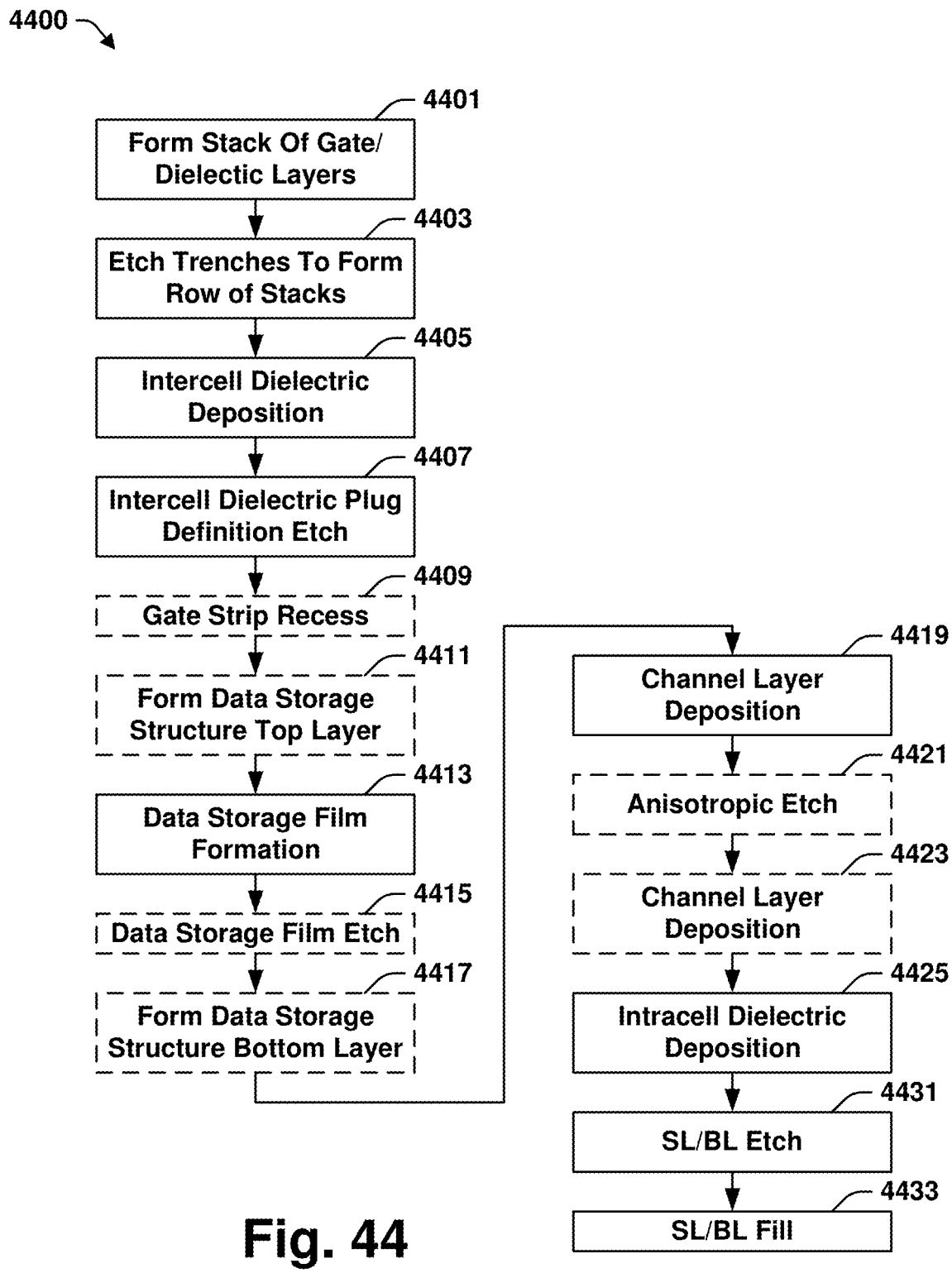

FIG. 44 presents a flow chart for a method 4400 which may be used to form a 3D memory arrays according to the present disclosure. The method 4400 begins with act 4401, forming a broad stack of alternating gate layers and dielectric layers as shown by the cross-sectional view 1200B of FIG. 12B.

Act 4403 is etching trenches in the broad stack to form a row of narrow stacks of alternating gate strips and dielectric strips as shown by the cross-sectional view 1300B of FIG. 13B.

Act 4405 is filling the trenches between the narrow stack with intercell dielectric as shown by the cross-sectional view 1400B of FIG. 14B. Act 4407 is patterning the intercell dielectric to define the cell areas and form intercell dielectric plugs. The cross-sectional view 1500B of FIG. 15B provides an example in which the cell areas are made rectangular and the intercell dielectric plugs are formed with planar ends. The cross-sectional view 1900B of FIG. 19B provides an example in which the cell areas are made elliptical and the intercell dielectric plugs are formed with concave ends.

Act 4409 is an optional act of etching the gate strips to form recesses in the narrow stacks. The cross-sectional view 2600B of FIG. 26B provides an example.

Act 4411 is an optional step of forming a top layer of a data storage structure. "Top" is used with reference to the ordering of layers seen in a horizontal memory cell. In particular, the top layer is one or more layers formed between the data storage film and the control gate. The dielectric layer 173 shown in FIGS. 11A and 11B is an example.

Act 4413 is forming a data storage film. The cross-sectional view 1600B of FIG. 16B provides a basic example. The cross-sectional view 2300B of FIG. 23B provides an example in which the data storage film is formed by a selective growth process. The cross-sectional view 2700B of FIG. 27B provides an example in which the data storage film is formed in recesses within the narrow stacks. The cross-sectional view 2700B of FIG. 27B also illustrates act 4415, which is an optional step of etching the data storage film to remove any portion of the data storage film that has deposited outside the recesses. The etching may include a directional or anisotropic etch that removes the data storage film from areas outside the recesses. The etching may also include an isotropic etch that cause the data storage film to be indented within the recesses to provide room in the recesses for a channel layer.

Act 4417 is an optional step of forming a bottom layer of the data storage structure. "Bottom" is used with reference to the ordering of layers seen in a horizontal memory cell. In particular, the bottom layer is one or more layers formed between the data storage film and the channel. The dielectric layer 171 shown in FIGS. 11A and 11B is an example.

Act 4419 is forming a channel layer. The cross-sectional view 1600B of FIG. 16B, the cross-sectional view 2300B of FIG. 23B, and the cross-sectional view 2800B of FIG. 28B provide various examples.

Act 4421 is an optional step of anisotropic etching to remove a portion of the channel layer that is outside the recesses. This may be used to produce a structure such as the one illustrated in FIGS. 9A and 9B. Act 4423 is an optional step of depositing another layer of the channel material. This step may be used when act 4421 leaves the channel layer too thin.

Act 4425 is depositing the intracell dielectric. The cross-sectional view 1600B of FIG. 16B, the cross-sectional view 2300B of FIG. 23B, and the cross-sectional view 2800B of FIG. 28B provide various examples.

Act 4431 is etching to form openings for vertical connectors such as source lines and drain lines. This etch may be made with oval mask openings to provide bulges in the source lines and drain lines. In some embodiments, two source line/drain line openings are formed for each mask opening and the etch is aligned in part by the intercell dielectric plugs. The top view 1700A of FIG. 17A, the top view 2400A of FIG. 24, and the top view 2900A of FIG. 29A provide various examples. In some embodiments, one source line/drain line opening is formed for each mask opening and the mask openings may be circular or nearly so. The top view 2100A of FIG. 21A provides an example.

Act 4433 is filling the openings to provide vertical conductive structures such as source lines and drain lines. The top view 1800A of FIG. 18A, the top view 2200A of FIG. 22A, the top view 2500A of FIG. 25, and the top view 3000A of FIG. 30A provide various examples.

Figure 45:
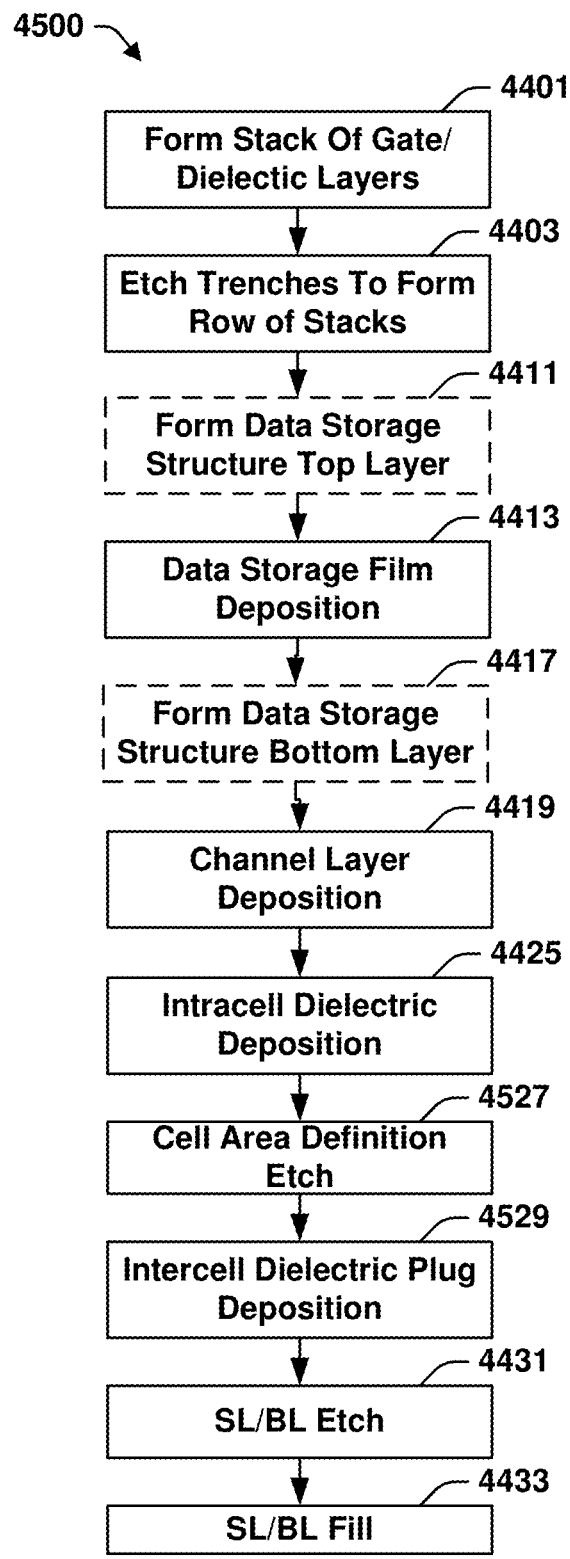

FIG. 45 presents a flow chart for a method 4500, which is another method that may be used to form a 3D memory array according to the present disclosure. The method 4500 include many of the same acts as the method 4400, but has differences relating to the intercell dielectric plugs being formed after the data storage structures and the channel layers.

In the method 4500, the intercell dielectric plugs are not formed until act 4419, the channel layer deposition. This alternate processing is illustrated by the paired top view illustrations and cross-sectional view illustrations provided by FIGS. 31A and 31B through FIGS. 35A and 35B.

The method 4500 includes act 4527, a cell area definition etch illustrated by top view 3200A of FIG. 32A and cross-sectional view 3200B of FIG. 32B. The etch defines the cell areas by removing the intracell dielectric from locations for the intercell dielectric plugs. Act 4529 is filling the openings with the intercell dielectric to form the intercell dielectric plugs. Alternatively, the intercell dielectric may be deposited in Act 4425 and the cell area definition etch of Act 4527 may be used to remove that intercell dielectric from the cell areas followed by backfill with the intracell dielectric.

FIG. 46 presents a flow chart for a method 4600, which is another method that may be used to form a 3D memory array according to the present disclosure. The method 4600 include many of the same acts as the method 4500 but uses the type of processing illustrated by FIG. 36 through FIG. 43.

The method 4600 includes act 4601, forming a broad stack of alternating gate layers and dielectric layers. This may be the same as act 4401 except that the gate layers may be dummy gate layers. The cross-sectional view 1200B of FIG. 12B provides an example.

Act 4603 is forming a first set of trenches. The cross-sectional view 3600 of FIG. 36 provides an example. These trenches are half or less in number compared to the trenches formed by act 4403 for which the cross-sectional view 1300B of FIG. 13B provides an example.

Acts 4605 and 4607 are optional steps that are used when the gate layer is a dummy layer. Act 4605 is etching away a first portion of the dummy layer. The cross-sectional view 3700 of FIG. 37 provides an example. Act 4607 is replacing the first portion of the dummy layer with conductive material. The cross-sectional view 3800 of FIG. 38 provides an example.

The method 4600 continues with act 4411 through act 4425 which may be the same as in the method 4400 except that they operate within only the first set of trenches. The cross-sectional view 3900 of FIG. 39 provides an example.

Figure 42:
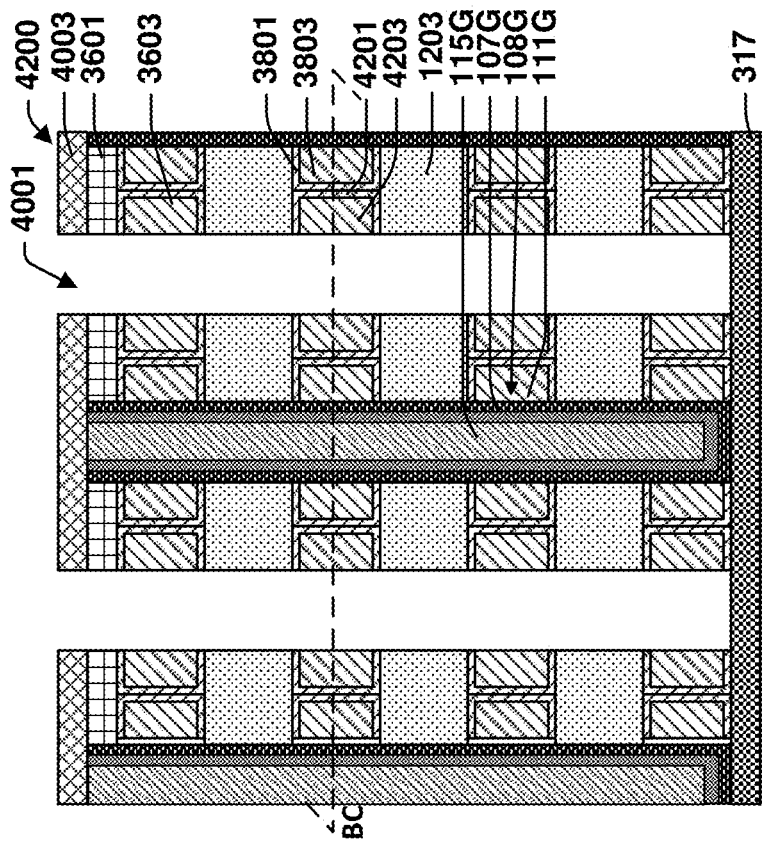

Act 4609 is forming a mask that covers the first set of trenches and etching to form a second set of trenches. The cross-sectional view 4000 of FIG. 40 provides an example. If the gate layer is a dummy gate layer, the method may continue with a repetition of act 4605 and act 4607 to complete the gate replacement process. The cross-sectional view 4100 of FIG. 41 and the cross-sectional view 4200 of FIG. 42 illustrate this process.

Figure 43:
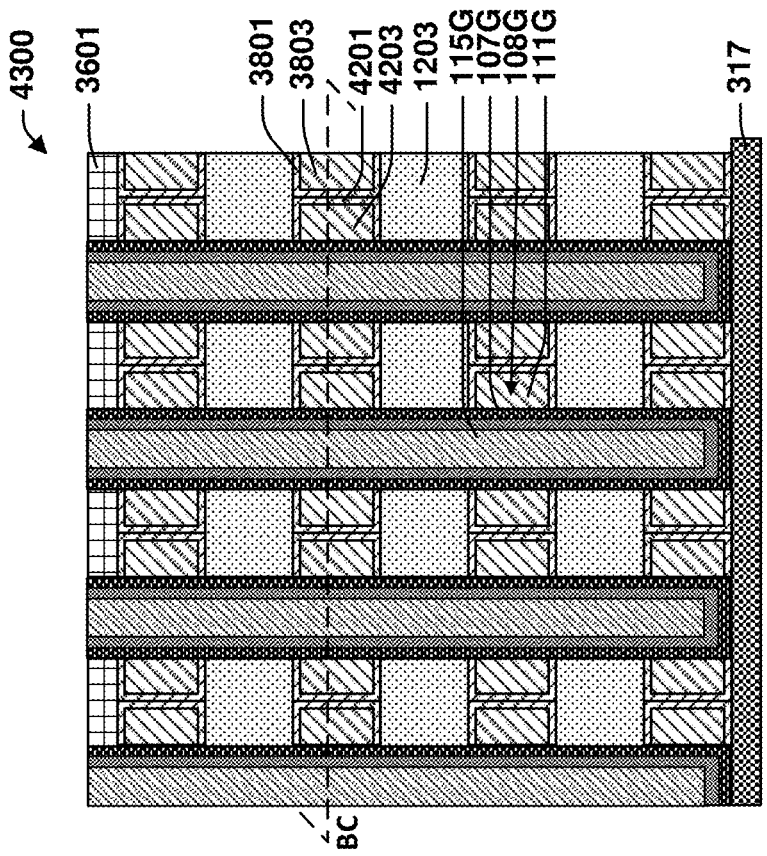

The method 4600 continues with a repetition of act 4411 through act 4425. The cross-sectional view 4300 of FIG. 43 provides an example. Processing may continue with act 4527, act 4529, act 4431, and act 4433 as described in connection with the method 4400.

While the methods 4400, 4500, and 4600 of FIGS. 44-46 are illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Some aspects of the present teachings relate to a memory device having a plurality of stacks, each stack having alternately stacked gate strips and dielectric strips, over a substrate. Source lines and drain lines are positioned between the stacks and extend along a stacking direction of the gate strips and the dielectric strips. A memory cell has a channel extending a channel length between one of the source lines and one of the drain lines and a data storage structure positioned between the channel and one the gate strips. A distance between the one of the source lines and the one of the drain lines is less than the channel length.

Some aspects of the present teachings relate to a memory device that includes a three-dimensional array of memory cells disposed between two adjacent metal interconnect layers in a metal interconnect structure. Each of the memory cells has a source side, a drain side, a channel extending between the source side and the drain side, a control gate, and a data storage film between the control gate and the channel. Within the memory device is an array of stacks. Each stack comprising vertically stacked gate strips separated by dielectric strips. The gate strips extend horizontally to connect a plurality of the control gates. Drain lines extends vertically through the memory device. Each drain line connects with a plurality of the drain sides. Source lines also extend vertically through the memory device. Each of the source lines connects with a plurality of the source sides. The source lines and the drain lines are arranged in a row between two adjacent stacks in the array of stacks. Within the row, the source lines and the drain lines are alternately separated by first dielectric plugs and second dielectric plugs, whereby each of the source lines and each of the drain lines has a first side that faces an adjacent first dielectric plug and a second side that faces an adjacent second dielectric plug. The first dielectric plugs and the second dielectric plugs have distinct compositions. The first sides are convex.

Some aspects of the present teachings relate to a method of forming a memory device. The method includes forming a trench within a stack of alternating gate strips and dielectric strips and depositing an intracell dielectric in the trenches. A mask having elliptical openings is formed and the intracell dielectric is etched through the mask to form second openings. The second openings are filled with conductive material to form source lines and drain lines.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device, comprising:
a memory structure comprising memory cells in rows, wherein the rows extend laterally and are vertically stacked;
gate structures extending laterally along each row and providing control gates for the memory cells in the row;
a semiconductor channel for a one of the memory cells, wherein the semiconductor channel is lateral to the control gate corresponding to the one of the memory cells;
a data storage structure for the one of the memory cells, wherein the data storage structure is between the semiconductor channel and the corresponding control gate;
a source line, wherein the source line has a first lateral bulge, extends vertically, and contacts the semiconductor channel in a first contact area; and
a drain line, wherein the drain line has a second lateral bulge, extends vertically, and contacts the semiconductor channel in a second contact area;
wherein the first lateral bulge is closer to the second lateral bulge than is the first contact area to the second contact area.

2. The integrated circuit device of claim 1, wherein the data storage structure comprises a layer of ferroelectric material.

3. The integrated circuit device of claim 1, wherein the data storage structure is provided by a data storage film that encircles the source line and the drain line.

4. The integrated circuit device of claim 1, wherein the semiconductor channel is provided by a semiconductor film that encircles the source line and the drain line.

5. The integrated circuit device of claim 4, wherein the data storage structure is provided by a data storage film and the data storage film does not encircle the source line and the drain line.

6. The integrated circuit device of claim 1, wherein the data storage structure is provided by a data storage film that is restricted to sides of the gate structures.

7. An integrated circuit device, comprising:
a memory structure comprising memory cells in rows that extend laterally and are vertically stacked;
gate structures extending laterally along each row and providing control gates for the memory cells;
a semiconductor channel for each memory cell, wherein the semiconductor channel is lateral to the control gate for the memory cell;
a data storage structure for each memory cell, wherein the data storage structure is between the semiconductor channel for the memory cell and the control gate for the memory cell;
a source line, wherein the source line extends vertically to contact the semiconductor channels for a plurality of the memory cells and the source line has a first curved sidewall; and
a drain line, wherein the drain line extends vertically to contact the semiconductor channels for the plurality of the memory cells.

8. The integrated circuit device of claim 7, wherein the source line has a second curved sidewall opposite the first curved sidewall and the first curved sidewall and the second curved sidewall have distinct radii of curvature.

9. The integrated circuit device of claim 7, wherein the source line is flat on a sidewall that contacts the semiconductor channel.

10. The integrated circuit device of claim 7, the source line has an elliptical cross-section.

11. The integrated circuit device of claim 7, wherein a cross-section of the source line is circular.

12. The integrated circuit device of claim 7, wherein the data storage structure is provided by a data storage film that is separated between the rows that are vertically stacked.

13. An integrated circuit device, comprising:
a three-dimensional array of memory cells comprising stacked rows of the memory cells;
a word line providing control gates for the memory cells in one of the stacked rows;
a semiconductor channel for one of the memory cells;
a data storage structure for the one of the memory cells, wherein the data storage structure is between the semiconductor channel and the word line;
a source line extending vertically along a stacking direction of the stacked rows, wherein the source line abuts the semiconductor channel in a first contact area; and
a drain line extending vertically along the stacking direction of the stacked rows, wherein the drain line abuts the semiconductor channel in a second contact area, and the drain line is closer to the source line than is the first contact area to the second contact area.

14. The integrated circuit device of claim 13, wherein the drain line bulges toward the source line.

15. The integrated circuit device of claim 13, wherein the source line bulges toward the drain line.

16. The integrated circuit device of claim 13, wherein a data storage film comprising the data storage structure encircles the source line and the drain line.

17. The integrated circuit device of claim 13, wherein a semiconductor film comprising the semiconductor channel encircles the source line and the drain line.

18. The integrated circuit device of claim 13, wherein the source line has a curved sidewall opposite the drain line.

19. The integrated circuit device of claim 13, wherein the source line has a curved sidewall facing the drain line.

20. The integrated circuit device of claim 13, wherein the source line has a first curved sidewall and a second curved sidewall opposite the first curved sidewall, and the first curved sidewall and the second curved sidewall have distinct radii of curvature.

* * * * *